(12) United States Patent
Cherian

(10) Patent No.: US 8,125,790 B2
(45) Date of Patent: Feb. 28, 2012

(54) OC2 ORIENTED CONNECTIONS 2

(76) Inventor: Gabe Cherian, Sun Valley, ID (US)

( * ) Notice: Subject to any disclaimer, the term of this patent is extended or adjusted under 35 U.S.C. 154(b) by 277 days.

(21) Appl. No.: 12/197,309

(22) Filed: Aug. 24, 2008

(65) Prior Publication Data

US 2009/0207575 A1    Aug. 20, 2009

Related U.S. Application Data

(60) Division of application No. 10/765,772, filed on Jan. 26, 2004, now Pat. No. 7,433,201, which is a continuation of application No. 09/947,240, filed on Sep. 5, 2001, now Pat. No. 7,254,889, application No. 12/197,309, which is a continuation of application No. 10/075,060, filed on Feb. 11, 2002, now Pat. No. 6,884,707.

(60) Provisional application No. 60/231,387, filed on Sep. 8, 2000, provisional application No. 60/257,673, filed on Dec. 22, 2000, provisional application No. 60/268,467, filed on Feb. 12, 2001, provisional application No. 60/443,128, filed on Jan. 27, 2003.

(51) Int. Cl.
*H05K 7/10* (2006.01)

(52) U.S. Cl. ........ 361/767; 361/760; 361/743; 174/260; 174/263; 174/259

(58) Field of Classification Search .................. 174/260, 174/138 G, 259, 263, 361, 255, 256; 361/743, 361/767, 808, 761, 764, 731, 733, 737, 760, 785, 786; 439/79, 78, 55, 83

See application file for complete search history.

(56) References Cited

U.S. PATENT DOCUMENTS

| | | | | | |
|---|---|---|---|---|---|
| 4,143,992 | A | * | 3/1979 | Crook | 415/220 |
| 5,684,677 | A | * | 11/1997 | Uchida et al. | 361/770 |
| 5,968,670 | A | * | 10/1999 | Brofman et al. | 428/576 |
| 6,125,043 | A | * | 9/2000 | Hauer et al. | 361/760 |
| 2001/0030057 | A1 | * | 10/2001 | Ichihara et al. | 174/250 |

* cited by examiner

Primary Examiner — Hoa C Nguyen

(57) ABSTRACT

The invention discloses design concepts and means and methods that can be used for enhancing the reliability and extending the operating life of electronic devices, and assemblies incorporating such devices, and substrates and/or PCBs, especially if such assemblies are exposed to severe environmental conditions such as thermal cycling or power cycling. The main thrust of the invention is to provide flexible joints, such as columns, between the attached components, and preferably to orient such joints, so that they would present their softest bending direction towards the thermal center or fixation point of the assemblies. Joints with rectangular or elongated cross-section are preferred, and they should be oriented so that the wide face of each joint would be facing the thermal center, perpendicular to the thermal deformation ray emanating from the thermal center towards the center of each respective joint. The concepts apply equally to leadless packages as well as to leaded packages.

11 Claims, 92 Drawing Sheets

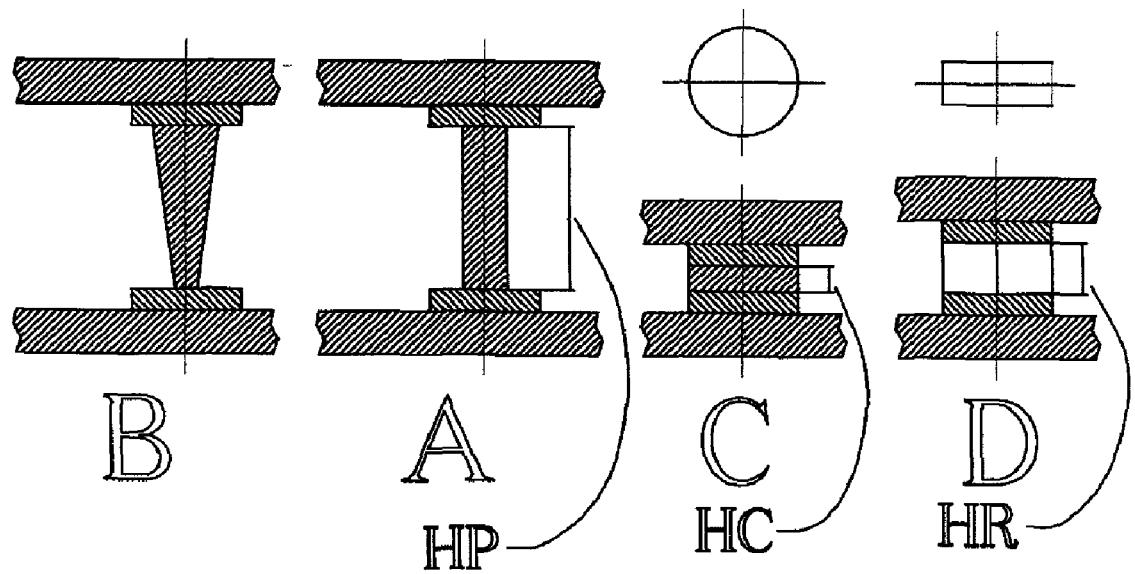
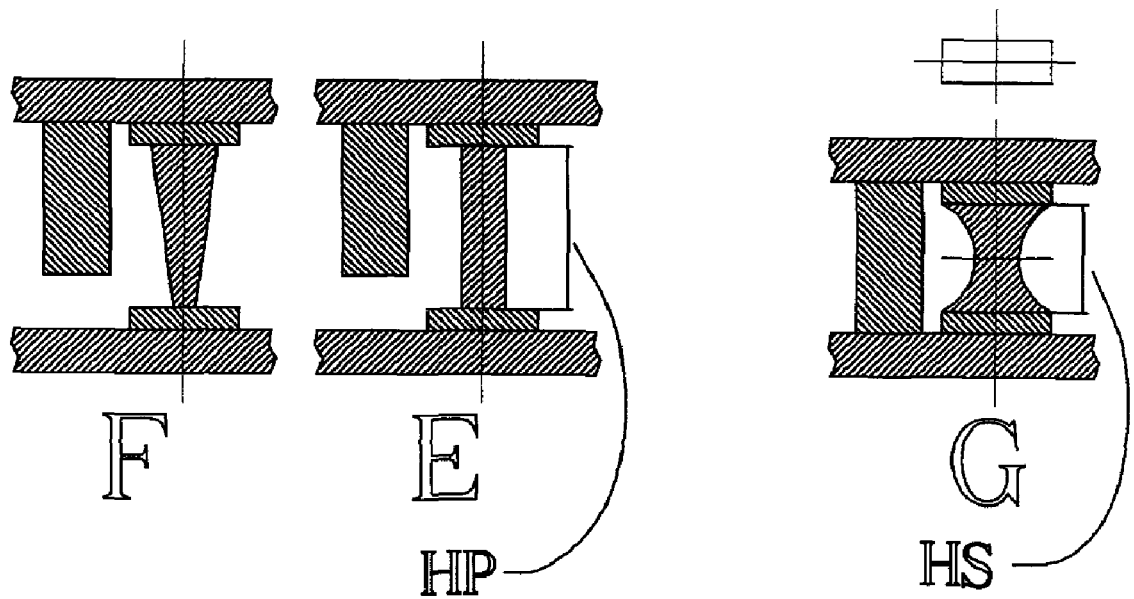
FIG. 30

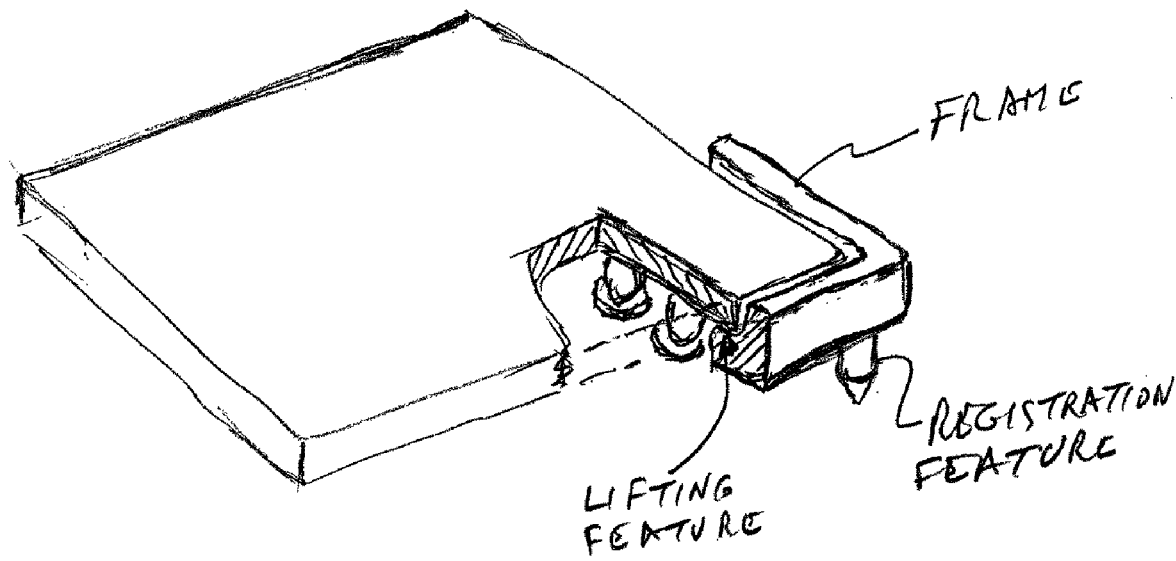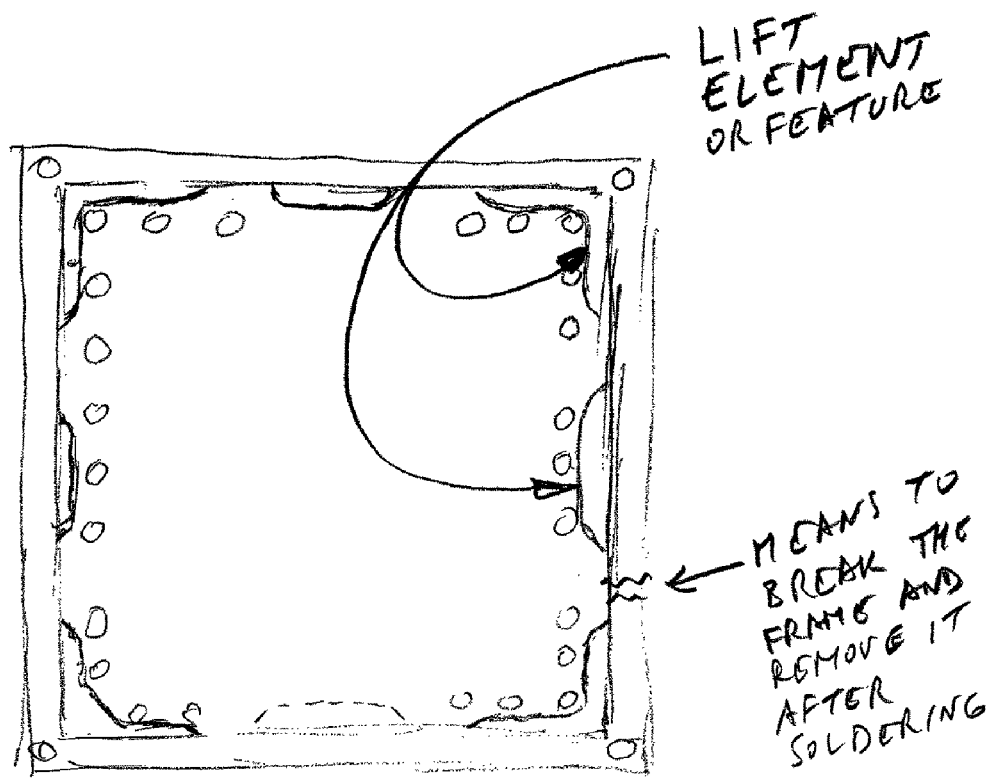
FIG. 31

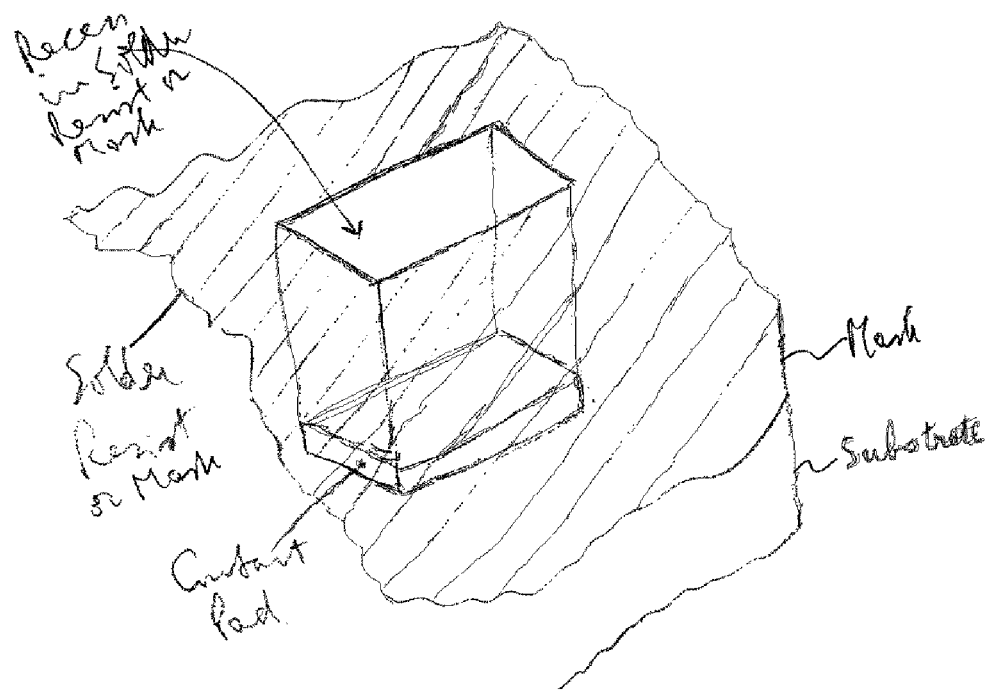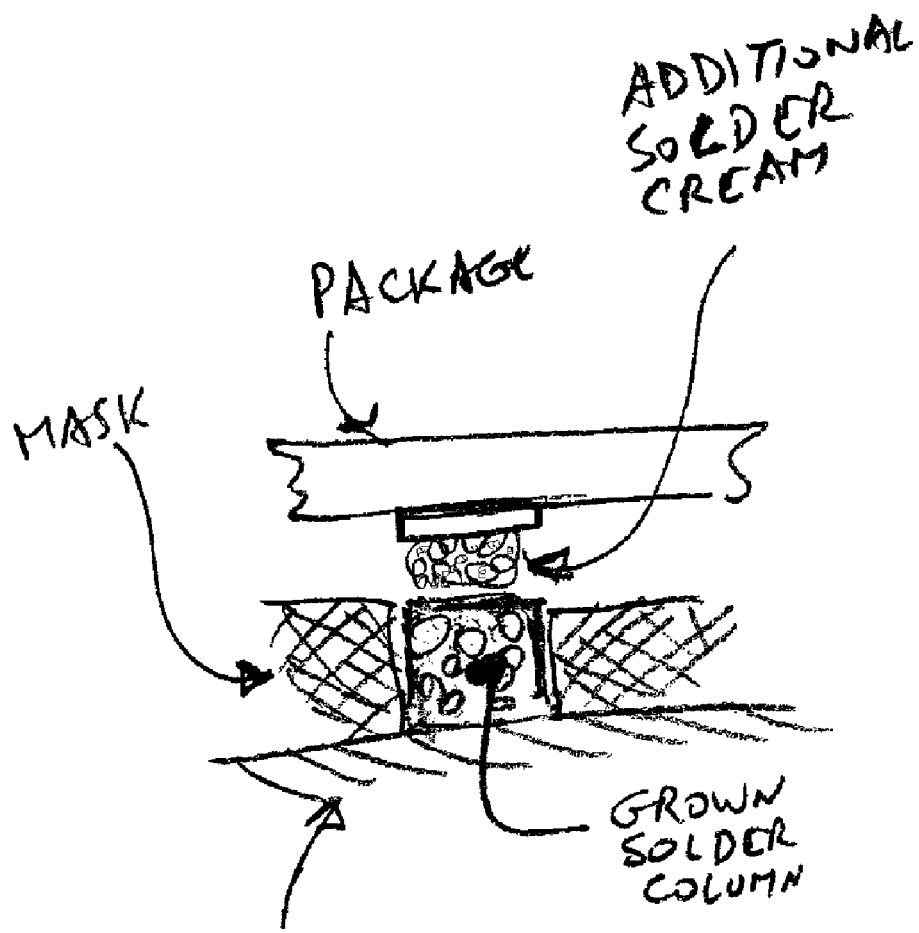
FIG. 35

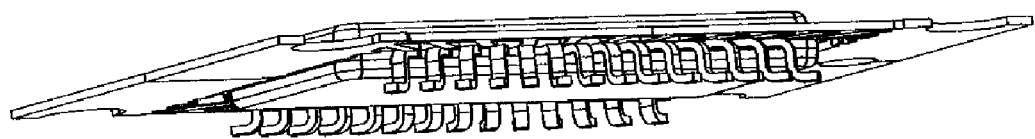
FIG. 58-A
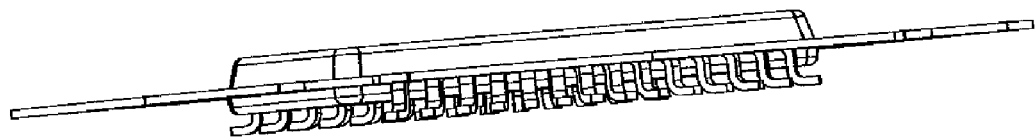
FIG. 58-B
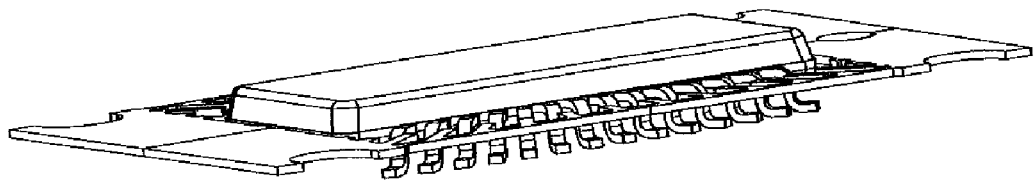
FIG. 58-C

OC2 ORIENTED CONNECTIONS 2

CROSS-REFERENCE TO RELATED APPLICATIONS

This application is a DIVISIONAL UTILITY patent application, BASED ON patent application Ser. No. 10/765,772, entitled "Oriented connections for leadless and leaded packages", which was filed on Jan. 26, 2004 now U.S. Pat. No. 7,433,201, which in turn is a NON-PROVISIONAL UTILITY patent application, which in turn could have been considered to be a CONTINUATION OR CONTINUATION IN PART application from patent application Ser. No. 09/947,240 now U.S. Pat. No. 7,254,889, entitled "Interconnection Devices" and from patent application Ser. No. 10/075,060 now U.S. Pat. No. 6,884,707, entitled "Interconnection".

This application is claiming the priority and benefits of all the above mother applications and all the references of those mother applications, all of which are incorporated herein in their entirety by reference.

The Mother application Ser. No. 10/765,772 was claiming the priority and benefits of the same references, which were claimed by its two mother applications. These references are the following six previous applications, which include four provisional patent applications and two non-provisional utility patent applications, all of which were incorporated herein in their entirety by reference:

1. Provisional Patent Application Ser. No. 60/231,387, filed Sep. 8, 2000, entitled "Probers", which will be referred to as Ref1, and
2. Provisional Patent Application Ser. No. 60/257,673, filed Dec. 22, 2000, entitled "Probes and Sockets", which will be referred to as Ref2, and
3. Provisional Patent Application Ser. No. 60/268,467, filed Feb. 12, 2001, entitled "Probes, Sockets, Packages & Columns", which will be referred to as Ref3, and
4. Nonprovisional Utility patent application Ser. No. 09/947,240, filed Sep. 5, 2001, entitled "Interconnection Devices", which will be referred to as Ref4.
5. Nonprovisional Utility patent application Ser. No. 10/075,060, filed Feb. 11, 2002, entitled "Interconnections", which will be referred to as Ref5. This application has been granted the U.S. Pat. No. 6,884,707 B1, issued Apr. 26, 2005.
6. Provisional Patent Application Ser. No. 60/443,128, filed Jan. 27, 2003, entitled "Oriented Columns & Package Leads", which will be referred to as Ref6.

The References of the Mother application Ser. No. 10/765,772 can be visualized easier in the following TABLE #1:

Legend for Type:

PPA=Provisional Patent Application

NPUPA=Nonprovisional Utility Patent Application

| Ref# | Type | Ser. No. | Filed on | Title |
|---|---|---|---|---|
| Ref1 | PPA | 60/231,387 | Sep. 08, 2000 | Probers |
| Ref2 | PPA | 60/257,673 | Dec. 22, 2000 | Probes and Sockets |
| Ref3 | PPA | 60/268,467 | Feb. 12, 2001 | Probes, Sockets, Packages & Columns |
| Ref4 | NPUPA | 09/947,240 | Sep. 05, 2001 | Interconnection Devices |
| Ref5 | NPUPA | 10/075,060 | Feb. 11, 2002 | Interconnections, now U.S. Pat. No. 6,884,707. |
| Ref6 | PPA | 60/443,128 | Jan. 27, 2003 | Oriented Columns & Package Leads |

Note:

I will refer in this application to certain pages, drawings or sketches that were included in the above References. I would like to explain here the numbering system that was used in those references, so that it will be clear, which page or drawing I would be referring to later on. I will use Reference 3 to illustrate.

Reference 3 covers 4 product groups. They are Test Sockets or simply Sockets, Wafer Probes or simply Probes, Micro-Columns or simply Columns and Plastic Packages or simply Packages. The pages are identified as follows. The pages of the Test Sockets are identified by TS, the Wafer Probes by WP, the Micro-Columns by MC, the Plastic Packages by PP.

Each one of these groups' documents was divided into three sections. The Specifications, the Drawings and the Additional Documents. The pages were identified as follows. The pages in the Specifications sections by S, the Drawings by D, and the Additional Documents either by AD or by A.

So for example, page 7 in the Specifications of the Micro-Column group would be marked thus: "MC-S-7", i.e. MC for Micro-Column, S for Specifications, 7 for page 7.

Ref3 and Ref5 in particular relate to the "LEADED DEVICES" covered in Group 1 in this present application.

Specific Sections in "References" that I Will Use Here:

Please review specifically the following sections in the following TABLE #2, in preparation for this present application:

| Item | Ref# | Page | Description &/Or Remarks |
|---|---|---|---|
| 1 | Ref3 | PP-D-1 | Radial Thermal Expansion & Contraction, showing oriented pads. |
| 2 | Ref3 | PP-D-22-25 | Twisted Leads, which can be attached, e.g. brazed, to the sides of leadless packages. |
| 3 | Ref3 | PP-D-42 | Radial Thermal Expansion & Contraction- Like Item1 PP-D-1, but with "Oriented Columns" on the "Oriented Pads". |
| 4 | Ref3 | PP-D-43 | A leadless package, e.g. BGA, with a scattering of "oriented" connectors. |
| 5 | Ref3 | PP-D-44 | A solder column that can be used with the above leadless package, which can be then "oriented" when placed at its specific location, as in the above figure. |
| 6 | Ref3 | PP-D-45 | Same as in PP-D-44 but witnessed. |
| 7 | Ref3 | PP-D-47 | Sketch showing some oriented columns and an anchor. |
| 8 | Ref3 | PP-D-75-81 | Different views of the Twisted Leads for leadless packages, as shown also in Item 2 PP-D-25 above. |
| 9 | Ref3 | PP-D-88-95 | "NAS Interplex Solder & Flux Bearing Leads", and modifications of same, which can be used to attach to leadless packages, and which can be "oriented" as per invention. |
| 10 | Ref3 | PP-D-97-98 | More modifications to provide leadless packages with oriented leads. |
| 11 | Ref3 | PP-D-104-105 | Show how the contact pads on substrates can be modified to be adapted to leads that are oriented. |

-continued

| Item | Ref# | Page | Description &/Or Remarks |
|---|---|---|---|
| 12 | Ref3 | PP-AD-42 | Like in Item 2 PP-D-25, but witnessed. |
| 13 | Ref3 | PP-AD-43 | Sketch showing a variation on what is shown in Items 4-6 PP-D-43-45 and Item 7 PP-D-47 |
| 14 | Ref3 | PP-AD-48 | As in Item 8 PP-D-75, but with reverse twist and witnessed. |
| 15 | Ref3 | PP-AD-62 | Another view of the figure in Item 2 PP-D-22 but witnessed. |
| 16 | Ref3 | PP-AD-63 | Another view of the figure in Item 2 PP-D-23 but witnessed. |
| 17 | Ref3 | PP-AD-64 | As in Item 2 PP-D-24, but witnessed. |
| 18 | Ref3 | PP-AD-65 | As in Item 2 PP-D-25, but witnessed. |
| 19 | Ref3 | PP-AD-66 | Another copy of Item 3 PP-D-42. |
| 20 | Ref3 | MC-AD-108-113 | A copy of an article on "Ribbon Bonding", with pictures of bonded ribbons in pages MC-AD-110-112. |
| 21 | Ref3 | Misc | Several Sections in the text description |

STATEMENT REGARDING FEDERALLY SPONSORED RESEARCH OR DEVELOPMENT

Not Applicable

REFERENCE TO A MICROFICHE APPENDIX

Not Applicable

ADDITIONAL SPECIAL REFERENCES

In addition, the following references relate to both groups of products covered by this present application, i.e. the "Leaded Devices" as well as the "Leadless Devices".

I would like to incorporate here the three following papers, which I had attached at the end of Ref6, as appendices to that document, and were numbered as "Additional Documents".

Ref7. Paper #1—"*Improving Reliability of Plastic Packages*". This was included in Ref6, pages OC-A-36 through-42.

Ref8. Paper #2—"*BGA Mounting and Chip Scale Packaging*". This was included in Ref6, pages OC-A-43 through-49.

Ref9. Paper #3—"*BGA Mounting Using Improved Solder Columns*". This was included in Ref6, pages OC-A-50 through-56.

Papers #1 & #2 were intended to be published at the "Eighth Annual Pan Pacific Microelectronics Symposium 2003", SMTA, Kohala Coast, Island of Hawaii, Hi., Feb. 18-20, 2003. This conference is organized by the SMTA (Surface Mount Technology Association), 5200 Wilson Road, Suite 215, Edina, Minn. 55424-1343, Tel: 952-920-7682; Fax: 952-926-1819; E-Mail: smta@smta.org, www: www.smta.org. However, because of financial difficulties, I cancelled my attendance and withdrew the papers from the conference. However, the papers as intended to be presented, were included in Ref6.

Paper #3 was presented at the "IPC Printed Circuits EXPO 2003", IPC, Long Beach, Calif., Mar. 25-27, 2003. This conference is organized by the IPC, Lincolnwood, Ill., Tel: 847-790-5325.

I would also like to refer to the following paper, which I had presented in connection with my old CCMD/Solder Columns, which I had developed around 1982-86.

Ref10. Paper #4—"*New Solder Column Alloy Improves Reliability of Chip Carrier Assemblies*", by Gabe Cherian, Craig Wynn and Harry White, Raychem Corporation, Menlo Park, Calif., 18th International SAMPE Technical Conference "Materials For Space—The Gathering Momentum", Society for the Advancement of Material and Process Engineering (SAMPE), Seattle, Wash., Oct. 7-9, 1986, pp. 1056-1070. I will be referred to this paper as Ref10.

This paper shows that a solder column that has a wide base near the pads and a narrower waist about the middle of the height is better suited to withstand the ill effect of the TCE Mismatch between the package and the substrate. The amount of flexing and the level of bending stresses become more favorable with this kind of general shape, than with a column that is uniform in cross section throughout its whole length. I would like to refer to such a shape as the "starved" column shape. I will talk more about that further down below.

Furthermore, I will refer in the present specification to the following articles and patents.

OTHER ARTICLES

Ref11. Paper #5—Ken Inaba, John Heffernan, and Dr. Dominique Numakura, "*Zero Clearance Soldermask for High-Density SMT*", PC FAB Magazine, January 2003, pp. 18-21.

Ref12. Paper #6—Larry Gilg, and Chris Windsor, "*Die Products: Ideal IC Packaging For Demanding Applications*", Electronic Design Magazine, Dec. 23, 2002, pp. 47-48.

Ref13. Paper #7—John H. Lau and Katrina Liu, "*Global Trends in Lead-Free Soldering*", Advanced Packaging Magazine, January 2004, pp. 27-30.

OTHER PATENTS

Ref14. U.S. Pat. No. 4,655,382, dated Apr. 7, 1987, entitled "MATERIALS FOR USE IN FORMING ELECTRONIC INTERCONNECT"; Inventors: Geoffrey B. Wong and Arthur W. Lopez, Jr.; Assignee: Raychem Corp., Menlo Park, Calif.

Ref15. U.S. Pat. No. 4,664,309, dated May 12, 1987, entitled "CHIP MOUNTING DEVICE"; Inventors: Leslie J. Allen, Gabe Cherian and Stephen H. Diaz; Assignee: Raychem Corp., Menlo Park, Calif.

Ref16. U.S. Pat. No. 4,705,205, dated Nov. 10, 1987, entitled "CHIP CARRIER MOUNTING DEVICE"; Inventors: Leslie J. Allen, Gabe Cherian and Stephen H. Diaz; Assignee: Raychem Corp., Menlo Park, Calif.

GENERAL BACKGROUND OF THE INVENTION

Field of the Invention

The present invention relates generally to means and methods for attaching devices to each other, more particularly to attaching electronic devices and packages on to each other, or on to substrates or Printed Circuit Boards (PCBs), etc. The invention relates to both leadless packages, such as BGAs or LCCCs, as well as to leaded packages, such as DIPs.

The invention further relates to the reliability and long operating life of assemblies incorporating such devices, and more specifically, when such assemblies are exposed to harsh operating or environmental conditions, such as power cycling or thermal cycling, and more specifically yet, when the different components of such assemblies have different Thermal Coefficients of Expansion (TCEs), what is referred to TCE Mismatch.

Furthermore, the invention relates to the connecting means, such as leads, legs, solder joints and the like, both for the leadless as well as the leaded devices, and the shape and orientation/positioning of these connecting means, especially as to how all this would affect the reliability and long operating life of such assemblies, especially when exposed to the above mentioned operating conditions.

Introduction

The products covered by this present application can be divided into two groups. The first group includes any leadless devices, such as Ball Grid Array Packages (BGAs), Leadless Ceramic Chip Carriers (LCCCs) or any other leadless packages. The second group includes any leaded devices, such as Dual-In-Line Packages (DIPs), or any other leaded packages.

I will first provide a general introduction and background applicable to both groups of products, and then another one, more expanded, applicable to each of the two groups of products separately.

Note: The examiner may decide that both groups of products are so related, that they can be processed as one application. However, if the examiner decides that they should be divided into two separate applications, then I would abide by that decision. Please advise.

Prior Art

In my opinion, there is nothing in the Prior Art that resembles the concepts covered by this present invention.

The only thing that could be considered prior art is what has been covered in my prior applications, i.e. in Ref1 through Ref6, which were cited/listed in the cross-reference section at the beginning of the application. However, this present application is either a continuation or a continuation-in-part to those references.

Objective

The main object of this invention is to improve and enhance the reliability and long operating life of assemblies incorporating leadless and/or leaded devices, especially when such devices are mounted on or attached to each other or to substrates or Printed Circuit Boards (PCBs), and more specifically, when such assemblies are exposed to harsh operating or environmental conditions, such as power cycling or thermal cycling and more specifically yet, when the different components of such assemblies have different Thermal Coefficients of Expansion (TCEs) [TCE mismatch].

The reliability issues can be divided into several different groups. The most talked about issue is with surface to surface interconnections/mounting, and is the fact that the solder joints may crack and/or delaminate from the solder pads and end up with open circuits.

There are however, a number of other problems that impair the reliability.

One new reliability issue is related to the new "lead-free" solders that are being mandated to be used soon, to avoid problems related to solders containing lead (Pb). A new fact is starting to get heard about these new lead-free solders. It seems that there may be problems with the copper solder pads delaminating from the Printed Circuit Board (PCB) during the reflow/mounting process, or at least getting weaker. See Ref13 above.

So, if this is true, then the concepts presented in this present invention will improve the reliability of such assemblies as well, because they will reduce the stresses on the pads, and hence less chance for them to delaminate or to fail prematurely.

Background Information

It has been known in the industry that when two bodies are attached together, like in the case of a leadless electronic package mounted to a PCB, and the assembly is exposed to harsh environmental conditions, such as power cycling or thermal cycling, the joints between the two bodies can get overstressed and may fail prematurely. It has also been know/shown that if the joints are elongated, like columns or leads or legs, instead of being wide, short, or stubby connections, then the life expectancy of such assemblies gets extended.

Furthermore, it was mentioned in the previous referenced applications, especially in Ref3, as well as in Ref5, that "Oriented Leads" or "Columns" can improve the life and reliability of assemblies incorporating packages and substrates, especially if the components have some TCE mismatch, and if they are exposed to temperature fluctuations. I have also provided some sketches and drawings illustrating what I mean, as listed in Table 2 above.

Ref3, and especially Ref5, include a lot of descriptions and explanations about "orienting" the leads, so that they would face the thermal center or thermal fixation point of the packages, or rather of the assemblies. I will refer to the explanations given in those cited references and will not repeat the explanations here.

I had also shown, in those references, a number of ways to achieve the desired designs and goals.

One method was to use a flat leadframe with the leg blanks oriented and radiating out directly from the plastic body, i.e. coming out of the plastic body, not in a direction that is perpendicular to the sides of the body, but at an angle in the correct, more desirable radial direction. The drawings were small and may have not been able to convey many of the details. I will show here in this specification some drawings that will clarify that embodiment.

However, I have shown in Ref6, another way of achieving the same end goal, but where the individual legs or leg blanks would first protrude out from the package body in an orthogonal direction, i.e. similar to the present "conventional" way, and then each "leg blank" would curve, while still flat, a certain part of a circle and then end up in a special desired direction for each specific leg, as will be explained in the following specifications In the following pages, I will include and describe some additional examples of how we can capitalize on this theory; i.e. using oriented leads or columns.

BRIEF DESCRIPTION OF THE INVENTION

The invention can basically be described simply by saying that it proposes to observe two specific things when attaching two bodies or components together, especially when the bodies are expected to be exposed to harsh environmental conditions.

1. Make the connecting elements, which will join the two bodies together, to have some flexibility, to allow and/or compensate for dimensional variations between the two bodies, e.g. from thermal expansion or contraction. One example is to make the joints like tall columns, i.e. slender, elongated, and possibly curvilinear, elements, ideally situated at a generally perpendicular angle to the general surface of the bodies. We would refer to them as "columns". The columns would act as "flexible joints", and will provide for a way to compensate for the deformation of the bodies under the prevailing conditions. Note: If the dimensional variations are expected to be in more than one direction, then the flex joints should be able to compensate for these variations in all their directions. Hence the flex joints should be able to flex in all the respective directions. This is why these joints could be curvilinear, to have more than one degree of freedom, yet to be strong enough to still retain the bodies together as required.

2. If the cross-section of these columns is not round or square, then orient the columns, so that they would provide the least resistance to flexing. For example, if the columns would have an oblong or elongated or rectangular cross-section that is generally longer than its width, or in other words, has a long axis and a short axis, then these columns would be oriented so that their wider surfaces would be facing generally in the direction toward the thermal center or the fixation point of the package or the assembly. We can also rephrase that by saying that each column would be oriented such that the short axis of its cross-section would be in a direction of its respective thermal deformation ray, which would be emanating from the thermal center of the package, or from the fixation point of the package, and going to the center of the cross-section of each column.

In addition, some variations in the shape and construction of the columns are covered by the present invention, as will be described below, together with some additional features.

The main object of the invention is to mount such devices, especially electronic packages, on their substrates, using special connecting means, hereinafter referred to as Oriented Connections, so as to improve the performance life and/or reliability of such assemblies, especially with respect of Power Cycling, Thermal Cycling (columns) and/or Shock and Vibration (columns & anchor).

The connecting means would generally be situated between the device and the substrate. They would be situated with the general axis of their elongated body to be generally perpendicular to the general surfaces of the device and the substrate. The connecting means would also have their cross-section, normal to their body axis, such that the cross-section would be elongated, or oblong, or rectangular.

Oriented Connections are connecting means, which have an elongated cross-section, whether rectangular, or oblong or any other shape, where the cross-section has one large dimension or length and a shorter dimension, generally perpendicular to the first one, or width. Consequently, we can say that the cross-section would have one long axis and one short axis perpendicular to the long axis.

These connecting means would be oriented such that the short axis of the cross-section would be in line with, or approximately in line with, a thermal deformation ray, which emanates from the thermal center, or fixation point of the device, and which radiate towards the center or near the center of the cross-section of the connecting means.

The invention will also show at least two or more ways of shaping the legs/leg blanks of leaded packages in a certain specific way for each individual leg of these packages. This can be accomplished by twisting the legs or by shaping the leg blank in such a way that a simple folding operation would accomplish the same end result.

In the case of leaded packages, most of the legs, in Ref3 and Ref5, were twisted to orient them as desired. In a few cases, the legs were not twisted, but were "folded". See Ref5, FIGS. 20 through 22, FIGS. 25 and 26, and FIGS. 32 through 40, as well as in Ref3, pages PP-D-5 and 6, 82 through 87, 99 and 100, and pages PP-AD-45 and 46. This Invention will provide more examples of leaded plastic packages with "oriented" legs, without twisting the legs. It will also give more examples of solder pads, which could accept both the conventional package legs as well as the new proposed package legs, which were shown in Ref3, pages PP-D-104 and 105, as well as in Ref5, FIGS. 23 and 24.

In the case of leadless packages, the invention will expand on the concepts shown in Ref3, pages PP-D-1, 42, and PP-AD-66, as well as many of the concepts described in Ref5, under the group of "leaded" packages.

The Invention provides means and methods of accomplishing the above goals and objectives.

As mentioned above, the application covers two groups of devices, the leadless and the leaded devices.

I will first describe the embodiments for the leadless devices and then those of the leaded devices.

DEFINITIONS

Vertical, Horizontal, etc.

When we talk about packages or the like being mounted on Printed Circuit Board (PCB) or substrates or the like, we most of the time, visualize that the PCB is laying on a horizontal table, and that the package is being mounted to it, where the body of the package is parallel to the PCB. Hence, we say the PCG and the package are horizontal. If the package is leaded, we then say that the legs of the package are vertical. If the package is leadless, but we want to provide columns between the package and the PCB, then we say that the columns will be vertical, figuring that they will be perpendicular to the general package body direction and/or to the PCB general position.

Usually, the legs of leaded packages are made of flat sheet metal, blanked and formed, etc. The legs are vertical, and the legs axes are also vertical. We kind of ignore the part of the legs that is close to the package body and that is still horizontal.

Usually the legs cross section is rectangular, where the width of the rectangle is the thickness of the sheet metal and the length of the rectangular is several times larger than its width.

We also talk about the face of the leg, or the wide face of the leg, which is the side of the leg formed by the length of the cross section rectangle. I will refer to this face of the leg and state that it should face the thermal center of the package or of the assembly. It is as if a person is standing inside the leg, and facing in that direction.

Thermal Deformation:

When a body is at room temperature or at any initial temperature, and then it gets heated or cooled, it expands or contracts respectively. The changes in its dimensions correspond to the amount of temperature change and to the dimensions of the body. They also correspond to the Thermal Coefficient of Expansion (TCE) of the body's material. These changes in dimensions will be referred to hereinafter as "Thermal Deformation".

Thermal Center

FIGS. 4 and 5 in Ref5, drawings sheets 4/72 and 5/72, illustrate the concept of the "thermal center". If a package is heated or cooled, then the body of the package will expand or contract, and every point on/in the body will move along a certain line or "ray", in a direction of the lines shown in the figures. Each of these lines or rays has 2 ends, obviously. One end is at the individual point of the body being considered, and the other end is at some fixed point in the body. If the point of the body is fixed or anchored at a certain point in space, then this fixation point will be the other end of that line or ray. I will refer to such lines, as the "thermal deformation rays", or simply "rays". I will refer to that fixed point as the "thermal fixation point or center".

If, on the other hand, the package is not fixed at any specific point, but is simply attached to another body via the leads, legs or solder joints, which are evenly distributed along the body, then we can say that the package is "floating". In this case, we can consider that the geometric center of the package is its "thermal center". This of course assumes that the package is homogeneous, and that all its elements are equal and symmetrical and balanced. It also assumes that all the joints are approximately equally strong or stiff and equally distributed around on the package. So, in such as case, all the thermal deformation rays will start at the geometrical center of the package, which will be considered to be its "thermal center" as well, and the rays will emanate from that center and go in a direction towards any specific point under consideration.

There will be other definitions that will be introduced during the course of describing the invention. In most cases, I will try to highlight the fact that these are new definitions.

PREAMBLE TO DETAILED DESCRIPTION

While the invention is susceptible of various modifications and alternative constructions, certain illustrated embodiments thereof have been shown in the drawings and will be described below in detail. It should be understood, however, that there is no intention to limit the invention to the specific form disclosed, but, on the contrary, the invention is to cover all modifications, alternative constructions, and equivalents falling within the spirit and scope of the invention as defined in the claims.

While I am describing the drawing in more details, I will at the same time explain the technology basis of the invention, whenever applicable. I will also include a number of examples in this section, which should be considered as part of the embodiments for the purpose of this application as well.

This description covers more than one invention. The inventions are based partly on the same technology platform, but then each of the inventions has some additional features of its own. Not being an expert in handling patents, I would like to leave it to the patent examiner to decide on the number of the inventions contained and how to split one invention from the other.

I will also cover in this application a number of embodiments for some of the described inventions. Some will relate to the legs of the packages, others will relate to the solder pads, which are part of the PCB or substrates or other devices, and which are to accept the legs of the above packages.

I will then describe each of the other applications separately.

Finally, I will describe some new features that are common to many applications.

Moreover, I will describe some additional features, related to some individual applications. These new features are not based on the common basic technology that I started with at the beginning.

BRIEF DESCRIPTION OF THE DRAWINGS

The drawings can be grouped into two separate groups. The first group includes FIGS. 1 through 35 and relates to leadless packages. The second group includes FIGS. 36 through 92 and relates to leaded packages.

FIG. 26 shows the figures in "wire form" format, while FIG. 27 in "hide" format.

FIG. 30 shows an analysis of two different methods of using preforms. The top set of figures show what would happen if we do not use any spacers or stand-offs, while the bottom set shows the effect of using some spacers or stand-offs.

FIGS. 31 through 33 show a device that can be used to lift a BGA above the PCB during the reflow process, to stretch the solder joints and to create the rectangular columns and/or the starved solder joints.

FIG. 35 shows the concept of creating or growing a tall rectangular solder column and the mask that could be used to do that.

FIGS. 55, 56, 57 and FIGS. 58-A, 58-B, and 58-C show additional view of the end result package. Just to better visualize how the legs are formed in the proposed orientation.

FIG. 62 shows the standard conventional pads, while FIG. 63 shows the "dedicated" pads, and FIG. 64 shows the "combo" pads.

The lead frame in the earlier figures, FIGS. 36 through 77, is what I refer to as the "Oriented" leadframe. The one used in this group of figures, FIGS. 78 through 92, is what I refer to as the "Orthogonal-Oriented" leadframe. The difference is the way the leg blanks exit from the package body. In the "Oriented" leadframe, the leg blank exit on some angle to the body sides or centerlines, while in the "Orthogonal-Oriented" leadframe, the leg blank first exit in a perpendicular direction to the body sides or centerlines, and then the leg blanks have a "neck" that curves and ends up in a direction that is "oriented" as required by the present invention. So, both leadframes end up with "oriented" legs, but in one leadframe, the leg blanks emerge from the body in the "oriented" direction, and in the other leadframe, the legs start at a normal angle and then become oriented later.

Please note that a combination of the two leadframes directions is part of this invention too. In other words, the "orthogonal-oriented" version, can have the leg blanks emerge from the body at some angle, which is neither the ultimate oriented angle, nor the normal, perpendicular direction, but something in between, and then the neck would curve properly to end up with the legs oriented properly at the end.

Figure 82:
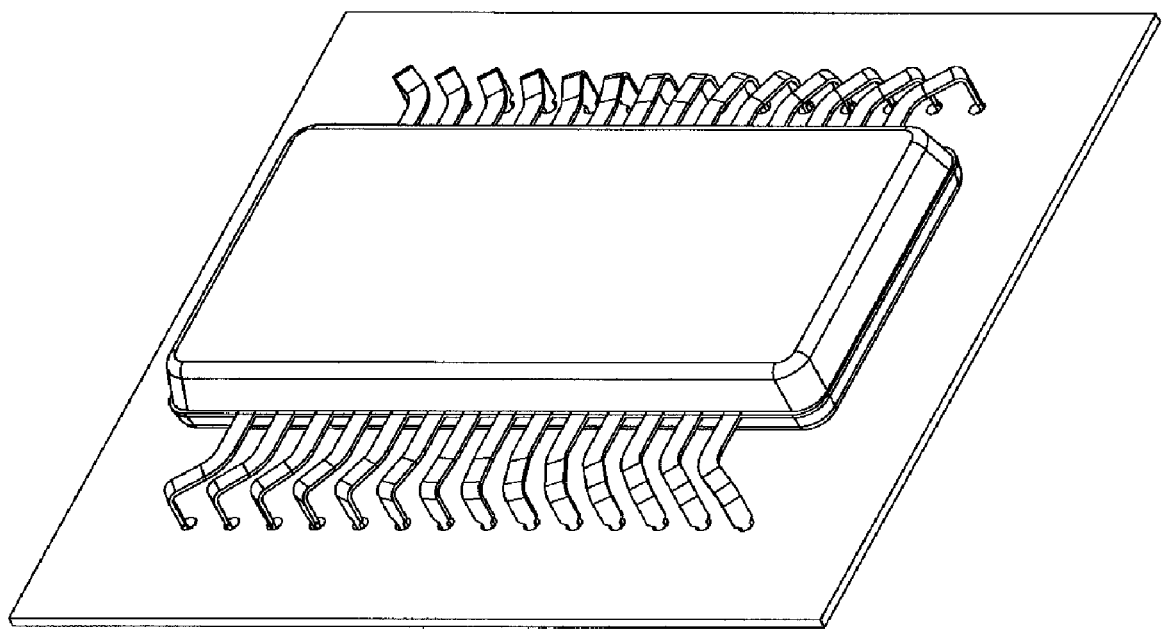
Figure 83:
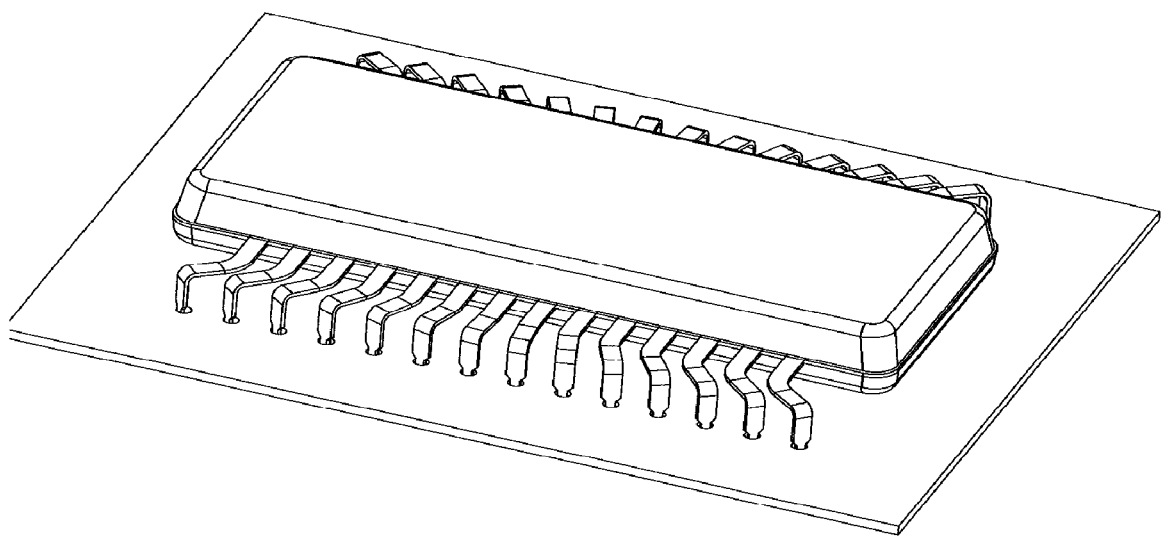

FIGS. 82 and 83 show the new package mounted on a PCB, where the solder tails of the legs have been inserted into through-holes in the PCB for clinching and soldering.

Figure 84:
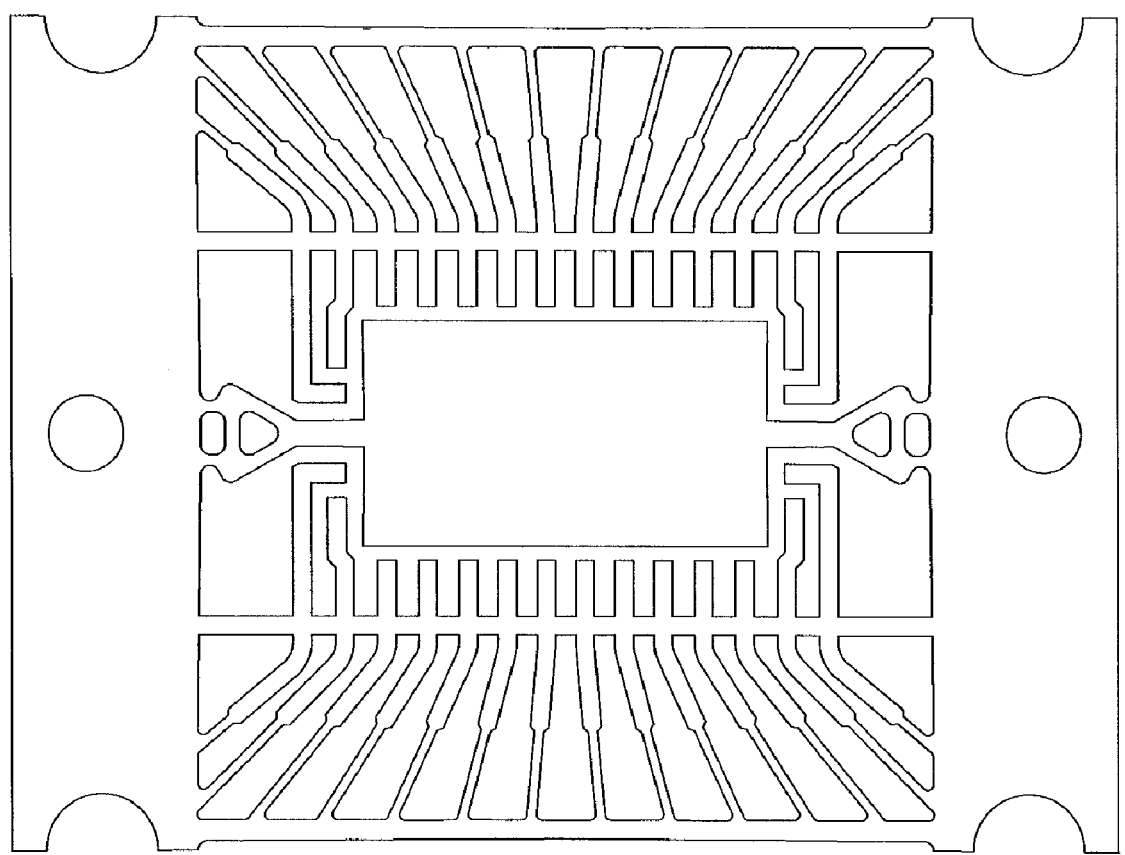
Figure 85:
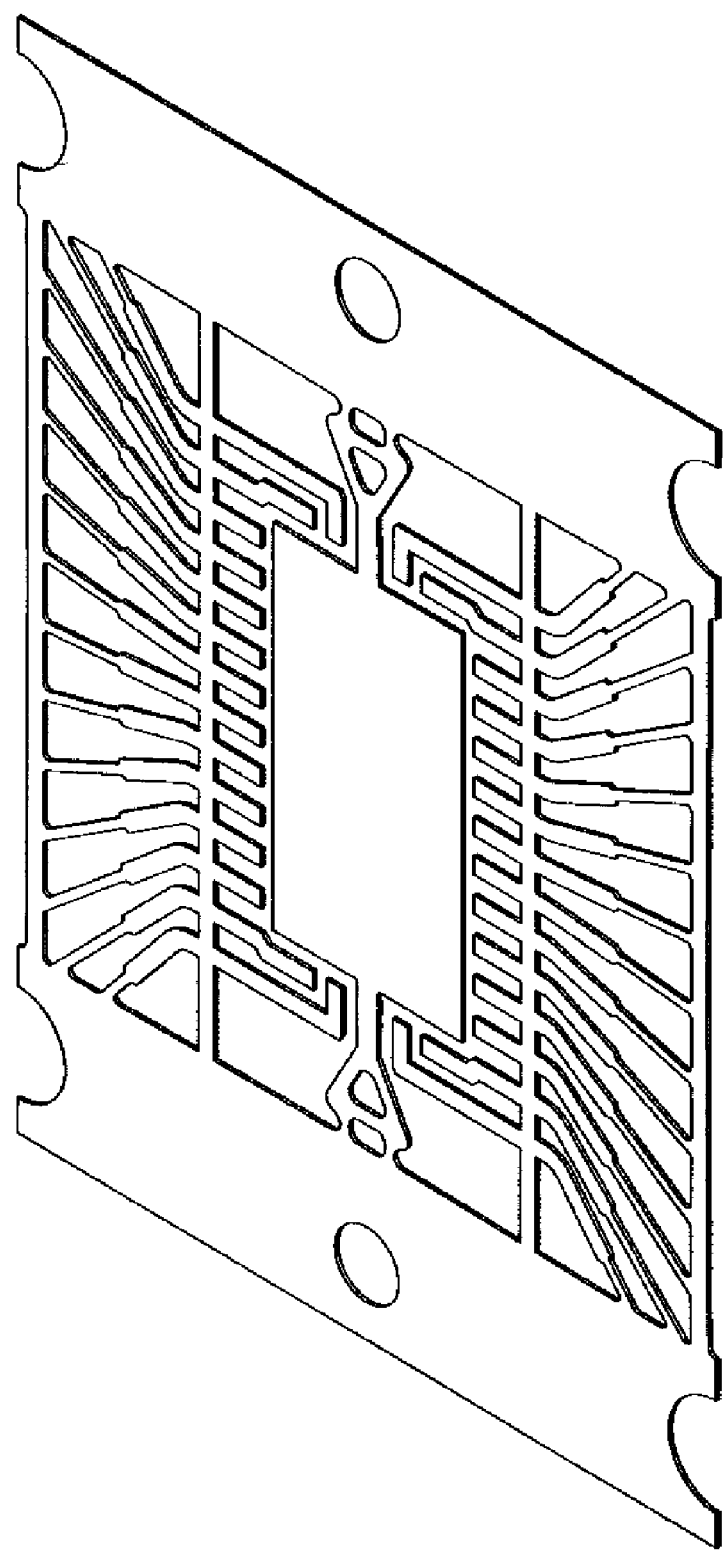

FIGS. 84 and 85 show the leadframe according to the new method, i.e. the "Orthogonal-Oriented" method.

FIGS. 86 through 90 show the leadframe, with the package body on it already, at different stages of the manufacturing process.

Figure 91:
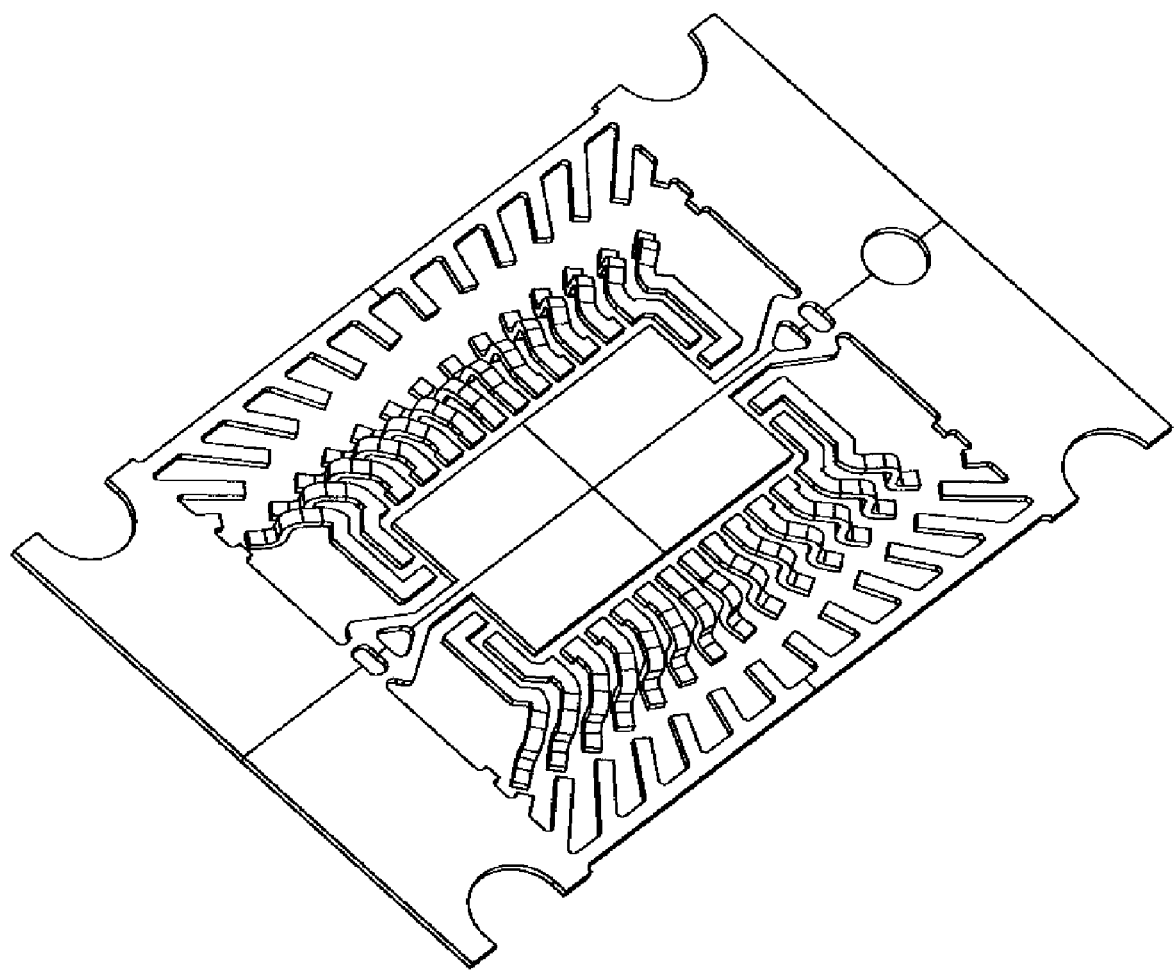

FIG. 91 shows the leadframe, as if it has gone through all the manufacturing steps leading to the condition shown in the above figures, except that the package body has been removed. This is just for clarification and visualization. The carrier strip is still present.

Figure 92:
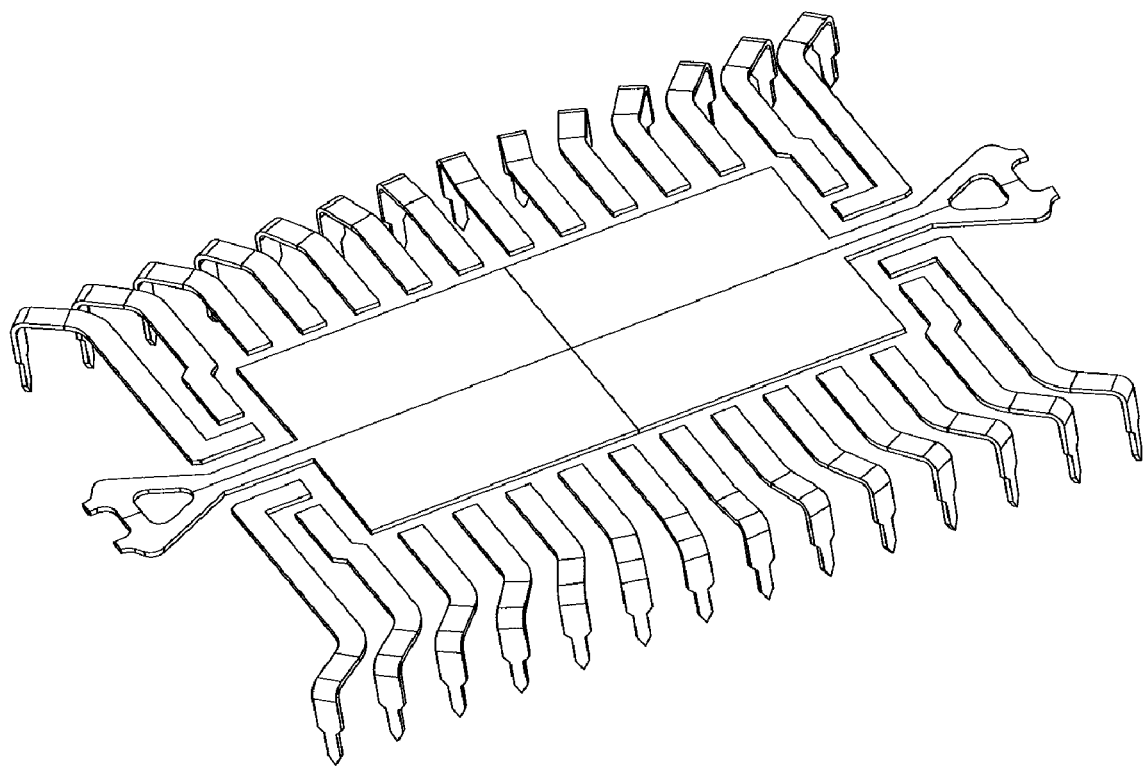

FIG. 92 shows a 3-D view of the same leadframe shown in the above figure, with the oriented legs, but without the carrier strip.

SPECIFIC BACKGROUND

Leadless

Note to the Examiner:

All the information in this section was part of Ref6, which was incorporated in this application by reference at the beginning of the application. I could simply refer the reader to the text in that Ref6 and not repeat it here. This would reduce the size of this "formal" application. Please advise.

Also, although I have copied all the text here from Ref6, I have not included the figures. I simply mentioned the figures, as being figures in Ref6. I hope that this is correct and acceptable. However, if Examiner desires, I could very easily include either all or a few of those figures here in this specification as well.

Please advise.

Review of Some "Natural Phenomena"

Basically, most of the information in this section could be considered as part of "Material Science" or "Metallurgy" or "Physics". Probably no new information for most of the readers. It is here simply to describe certain physical phenomena and to highlight certain observations and to help in understanding and accepting the concepts presented in the present invention.

Standard Conventional Solder Pads

Standard conventional leadless packages, e.g. Ball Grid Arrays (BGA) or Leadless Ceramic Chip Carriers (LCCC) have solder pads that are either rectangular, square or round (circular) in shape. Their dimensions are usually covered by JEDEC Standards or the like.

So far, all such packages have been either square or rectangular, where their two main central axes are orthogonal, i.e. perpendicular to each other, and the sides of the packages are straight and parallel to the central axes. The solder pads also have always been ORTHOGONAL in their location and/or shape, as well. By this I mean that the solder pads are laid out along rows and columns that are orthogonal and parallel to the central axes and sides of the package body. Examples of such packages are the BGAs and LCCCs mentioned above. It is also important to notice that when the pads are not round, i.e. when they are square or rectangular, then the pads sides also are orthogonal and parallel to the sides and central axes of the package.

How the Shape of the Solder Pad Affects the Shape of the Solder Joint

Another basis for the proposals in this invention is the fact that in general a solder joint usually follows or imitates the shape of the solder pad, which it is attached to. Another thing is that the distance between the two pads that are being attached together, most of the time, one pad on top of the other, and the amount of solder present at the joint to start with, also affect the shape of the solder joint.

I will first explain what I mean by that and then show how we can take advantage of this phenomenon to create the kind of solder joints that would work best for us.

To do that, I will use two cases. Case 1 is where we have one solder pad, with some solder molten and reflown on top of this pad. Then, Case 2 is where we have two solder pads being joined together with a certain amount of solder between them and with a certain distance between the pads.

Note to the reader: Most of the text in this section had been included in Ref6. Ref6 has also a number of figures that go along with this text. I will not duplicate those figures here in this application. I would rather like to refer the reader to those figures in Ref6.

Case 1: One Solder Pad with Solder on Top of it.

First, the effect of the shape of the solder pad.

Solder is well known for its high surface tension and its strong capillary characteristic and its affinity to wet to surfaces of materials that are wettable to it. Of course, this happens when the solder is molten and is free to move around, and when the wettable surfaces are also hot enough and clean as well, so that the solder would not freeze and would adhere to those surfaces. As a result, when we have a proper amount of solder and reflow it on top of a pad made of solder wettable material, like copper, then the molten solder will spread on the surface of the pad and create a layer of solder on the surface of the pad. Of course the solder pad itself should also be hot enough and up to the proper temperature, and should be clean as well.

Second, the available amount of solder will affect the shape of the solder on top of the pad.

If the amount of solder is enough, then the solder will cover the whole surface of the pad. If there is still enough solder, then we will see a "pillow" of solder, with the pad as its base and a "dome" formed on top of the pad. The height of the dome will depend on the available amount of solder. The edges of the dome will be touching the edges of the pad. If the pad is round, then the pillow will have a round base, too. If the pad is rectangular, then the pillow's base will be rectangular exactly like the pad (see Ref6, FIG. B-6, sketch #9, (Not Shown), which I will talk more about later), and if the pad is irregular in shape, then the base of the pillow will have a corresponding irregular shape similar to that of the pad (as in Ref6, FIG. B-7, sketch #G. (Not Shown), which I will talk more about later also).

Example, or Case in Point.

Figure 4:
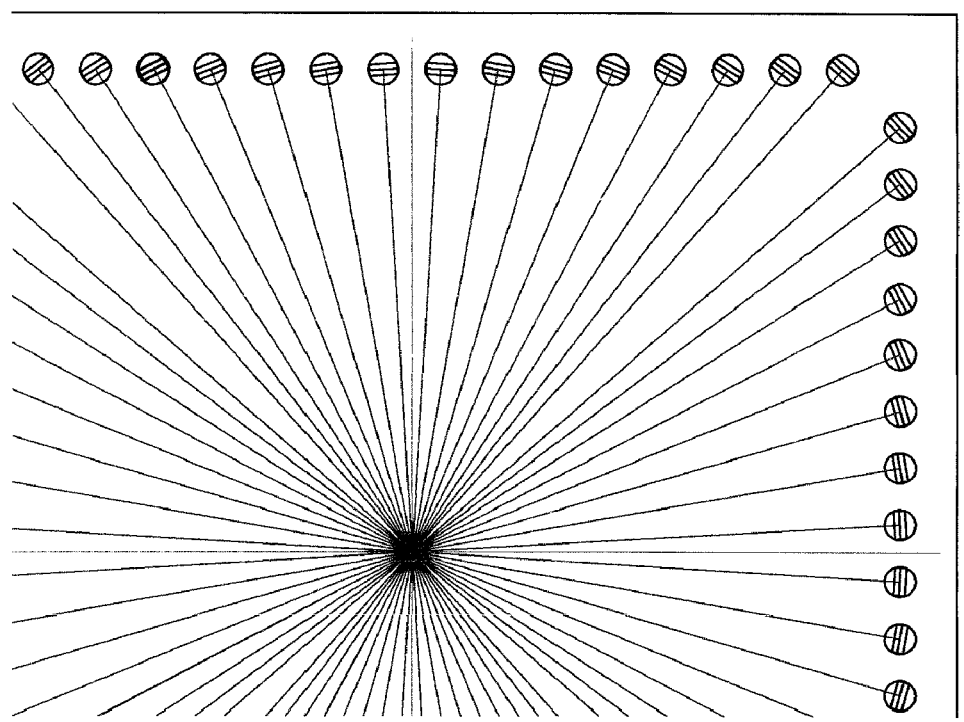
FIGS. 4 through 6 show the basis of the concepts presented in this invention, namely to make the solder pads elongated or rectangular and to orient the pads so that they face the thermal center or the fixation point of the package and/or the assembly.

Ref11, which is the Article that was attached as part of Ref6, pages OC-A-06 through-11, "Zero Clearance . . . , showed in its FIG. 4, page OC-A-09, some solder pads that are covered with solder masks. The mask in the Left Hand Side (LHS) picture does not completely cover the "neck" or "tail" of the solder pads, which is the part of the copper trace that connects the different pads together. The picture on the Right Hand Side (RHS) shows the better solder mask, which does not leave any part of the neck exposed. The article is touting this new solder mask technique for other reasons, but this new technique (RHS) has another advantage. It produces a "balanced" solder joint.

One of my business associates, and let's call him Bill, was telling me about a problem they had when they solder reflowed their BGAs on their Substrates. Some of the solder pads had "necks" as shown in the RHS picture of the above article. Bill was saying that the solder joints that had these necks were distorted in shape. They were not round as they were supposed to, but had a shape that followed roughly the shape of the pad with the neck. And the joints were "pulling" sideways. So in order to compensate for that, Bill put an additional (fake or idle) neck on the opposite side of the existing neck, to balance out the solder joint. This gave me one hint for my proposed designs here.

My Ref6, FIGS. A-1 through A-4, (Not Shown), illustrate the concept in some more detail. Ref6, FIG. A-1 shows three solder pads connected together by "necks", as in the figures of the article mentioned above. I have drawn on one of the pads a solder joint, roughly as Bill had described it to me. Ref6, FIG. A-2 shows an illustration of a board with two solder pads, with a neck connecting them. A solder mask covers the board, leaving an opening around each of the solder pads. The open circle in the mask is too large and leaves a certain portion of the neck exposed, as seen in the figure. Ref6, FIG. A-3 shows the shape of the solder joint, connecting two boards or two components, having solder pads with similar necks, e.g. a BGA on top of a board. Here I am not showing the top pad. (I will talk more about joining two components, further down below). The joint here would have a protrusion, which I will refer to as the "neck knob". Ref6, FIG. A-4 shows the cross section of the solder joint at different elevations. The top and bottom sketch shows the cross section near the pads, while the middle sketch shows the cross section near the middle of the height of the joint. You can see that the middle section is more rounded and the neck knob is not as pronounced, not as "angular", as in the two other cross sections. The top and bottom sections are influenced heavily by the shape of the pads, while the middle section is less influenced by them and so the high surface tension of the solder takes over and tries to smoothen out the shape of the column and to make the cross section more uniform and more round.

Second, the Amount of Solder.

If we keep increasing the amount of solder, that will be reflown over the pad, then we will notice the following progression of events.

First, with just barely enough solder to cover the surface of the pad, and assuming that there is enough to cover the whole surface of the pad, then the solder pillow will be very thin and not tall at all. The edges of the pillow will show a slight small wetting angle, that is the angle between the surface of the pad and the outer upper surface of the pillow will be only a few degrees, say 5 degrees for argument's sake.

Then, if we add more solder to the pillow and while the solder is still molten, then the pillow will increase in height or thickness. We will also notice that the wetting angle will increase. It can become 15 degrees.

By adding more solder and keeping it molten, then the pillow will become fatter and higher, but its edges of its base, which is touching the pad, will still be confined to the shape of the pad. The wetting angle will become larger, until it would reach a 90 degrees angle. Here we can say that the pillow's edges are vertical and stay vertical for a certain height and then taper down inwards to the center of the pillow so that at the center the surface of the pillow is horizontal again, as expected. Assuming that the pad is horizontal.

If we add more solder yet, then the wetting angle would be larger than 90 degrees. This means that the solder pillow will become larger than its base. The base of the pillow will still have the same shape of the pad, but the pillow will have a "belly" that bulges out beyond the pad. We can say that its "footprint" has become larger than its base.

If we keep adding more solder, then we may reach a point where the solder may form a solder ball. The ball may still have a base that resembles the shape of the pad, but gradually the ball would become more like a sphere.

If the pad is round, then the solder ball will keep its true spherical shape or pretty close to it. If the pad had a different shape, other than round, say like a rectangle, then the solder pillow will start as a rectangular base, and then when it reaches the proportions of a ball, then the ball would be more oblong, like a watermelon say.

Case 2: Two Solder Pads, being Joined Together. (One on Top of the Other). See Ref6, FIGS. B-1 Through B-7.

First, the Shape of the Pads.

We can start by having both pads having the same shape. The solder, when molten, will wet the bottom pad and try to cover its whole surface. When that is accomplished and if the amount of solder is appropriate and if the solder had already reached and touched the top pad, then it will wet to the top pad as well and will try to have the shape of the top pad as well.

If the volume of solder is correct, then the solder joint between the two pads will have its edge walls almost vertical and straight. If both pads were round, then the solder joint would look like a perfect uniform round disk. See Ref6, FIG. B-1. If the pads were square, then the solder joint would look like a perfect square block. See Ref6, FIG. B-2. If the pads were rectangular, then the solder joint would be like a perfect prism or parallelepiped. See Ref6, FIG. B-3.

Second, the Distance or Gap Between the Two Pads.

The height of the solder joint will be affected by a number of factors. If the vertical distance between the pads is controlled by some external means, e.g. a mechanical fixture or a solid metal ball placed between the two components to act as a spacer, then the volume of the solder joint should correspond to the space between the two pads, which would be proscribed by (equal to) the surface areas of any of the two pads times the distance between the two pads.

If on the other hand, there is no mechanical fixturing holding the space fixed and constant, then probably the weight of the top component will affect the final distance between the pads. There will be a balance between the weight (pushing downwards) and the surface tension of the molten solder (trying to keep the solder shape more as a ball, thus pushing upwards) to come up with some case of equilibrium. The result could be that, even for the ideal volume of solder, we would get a shorter joint which would bulge out more or less depending on the magnitude of the top weight pushing downwards on top of the solder joint.

Let us dream here for a moment.

Suppose again that we are starting with the ideal volume of solder, and that we are using a fixture to control the space between the two pads. When the solder is molten and the solder has wetted both bottom and top pads, then we move and adjust the distance between the top pad with respect to the lower one. If the distance between the pads is correct and just right, then the edge walls of the solder joint will be fairly vertical and the solder joint would be "uniform" in cross section.

Now suppose that the fixture moves and brings the top pad down a small amount. We would see that the solder joint would bulge out as described above. The cross section at the belly will be larger than at either top or bottom pad. Of course this has to happen while the solder is still molten and has to be done very carefully so as not to disturb the joint too badly and break it open.

Now suppose we do the opposite. We let the fixture raise/lift the top pad away from the bottom pad. Once we go above and beyond the "correct/ideal" height, then we would notice that the solder joint would become thinner at the middle of its height. I suppose that it is relatively clear to the reader that by controlling the height or distance between the top and the bottom pad, we can control the shape of the solder joint. The larger the distance between the pads, the slimmer the joint. The size of the cross section near the middle of the solder height would vary inversely with the distance between the pads. That is of course assuming that we do not change the original volume of the solder at the joint, and assuming of course that all this is done while the solder is still molten and it is all done very carefully and without too much shaking and without disturbing the solder so much as to break the joint.

I believe that the reader can visualize all this, and that this whole thing is feasible.

Starved Solder Columns

The following set/group of figures/drawings marked B show various sets of pads and each set consists of a pair of such pads but at a different distance for each pair. The amount/volume of solder in each case is supposed to be the same and constant. The idea here is to show how we could control the shape of the solder "column" so as to achieve certain goals.

I will show how we could obtain solder columns that are more flexible under bending and that would enhance the operating life of the assembly, as compared to the conventional Solder Balls that are popular in the market nowadays.

Now, Let's go to the Group of Drawings Marked B.

Ref6, FIG. B-1, (Not Shown), shows three pairs of round solder pads, each pair consisting of one pad on top of another, with a certain distance (gap) between the two pads. I have marked the pairs as #4, 5 and 6. The distance (gap) between the pads in sketch #4 is small, the distance in sketch #5 is larger and the distance in sketch #6 is still larger yet. Assuming that we do not change the volume of solder between the pads, then it is clear that the joint will be skinnier (smaller diameter at the belly) the higher the distance (gap) between the pads.

Ref6, FIG. B-2 shows a similar arrangement, but with square pads. Again, the sketches try to illustrate that the solder joints will be skinnier when we increase the distance (gap) between the pads.

Ref6, FIG. B-3 again shows a similar arrangement, but with rectangular pads. Again, the sketches try to illustrate the same fact, that if the pads are pulled out away from each other, the joint will become skinnier the larger the distance (gap) between the pads.

Here I am also showing the area and shape of the cross section of the solder joint at about the middle of its height, which I will refer to as the "waist of the joint" or simply the "waist". Sketch #4 shows the situation where the distance (gap) between the pads is small and the waist is still relatively fat. Sketch #5 shows the pads pulled apart more than in sketch #4 and the waist is slightly smaller than at the base/pads, as shown in the top view. Sketch #6 shows that the pads have been pulled still further more apart, and the waist is still skinnier yet.

Ref6, FIG. B-4 shows the three cross sections superimposed on top of each other.

Ref6, FIG. B-5 shows a series of pad pairs, with the distance (gap) between the pads in each pair increasing progressively as the pairs go from left to right. It also shows how the solder joint would look like when the gap between the pads gets higher and higher or larger and larger. The pairs #r4, 5 and 6 were shown in Ref6, FIG. B-3 earlier. Here we can see that the pair #7 and 8 may still be OK, and the waist there is getting still smaller and smaller or skinnier and skinnier. When we reach a certain large gap, like the one with pair #9, the solder joint would break and be interrupted. The solder will separate into two portions. The portion still hanging on to the top pad would look more like a pillow hanging down from the top pad and may try to look like a tear drop except that the shape of the pad, rectangular in this case, and the surface tension of the solder material would influence the shape of the solder pillow. The portion of solder material remaining on the bottom pad would look like another pillow, whose shape would depend on the volume of solder available there. See my above discussion about this.

Ref6, FIG. B-6 shows an enlarged view of pair # 7 & 9.

Ref6, FIG. B-7 shows a variety of sketches related to what I have discussed earlier above. Sketch #G is particularly interesting. It illustrates the fact that the solder joint would adopt the shape of the pad that it is attached to, and then when the solder gets farther away from the pad, then the solder gets away from the influence of the pad shape and gets more under the influence of its high surface tension. The latter tries to force the solder to become more like a ball or a cylinder. This would be the basis for our attempt to manipulate the shape of the joint and its cross section so that we would obtain solder joints that have ideal cross section shapes so as in turn we would optimize the operating life of our assemblies. For example, by adding the four protrusions, which I refer to as "Mickey Mouse Ears", at the corners of the rectangular pad as shown, we could force the solder joint to have a waist cross section that would be more "rectangular", i.e. with sharper square corner instead of rounded fillets, in contrast with the waist shown in Ref6, FIGS. B-3 and B-4. We could also refer to this pad shape as the "dog-bone"-shaped pad.

Now, we will take all the above and go to the next step and apply it to create the proposed solutions as per the invention.

End of Review Section

BRIEF SUMMARY OF THE INVENTION

The invention discloses design concepts and means and methods that can be used for enhancing the reliability and extending the operating life of electronic devices, and assemblies incorporating such devices, and substrates and/or PCBs, especially if such assemblies are exposed to severe environments such as thermal cycling or power cycling. The main thrust of the invention is to provide flexible joints, such as columns, between the attached components, and preferably to orient such joints, so that they would present their softest bending direction towards the thermal center or fixation point of the assemblies. Joints with rectangular or elongated cross-section are preferred, and they should be oriented so that the wide face of each joint would be facing the thermal center, perpendicular to the thermal deformation ray emanating from the thermal center towards the center of each respective joint. The concepts apply equally to leadless packages as well as to leaded packages.

The same applies to other packages, such as BGAs, where the pads are located on multiple rows or on a matrix, not only along one row near the periphery of the package.

Proposed Designs and Solutions & their Purpose:

In Ref5, I have proposed to have the legs of packages to be oriented, such that their wide surfaces would be facing the thermal center of the package and/or the assembly. I have described that in Ref5, so I don't think I need to repeat the explanations and/or the reasons in this present application again. See particularly FIGS. 4 and 5 in Ref5.

The purpose, summary and gist of the idea in this application here is two-fold:

It is preferred to use columns as the interconnecting elements, to join chips, packages, etc. to substrates or boards, instead of short, stubby joints. Such short joints usually undergo mostly "shear stresses". I prefer to have tall joints, which would act like columns and would undergo mostly "bending stresses". The reason is that such columns would act as "flex joints" between the two components and would absorb the dimensional differences when such an assembly would be exposed to temperature fluctuations. These flex joints would then be under bending stresses, compared with the short stubby joints, which would be under shear stresses. And by selecting the proper dimensions for the columns, we can get the bending stresses down to a level that would not reduce the life expectancy of these joints, but would extend it to an acceptable operating life. PS: Since solder relaxes, it is not usually proper to talk about endurance limit, like with steel. With solder alloys and the like, the S-N curve keeps dropping down almost indefinitely. But we can specify a maximum bending stress, which would give us a "good/long" or acceptable life expectancy, or in other words, the cross section's short axis would be in line with, or approximately in line with, the thermal deformation ray from the thermal center of the device to the point under consideration.

2. It was also explained that if such columns have a cross section that is rectangular or elongated in shape, then it would be beneficial to orient the column and its cross section such that the wider face of the column would be facing toward the thermal center of the package or of the assembly.

Based on the above, I am proposing to create solder joints, to be tall, almost like columns, and where the columns would have cross-sections that are more elongated than circular, and that are oriented such that their wider surface of the columns would be facing the thermal center (TC) of the package or of the (anticipated) assembly, or the short axis of the cross-section in line with the thermal deformation rays.

Objectives

My goal is three-folds.

FIRST, I want that the joints between two devices attached together to allow for dimensional changes, without getting overstressed and without failing prematurely. I propose to make such joints as "tall" elements, such as columns, with their column axes generally perpendicular to the general surfaces of the devices. This applies to solder joints or any other legs or leads or elements joining two devices as such.

SECOND, I want to make the solder joints, so that the joints would have a rectangular or elongated cross section, if not round or square shape or any other symmetrical shape, and THIRD, I want that the wide side of each joint would be oriented, so as to face the thermal center or fixation point, or in other words, the short axis of the joint cross-section would be approximately in line with its respective thermal deformation ray.

Benefits

The detrimental effects of Thermal Expansion and Contraction on the joints, between the components, e.g. the package and the substrate, will be minimized.

As a side effect of the above, the resistance to shock and vibration will be enhanced, for two reasons. First, the fact that the leads/beams are shaped to have their flat faces oriented to the thermal center or the thermal fixation point, makes it that some of the leads will almost always be present to withstand shock forces coming from different angle to the package. Second, we can calculate the natural frequency of the joints or leads based on their length and geometry, or we can empirically generate a relation between their length/height and their frequency. Then, by knowing what vibration range or vibration spectrum we want the package to withstand, we can then select the most appropriate joint or lead dimensions to suit the specific individual case.

SOME ADDITIONAL DETAILS

Some Embodiment Examples of Our Proposed Solution

Group One: Attaching the leads/legs to the periphery of the package:

Items 2, 8, 9, 10, 12, 14, 15, 16, 17, and 18 in Table 2 above show examples of such legs, i.e. attached to the periphery of the package. I will not elaborate much more here on these legs, because I think the idea is already clear enough, and covered enough in Ref3 and Ref5.

Group Two: Attaching the leads/legs to the of the surface of the package facing the other component:

Items 3, 4, 5, 6, 7, 13 and 19 in Table 2 above show legs that are attached to the surface of the packages, i.e. the surface facing the other component to which the package will be connected. We can call them surface mounted.

This kind of "surface mounted" leads/legs/joints will be the main topic of the first group of products in this application, while "leaded" packages will be in the second group.

It can be visualized that there could be the following variations for such surface mounted leads.

A. Discrete leads, such as those shown in items 4, 5, 6, 7 and 13. These could be preformed and could be soldered at both ends, i.e. one end to be soldered to the package, while the other end to be soldered to the substrate. We could also envision that we could use an appropriate (conductive) adhesive, instead of solder, to attach the leads at either end. The leads would be "oriented" during the attachment process, as shown in item 4, 7, and 13, as per this invention.

B. Discrete tape-bonded leads. These would be tape/ribbon bonded, as shown in item 20, at one end to one of the components, preferably the package. The other end of the lead would be soldered attached by some means, e.g. conductive adhesive, to the substrate. Again, the leads would be oriented, preferably during the bonding operation, so as to face the thermal center or the thermal fixation point, see definitions, of the assembly, as per this invention.

C. Discrete Solder Columns: Here again, we can have a number of variations and sub-variations. I will describe some of them briefly here and then will elaborate on a few of them further down below.

C-1. The discrete solder columns can be formed right on the spot, starting out with a solder ball and then shaping it during the reflow process to the desired shape of the flat, with elongated cross-section, oriented column. (See further below).

C-2. We could also preform the solder column as a generally flattened, with elongated cross-section, column and hold it in the proper orientation by a carrier wafer or a fixture and then attach it to the package first, and then to the substrate next. An example would be to take the CCMD solder columns, flatten them under a press or the like, so that each would have an oblong or elongated cross-section, but with the correct length, then insert each flattened column into a carrier wafer, such that each column would face the central thermal center of the package/assembly. (See also Ref5).

C-3. We could also attach such flattened oriented solder columns, with elongated cross-section, to both the package and substrate in one operation, if we use something like the soluble/disappearing carrier wafer. (See also Ref3 & Ref5).

C-4. We could also use an appropriate (conductive) adhesive, instead of the solder, to attach the flattened oriented columns to the package and then to the substrate. Again, this can be done in two steps, or in one step, as explained above.

C-5. We could "grow" the solder columns on the chip (or the package), by any of the various methods known in the industry. We just have to make sure that the cross section of the columns is flattened, with oblong or elongated cross-section, and that the columns are oriented so that the wide surface of the columns faces the thermal center, or the short axis of the column cross-section is in line with the respective thermal deformation ray, as per this invention.

DETAILED DESCRIPTION OF THE INVENTION

Leadless

Figure 1:
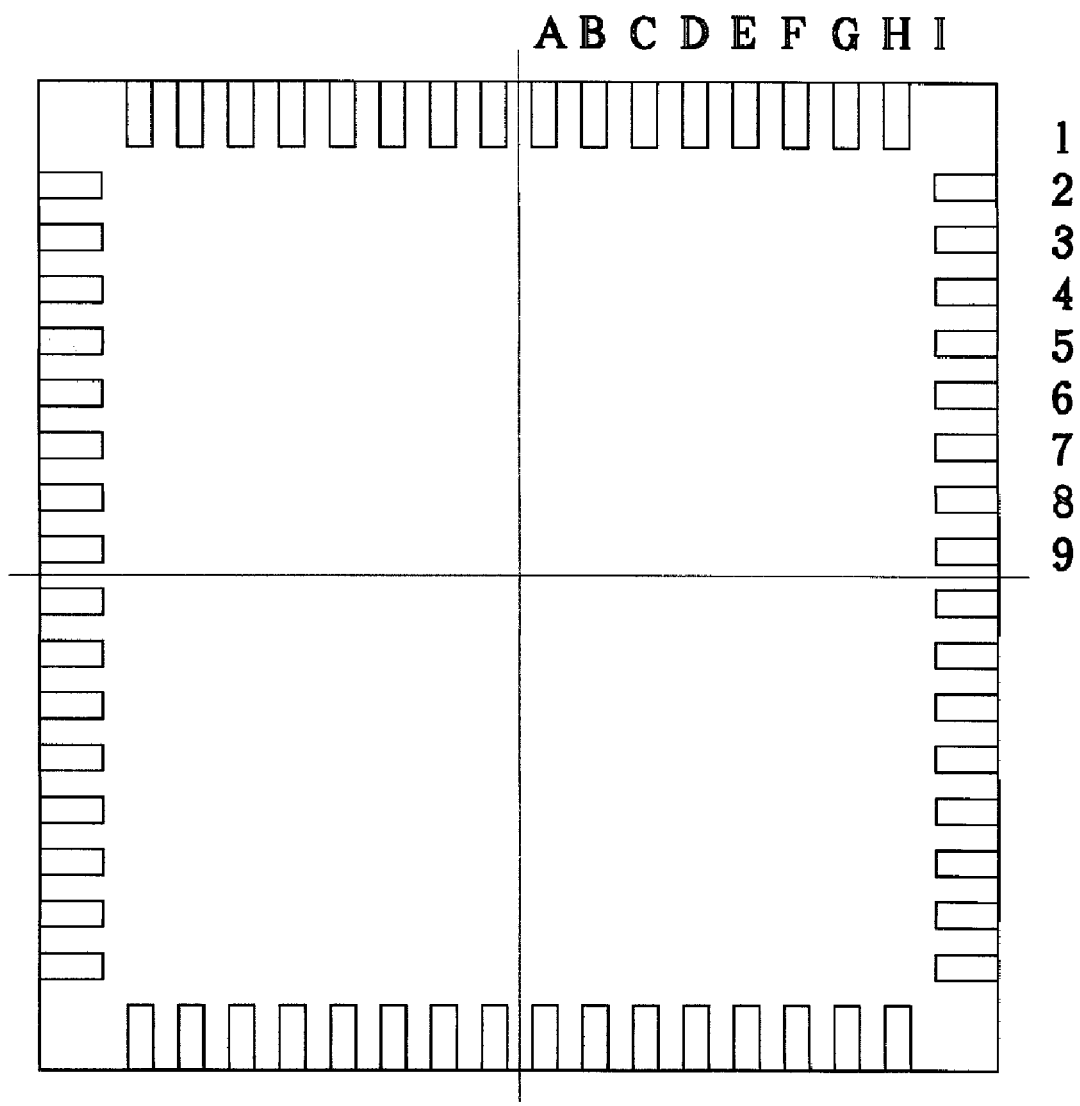
FIGS. 1 through 3 show prior art leadless packages, highlighting the shape of their solder pads.

Embodiments for Leadless Devices
Conventional Solder Pads (Prior Art):

FIG. 1 shows a (Prior Art) conventional LCCC (Leadless Ceramic Chip Carrier). It shows the solder pads on the periphery. The solder pads are usually rectangular and reach all the way to the outside edge of the package. The pads are "orthogonal"; i.e. the sides of the rectangles are parallel to the package sides and central axes of the package. We can see in the figure, the central axes, as well as the centerlines of the pads at one quadrant of the package. I have labeled the pads, by "A B C . . . " for the columns and by "1 2 3 . . . " for the rows. We can also see the centerlines of the pads being all on lines, parallel to the package sides and the package centerlines.

Figure 2:
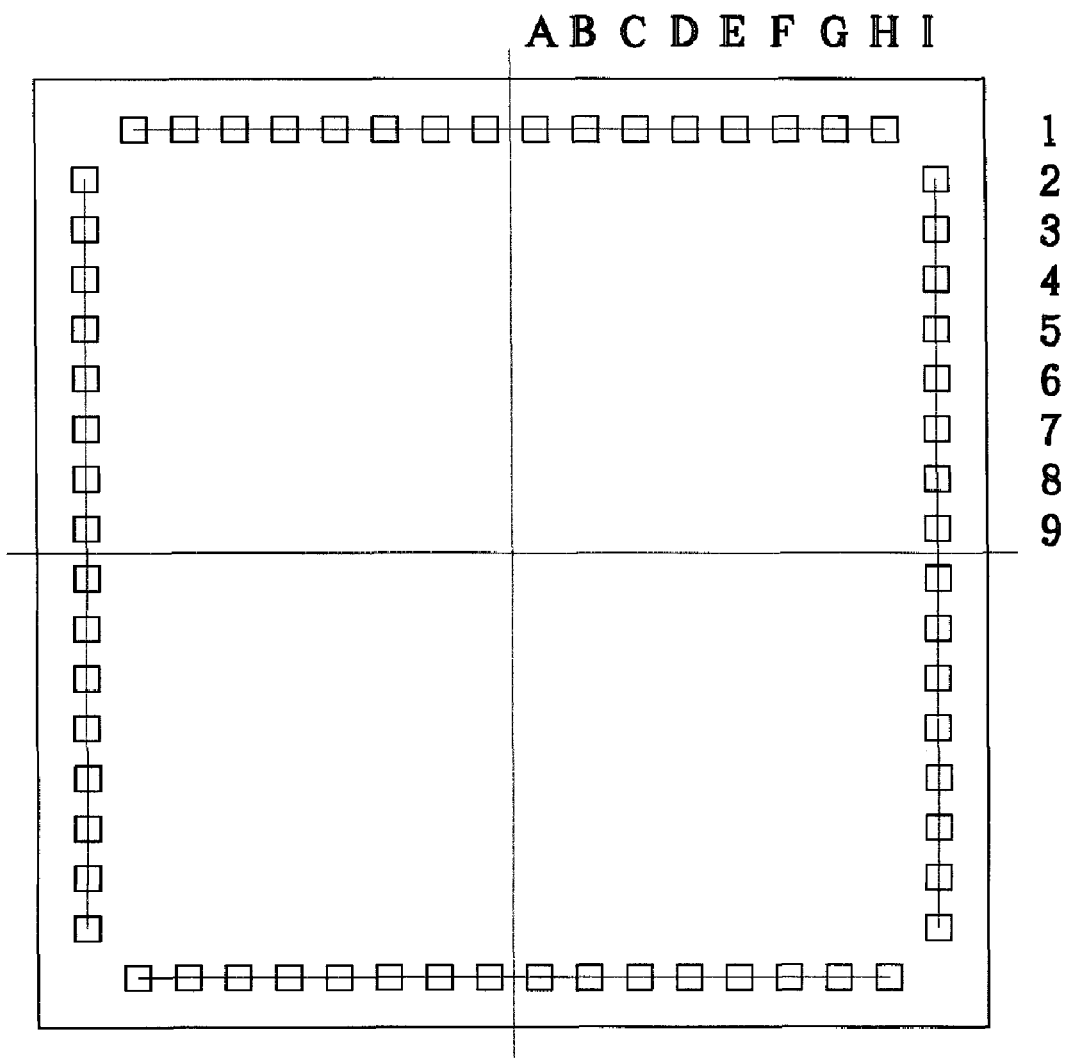

FIG. 2 shows a similar (Prior Art) package, but the solder pads are square, instead of rectangular. We can also visualize that the pads could fill out the whole matrix (or part of it) and the package would then be called a BGA (Ball Grid Array) package.

Figure 3:
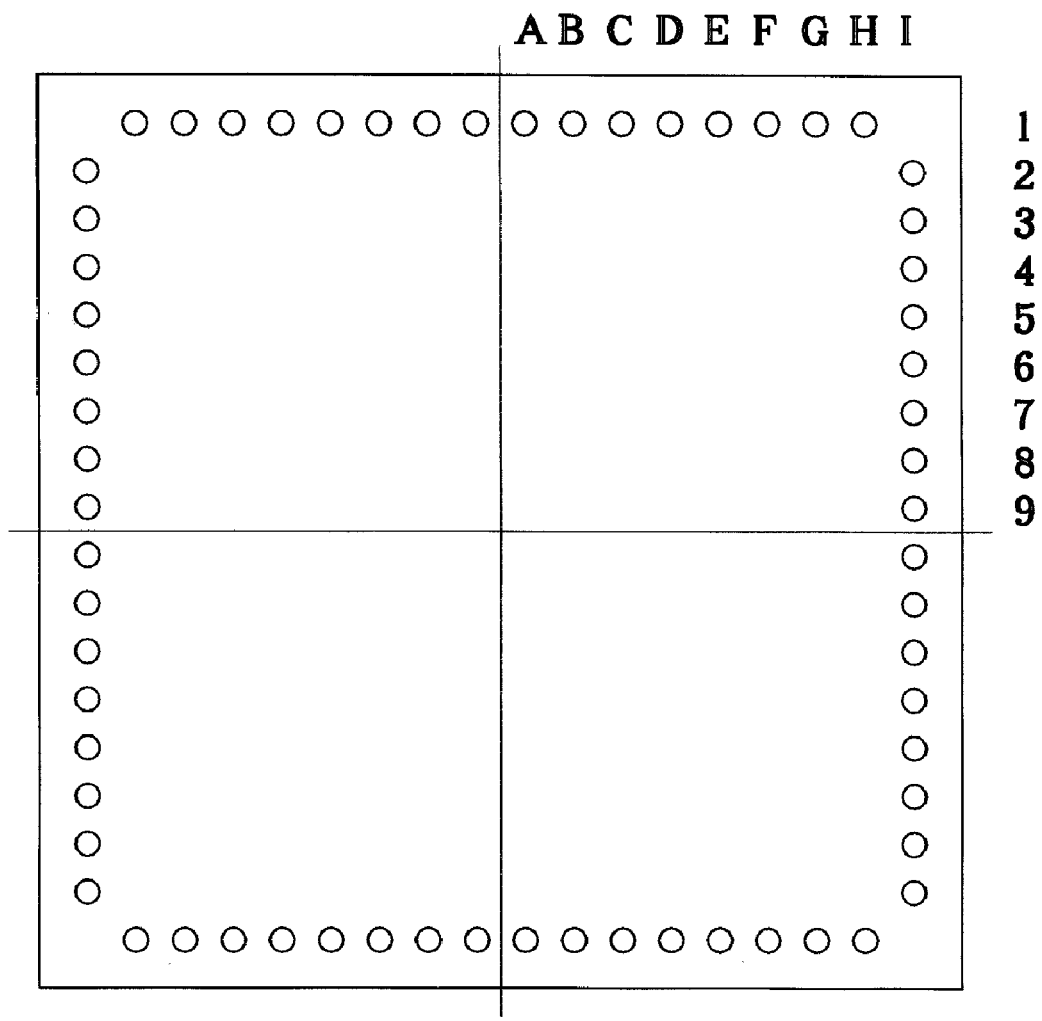

FIG. 3 shows another similar (Prior Art) package, but the solder pads here are round (circular), instead of rectangular or square. Again, we can visualize a full matrix (or part of it) of pads, and the package could also be considered a BGA.

Proposed Oriented Solder Pads an Solder Columns

FIG. 4 shows a package similar to the one shown in FIG. 3, i.e. with round solder pads. I am showing only the top right quadrant, but the same will apply to all the other three quadrants as well. They will be mirror images of the first quadrant shown. I have drawn new "rays" propagating from the geometric center of the package and going to the center point of each and every solder pad. We can easily consider here the geometric center of the package to be the "thermal center" of the package as well, as explained in the above definitions. These rays represent the direction of any expansion or contraction that may occur in the component or assembly, if they were exposed to thermal cycling or power cycling.

If we have a point of the package, "fixed" in space, then that point will act as the anchor, and all the thermal deformations will start or originate from that point. Hence, we can say that this "fixation point" is acting also as the new/effective "thermal fixation point", which would be equivalent to the "thermal center". In such a case, all the thermal deformation rays will then be emanating from this "fixation point". Again, this is in accordance with the earlier definitions.

According to this present invention, all the leads/legs/joints will have to be facing this thermal center or the thermal fixation point.

I have added another line inside each of the solder pads. This is a line that is perpendicular to each thermal deformation ray, which starts at the thermal center or the thermal fixation center of the package and proceeds to each individual pad. This new line would give us the preferred direction of bending axis of each respective solder column (or leg or lead), if we want to minimize the (bending) stresses on that column during the thermal expansion and contraction of the assembly. We will refer to this line as the "preferred bending line", or simply the "bending line" "for its respective pad". [DEFINITION]. We can notice and appreciate that the direction of the bending line inside each solder pad is different than that of the adjacent ones, because the direction of the thermal deformation rays changes continuously as we go from one pad to the next, to the next, etc.

Inside each solder pad, there are two additional lines. They are parallel to the bending line, one on either side of it and at a certain distance from it. These two lines will define the shape of the new rectangular solder pads, according to this invention.

Figure 5:
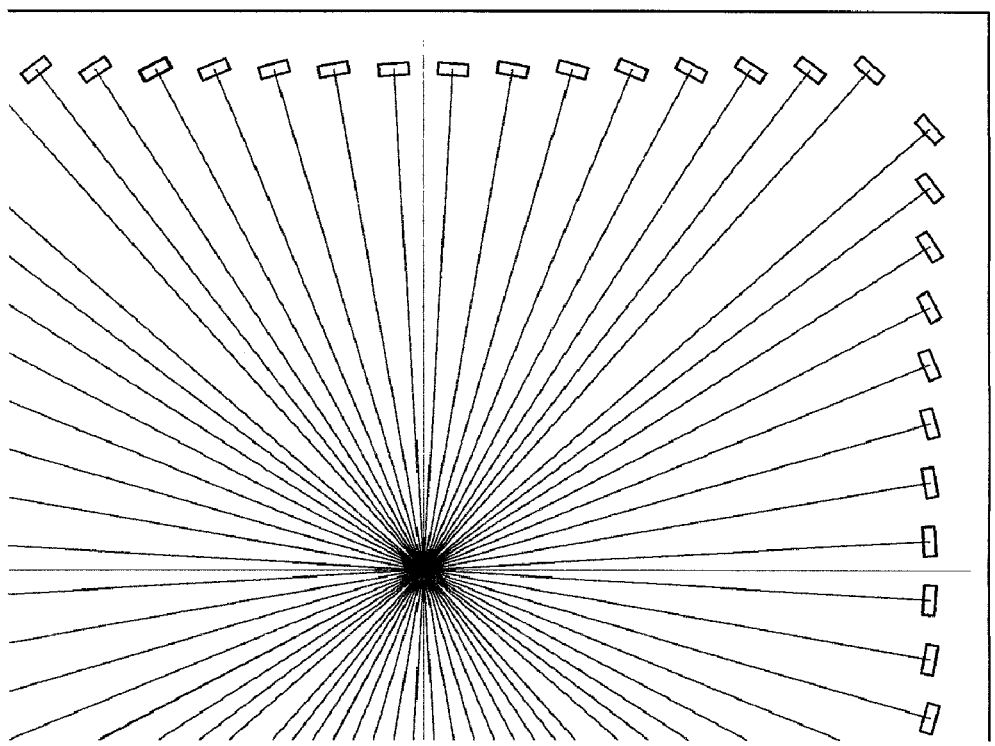

FIG. 5 shows the new proposed solder pads. They have a generally rectangular shape. Their width and length can be selected to suit the individual case and package. For this example, I have selected the rectangles to be 0.010×0.025 inch. The distance between the center points of each pad and the adjacent one (pitch) in this case is 0.050 inch. Please notice that each rectangular solder pad has its long sides parallel to the bending line at that specific pad at that specific location, which in turn is perpendicular to the thermal deformation ray for that point. Hence as stated earlier, the direction angle of each solder pad would progressively increase as the pads go around the perimeter of the package. This is the shape and orientation of the proposed oriented solder pads, as per present invention.

Figure 6:
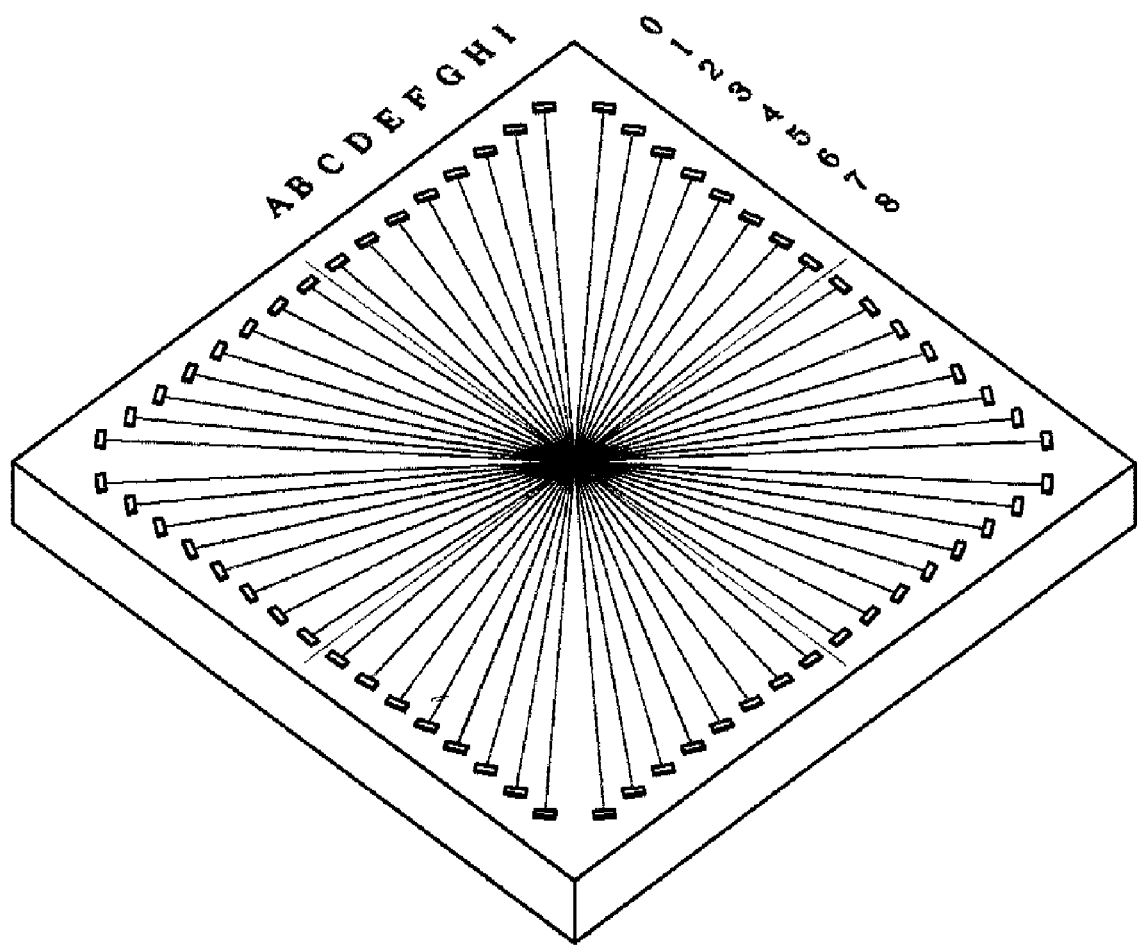

FIG. 6 shows a 3-D view of the package shown in FIG. 5, showing the oriented rectangular pads of the package.

Now, if we build our solder columns on top of each of these pads, such that the columns would generally have a cross section generally similar to these solder pads, and would be oriented in the same respective direction of each individual pad, then the new solder columns would have minimum bending stresses applied on them during any relative motion between the package and the substrate, for example during a thermal cycling situation.

Figure 7:
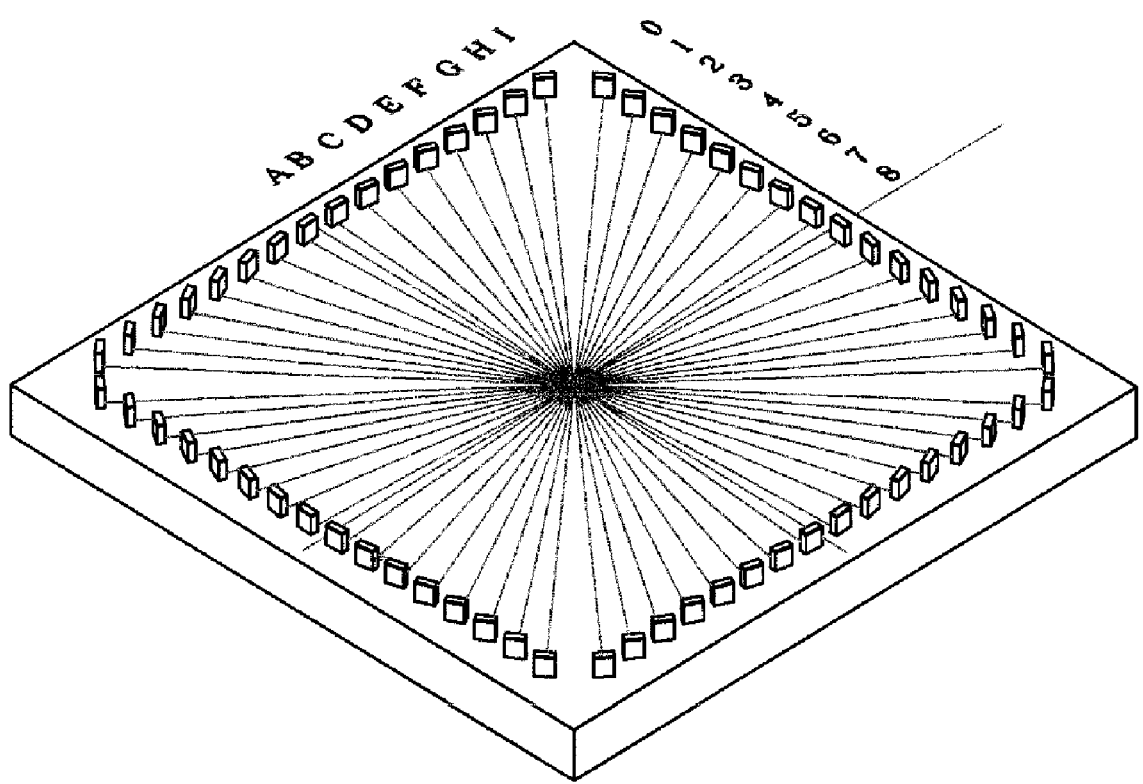
FIGS. 7 through 9 show an LCCC with solder columns, on top of the rectangular solder pads, highlighting the fact that the columns are tall rectangular in cross section, and that their wide faces are oriented towards the thermal center of the package.
Figure 8:
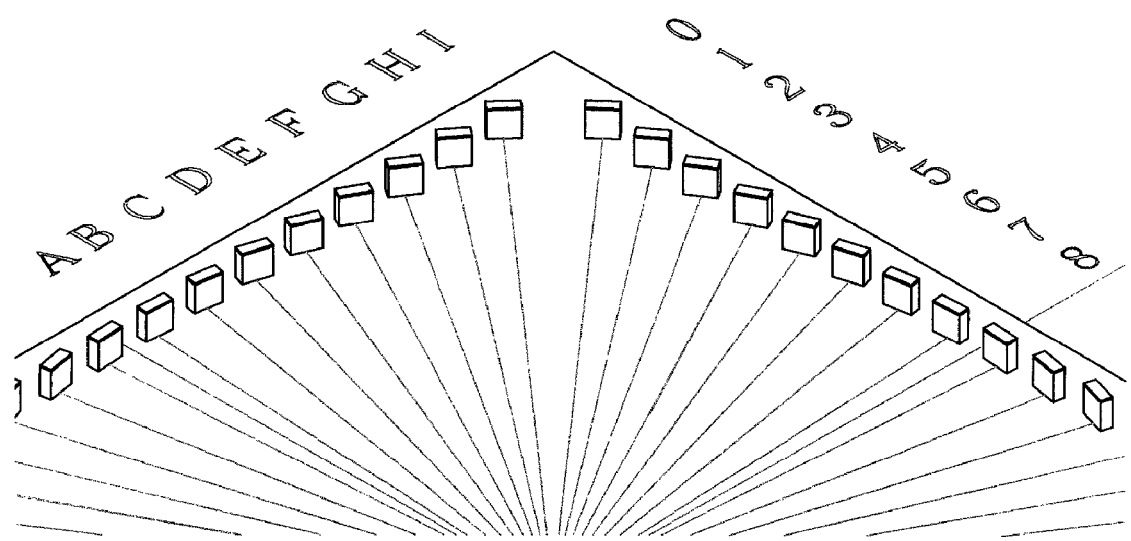
Figure 9:
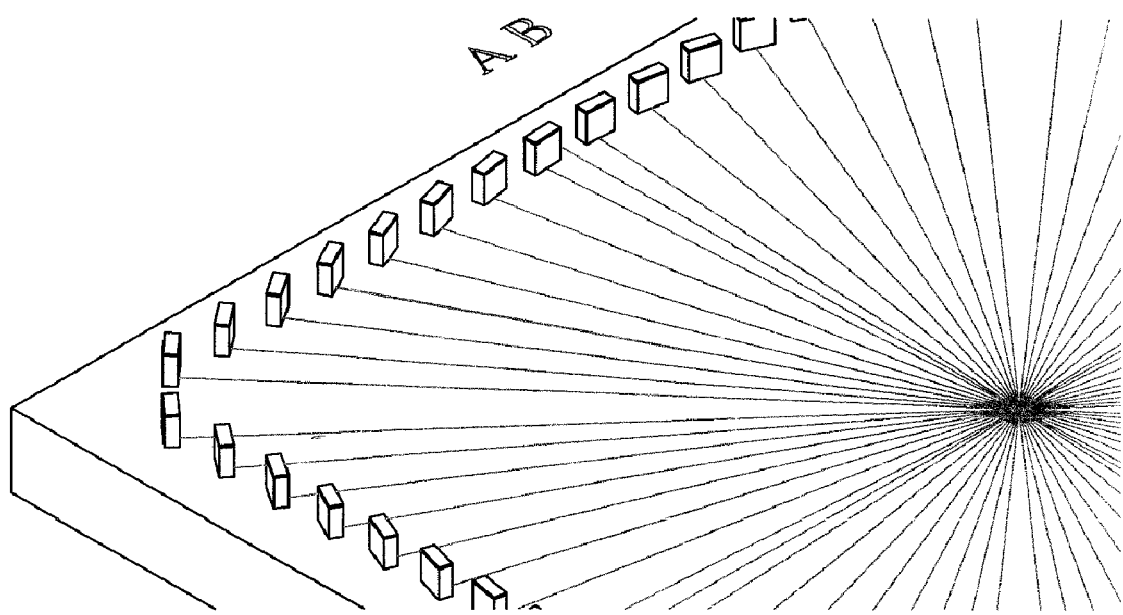

FIGS. 7, 8 and 9 show also 3-D views of the columns on top of the pads, which were shown in FIGS. 5 and 6. Note that these are all along the edges of the package, and are usually called "peripheral" pads. FIGS. 8 and 9 are zooming in on different parts of the package. FIG. 8 shows the top corner and FIG. 9 shows the left-hand side corner.

Figure 10:
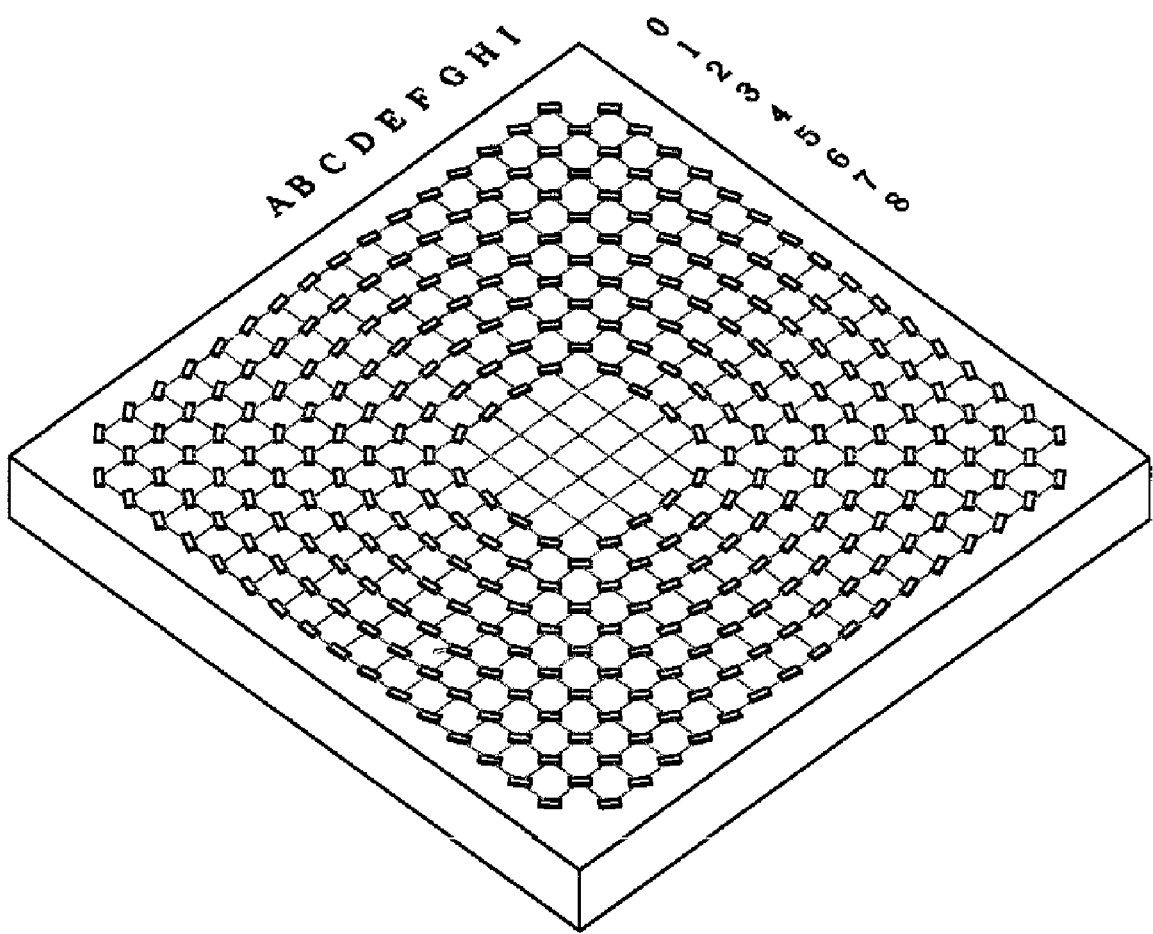
FIGS. 10 through 13 show a BGA, with several concentric rows of solder pads/joints/columns, according to the present invention, i.e. tall columns, with rectangular cross section and oriented to face the thermal center of the package.

FIG. 10 shows a 3-D view of a BGA, where the solder pads have been made as per this invention, i.e. oriented and facing the thermal center of the package. I am showing seven concentric rows of pads, but there could be as many as required or as many as specified by the "standards".

All the pads are located along their standard conventional orthogonal lines, i.e. the "center point" of each pad is on a line, which is parallel to the sides or the center lines of the package, and at the proper pitch, etc. These locations are exactly as specified by JEDEC or by any other standards, for standard conventional BGAs. The only difference is the shape of the pads and their orientations.

However, the pads themselves are not as specified for standard conventional pads. They are according to this present invention, i.e. they are rectangular in shape, and they are oriented, such that their "bending line" is perpendicular to the thermal deformation ray, which starts at the thermal center of the package and goes through the center point of each respective/individual pad.

Figure 11:
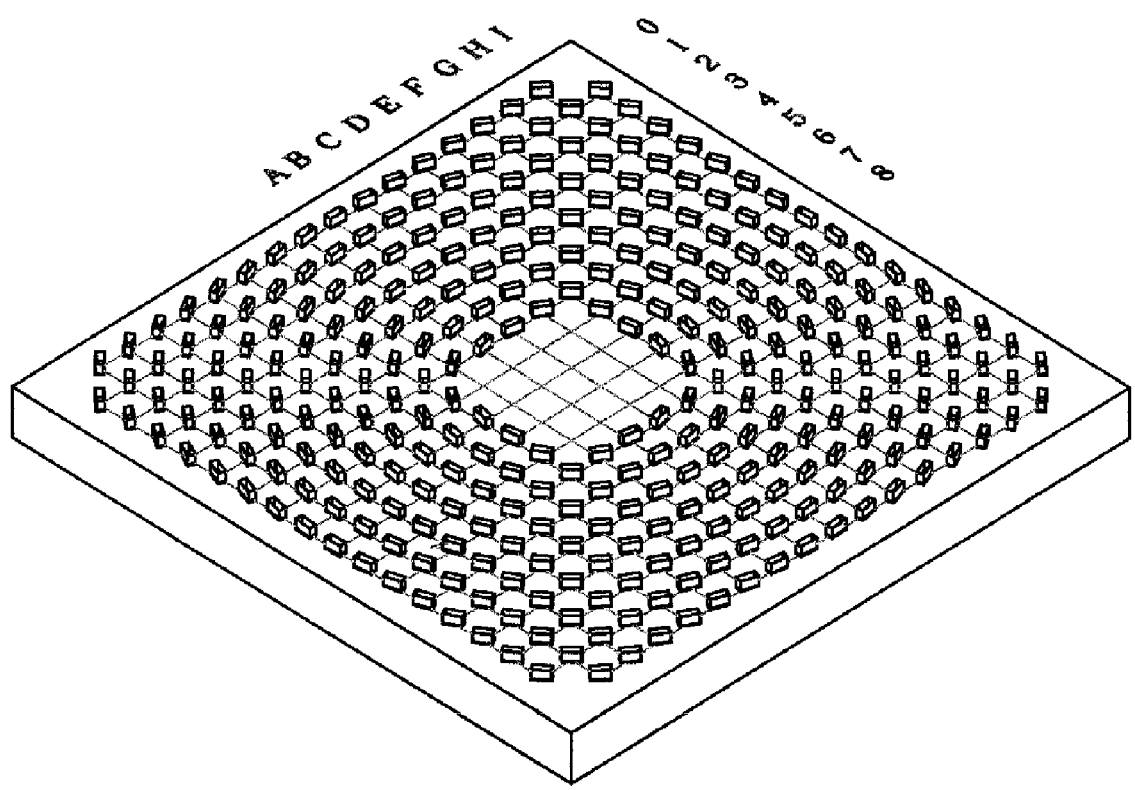

FIG. 11 shows a similar BGA as the one shown in FIG. 10, except that it also shows the columns on each individual pad.

Figure 12:
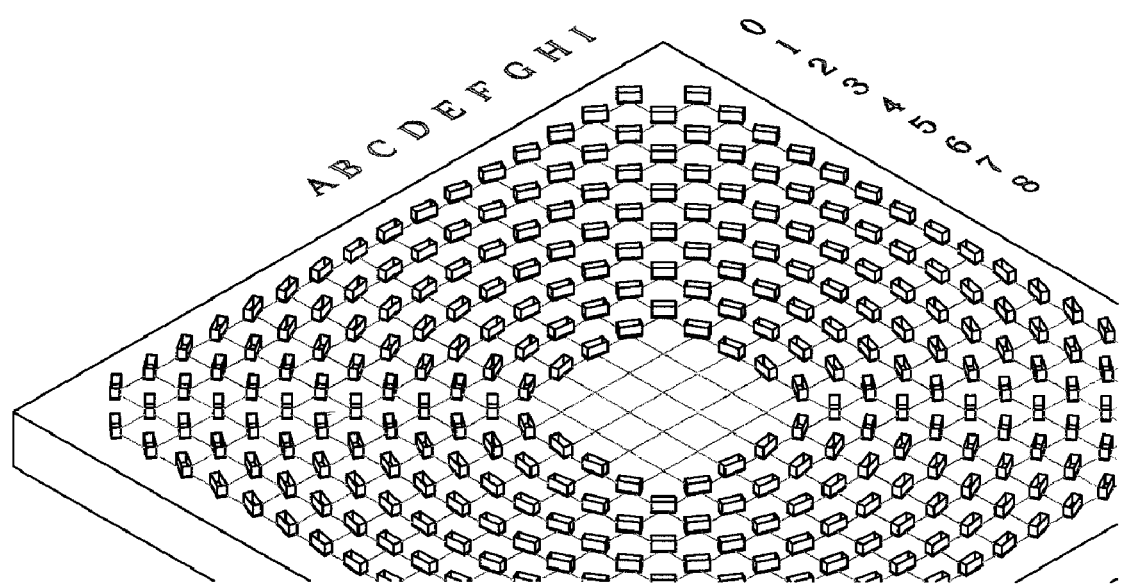
Figure 13:
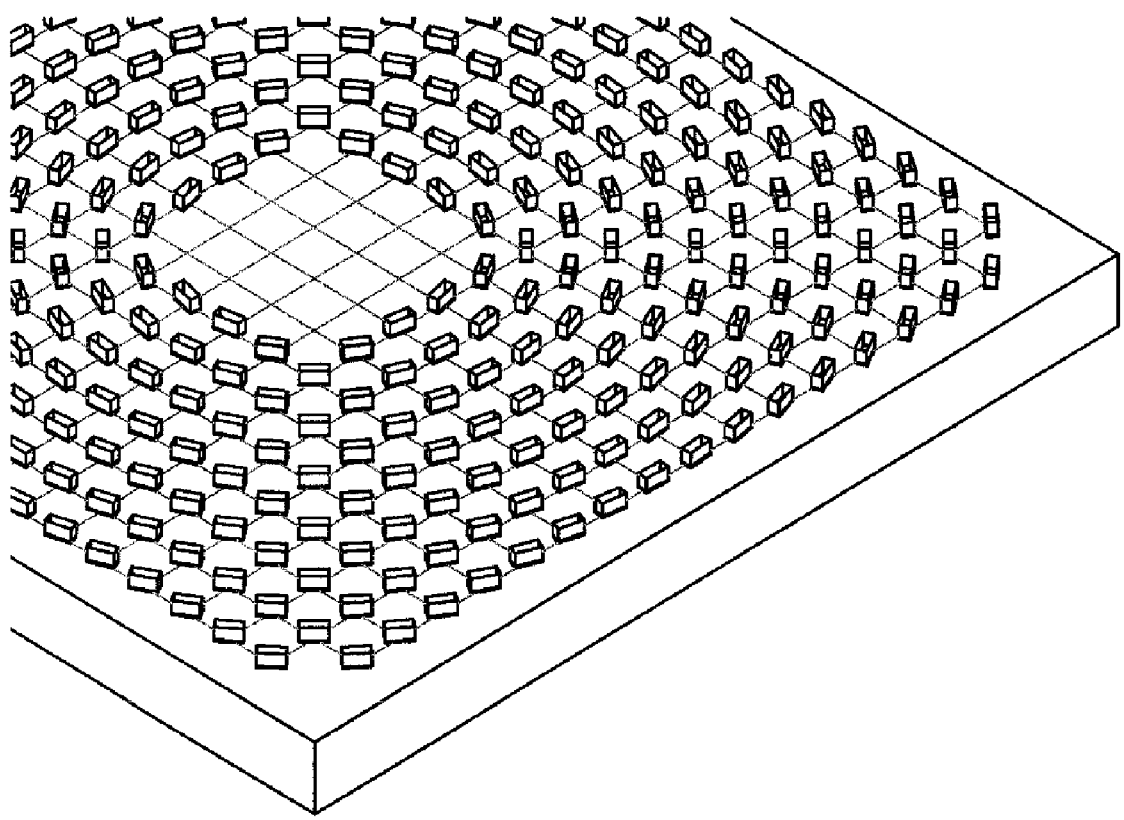

FIGS. 12 and 13 show enlarged views of FIG. 11.

Methods for Providing the Desired Tall Rectangular Columns

There is a number of ways or methods for making these oriented generally rectangular solder columns. Some are well know to the industry and some are new and novel, as per this invention.

There are several ways to manufacture the above embodiments. In many cases, several methods can be applicable to the different embodiments. I will show these methods here below.

Figure 14:
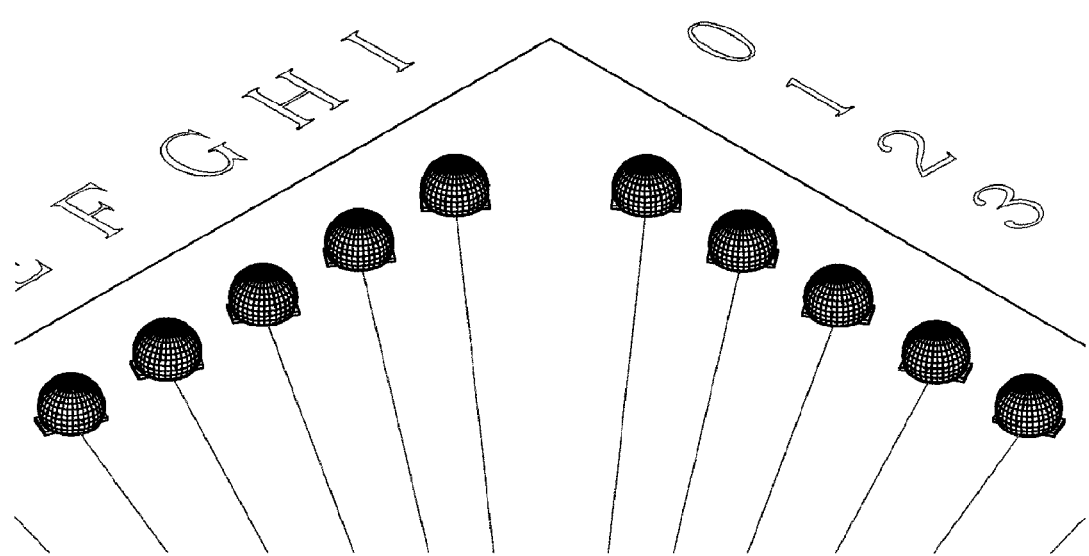
FIGS. 14 through 16 show an LCCC with solder balls applied to its rectangular oriented solder pads.
Figure 15:
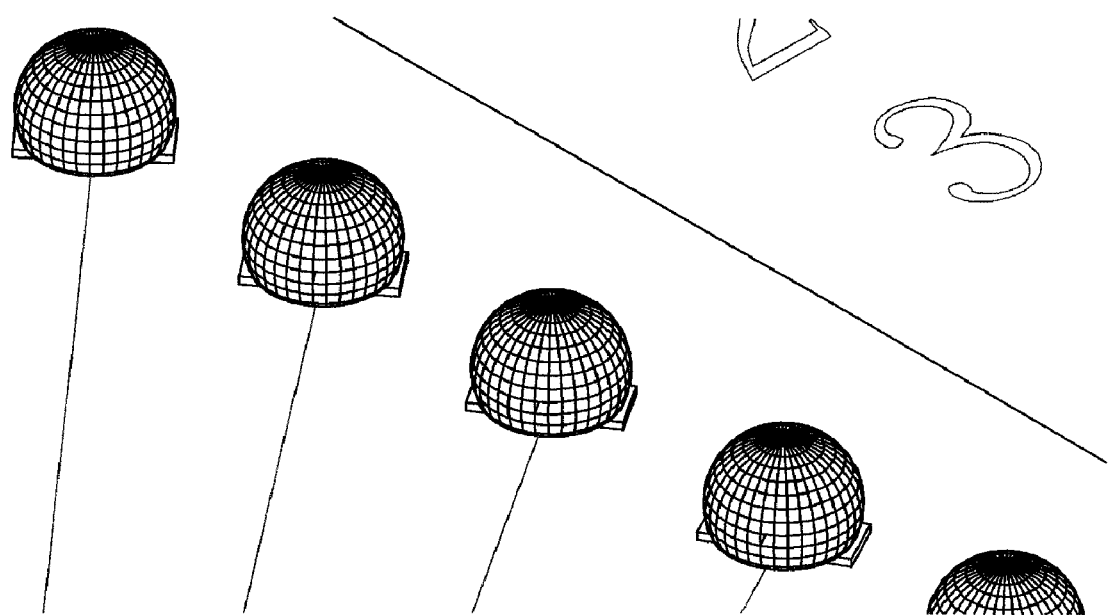
Figure 16:
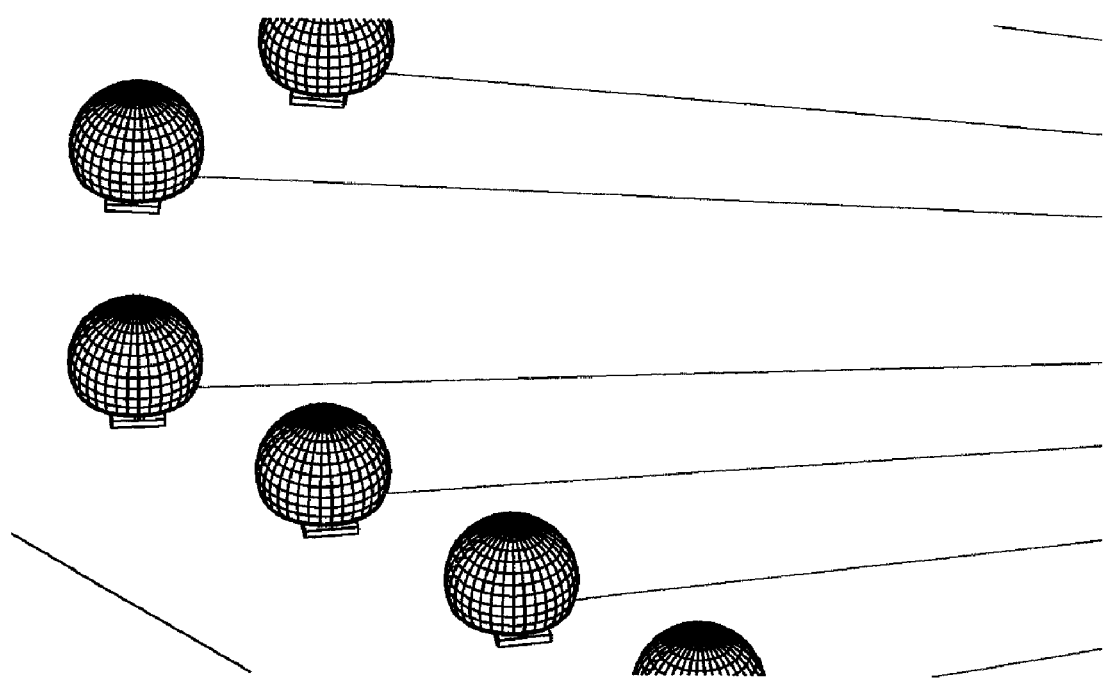

Applying the Solder Balls:

FIG. 14 through 16 show a chip or LCCC like the ones shown in FIGS. 5 and 6, but with a solder ball applied to each one of the contact/solder pads. The figures show the drawings in progressively small and large scale, i.e. as if we are zooming in on the package. FIG. 14 shows the first quadrant, i.e. top, right quadrant of the package. FIG. 15 is zooming in on the top corner of the package, and FIG. 16 on the left corner. You can see that there are rectangular pads under each one of these solder balls.

Figure 17:
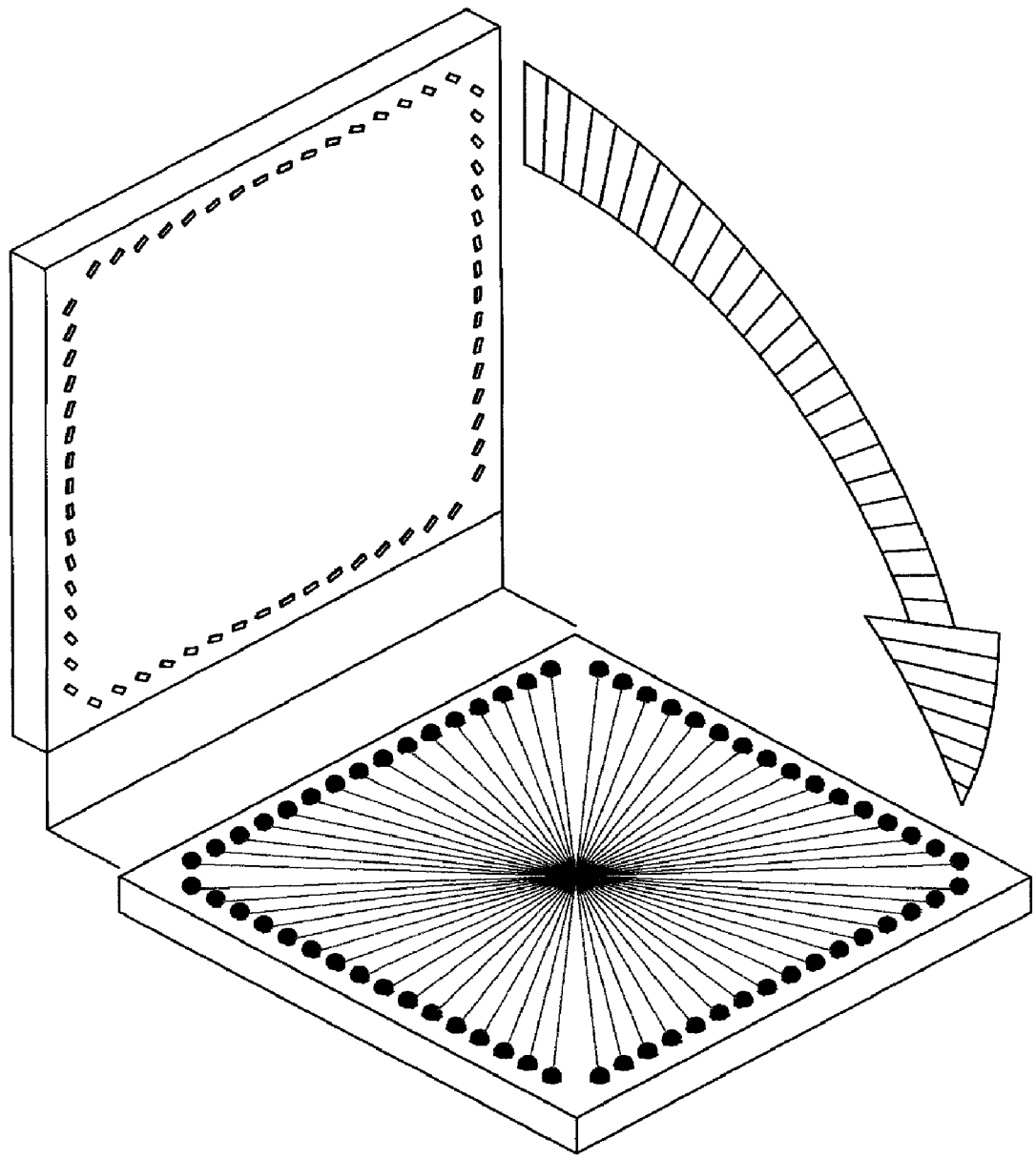
FIGS. 17 through 25 show the process of reflowing the solder balls shown above and viewing how they would change from spherical balls to tall rectangular columns and then to "starved columns". All the while, of course, keeping their orientations as per present invention.

In FIG. 17, we see that we have two components (LCCC's) that we want to join together. The lower one has already the solder balls attached to the oriented rectangular pads. The top LCCC has the solder pads also rectangular in shape and oriented as proposed by this invention, in other words, they match their respective counterparts on the lower device, both in shape and in orientation. The arrow in the figure indicates that we will move the top package on top of the bottom one.

Figure 18:
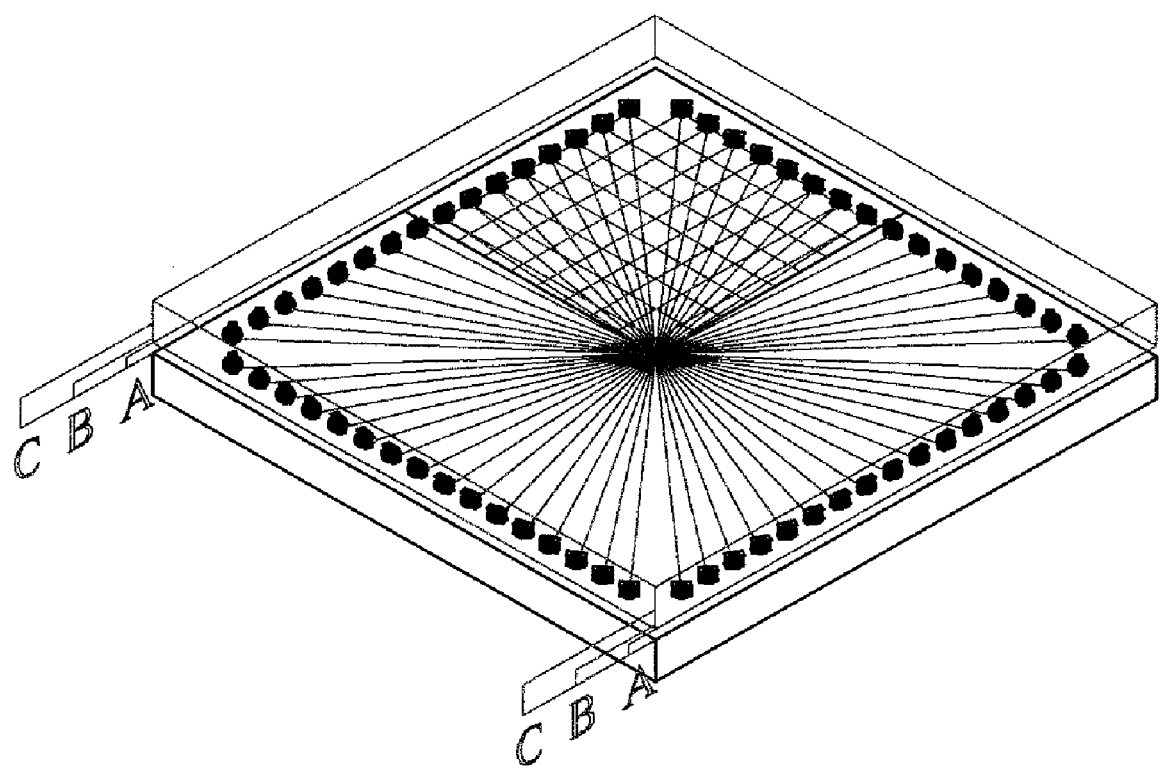

FIG. 18 shows the top package lying on top of the bottom one. The top package is shown as if it "transparent", simply to be able to see through and see what is lying underneath.

We see along one side of the package, a set of dimension lines, marked "A", "B", and "C". These indicate the distance or height or gap between the two devices. The dimension or gap "A" indicates the gap when the top package is sitting on top of the solder balls. When the solder balls are molten, then we would, by some means that will be explained later, pull the top package a little bit away from the bottom package, to increase the gap between them to the gap marked "B". This would change the shape of the solder joint from spherical to rectangular. This will reduce the stresses on the solder joints. If we want to reduce the stresses on the joints even more, we would then pull the packages further apart to make the gap equal to "C" or close to it. Although this would make the total assembly slightly larger/higher/thicker, it would reduce the stresses in the solder joints and improve the life expectancy of the assembly. When we go from gap "B" to gap "C", the solder columns will change in shape from a uniform rectangular column to a "starved" column shape, as we talked about earlier, in the BACKGROUND Section, and as will be shown in the following figures.

Figure 19:
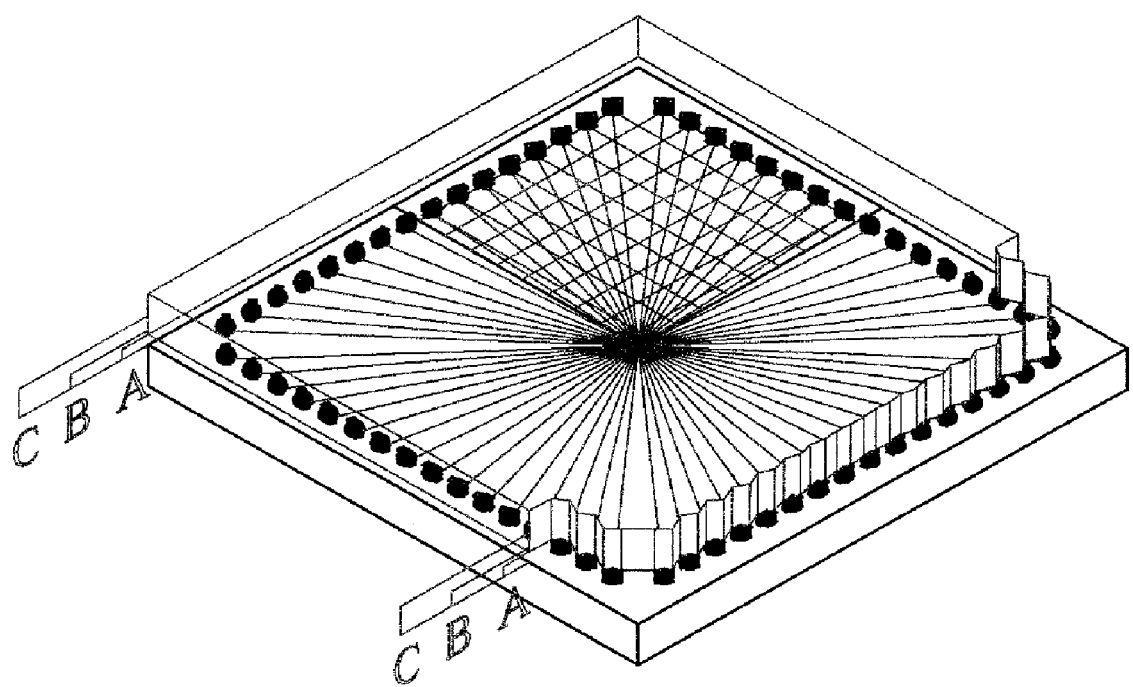
Figure 20:
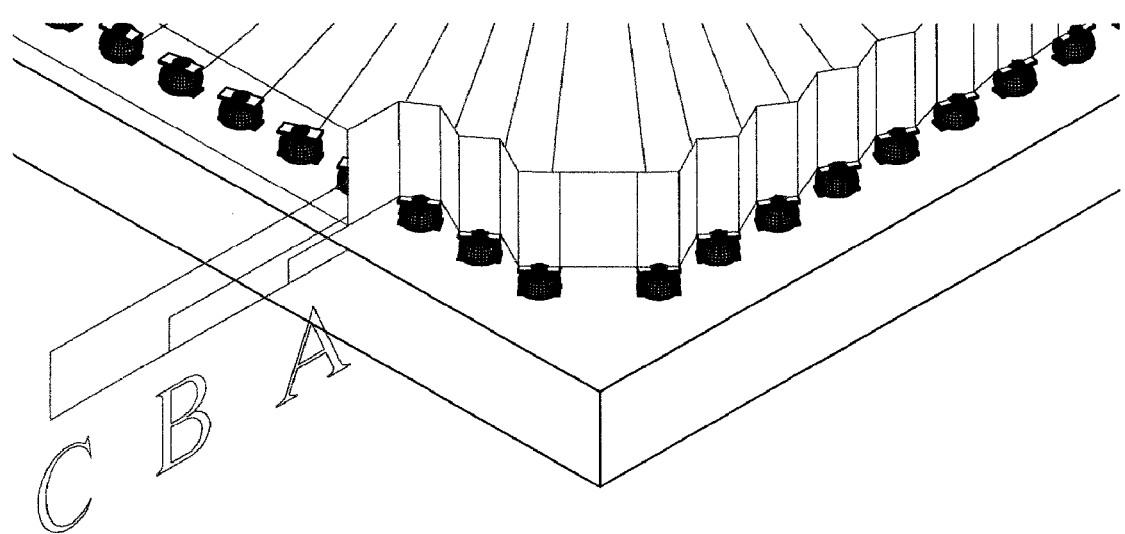

FIGS. 19 and 20 show one side of the top package, as if it is cut off along the edges of its rectangular pads. This is done, so as to be able to see how the top and bottom pads line up together how the solder balls lie in between. FIG. 19 still shows the body of the package in place but show it as if it is transparent. FIG. 20 shows that this part of the body has been removed all the way to the "cut" line. You can see, most clearly in this FIG. 20, that the bottom edge of the cut in the top package is above the bottom package by the distance "A".

Figure 21:
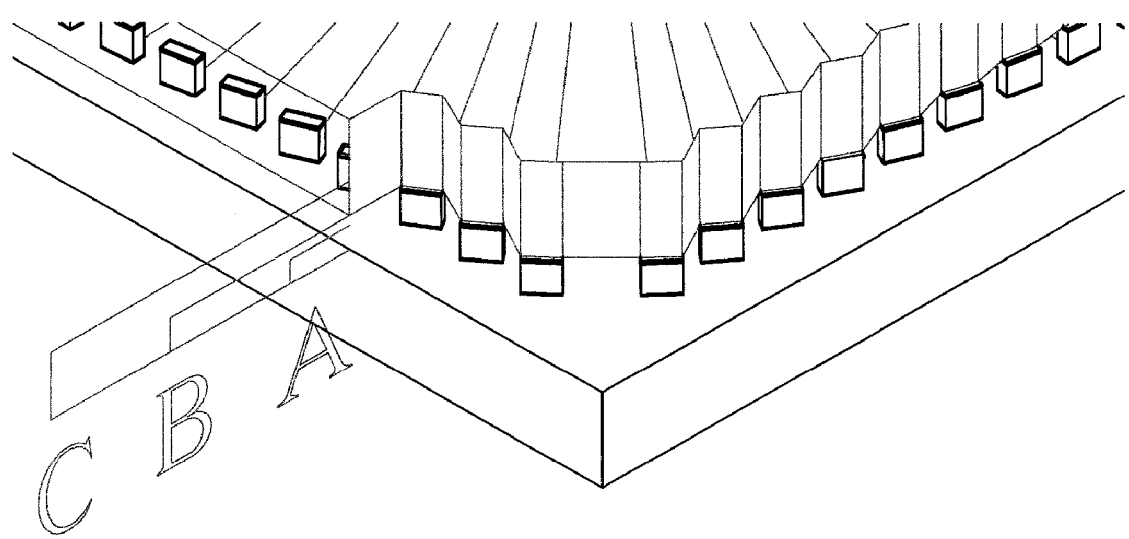

FIG. 21 shows the solder columns when they have been formed to look like "uniform" rectangular columns. Again, it shows the columns sitting on top of the bottom package as if the top package has been removed, but with the top pads of the top package still being shown in place. The figure shows the cut edge removed. Notice that the gap between the two packages has increased from "A" to "B".

Figure 22:
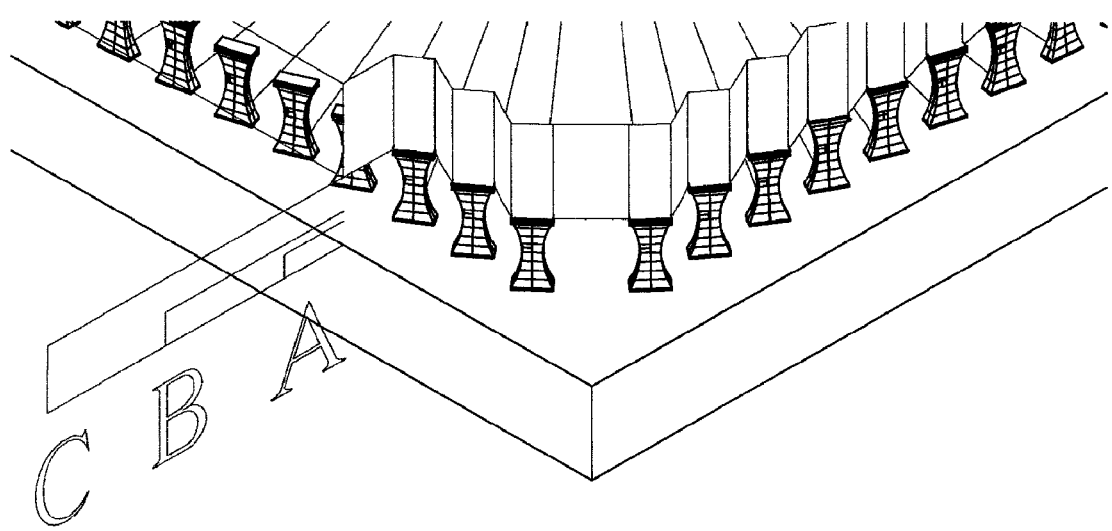

FIG. 22 shows the same assembly after the gap between the two packages has been increased from "B" to "C". The columns have been stretched beyond the "uniform rectangular columns" condition shown in FIG. 21 above, to a point where the column "waist" has thinned down, as shown. I refer to this condition of columns as "STARVED" COLUMNS".

Figure 23:
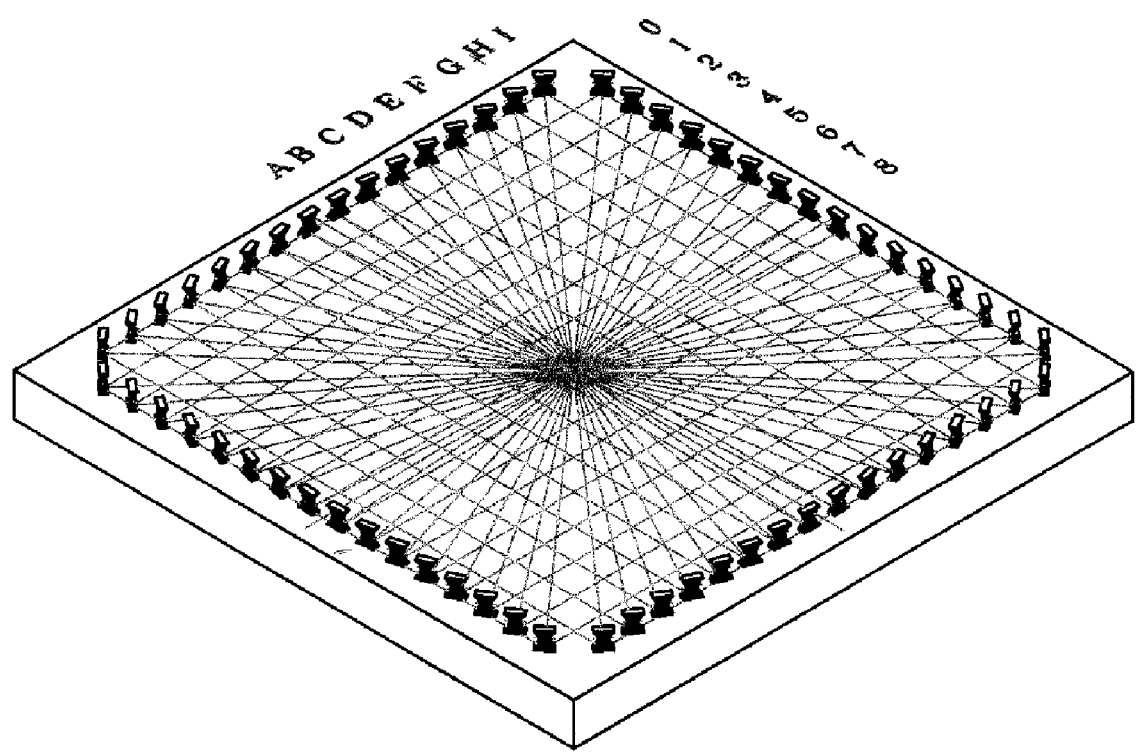
Figure 24:
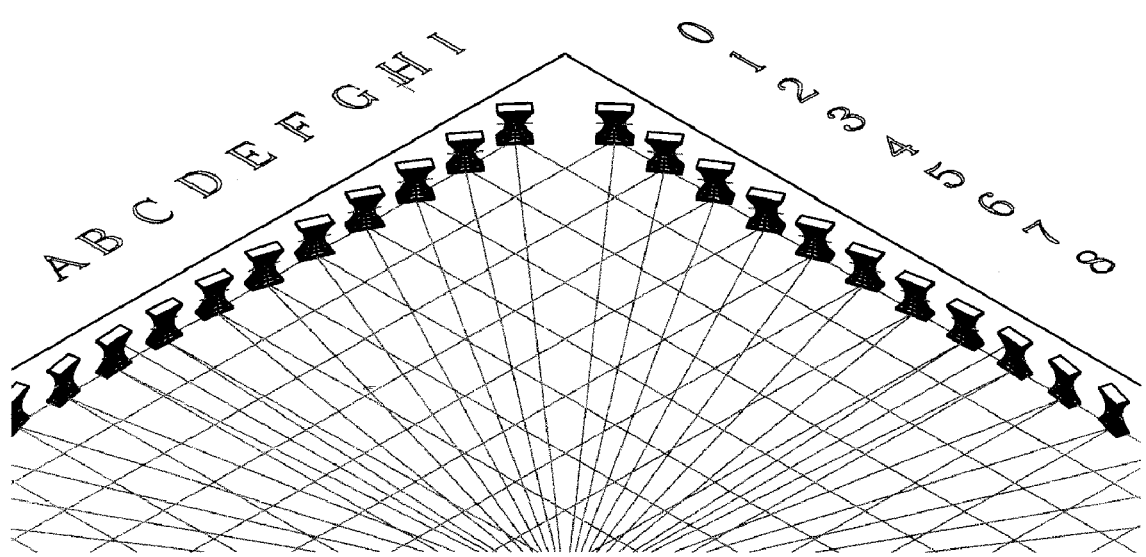
Figure 25:
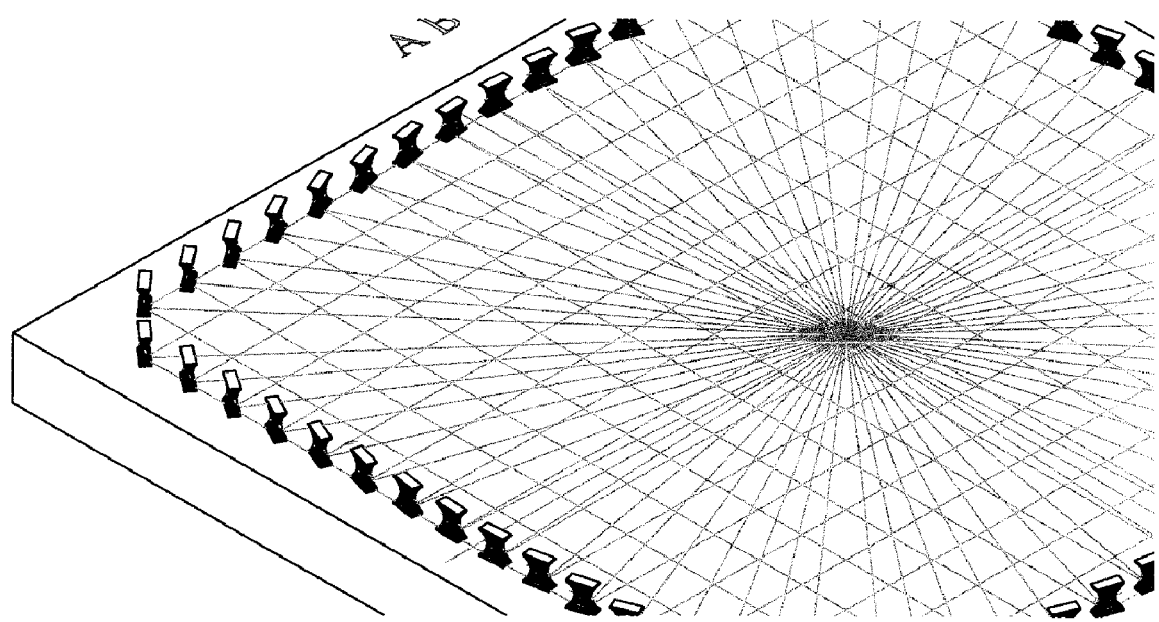

FIGS. 23 through 25 show the same thing, but after removing the top package, just for clarity. They show the starved columns standing on a BGA. They are obviously oriented, as per the present invention. FIG. 24 zooms in on the top corner of the package, while FIG. 25 zooms in on the left corner.

Such starved columns can be produced this way, i.e. directly on a BGA or a chip or any such device, by a progressive process of repeated masking and deposition or screen printing, as will be explained later.

Figure 26:
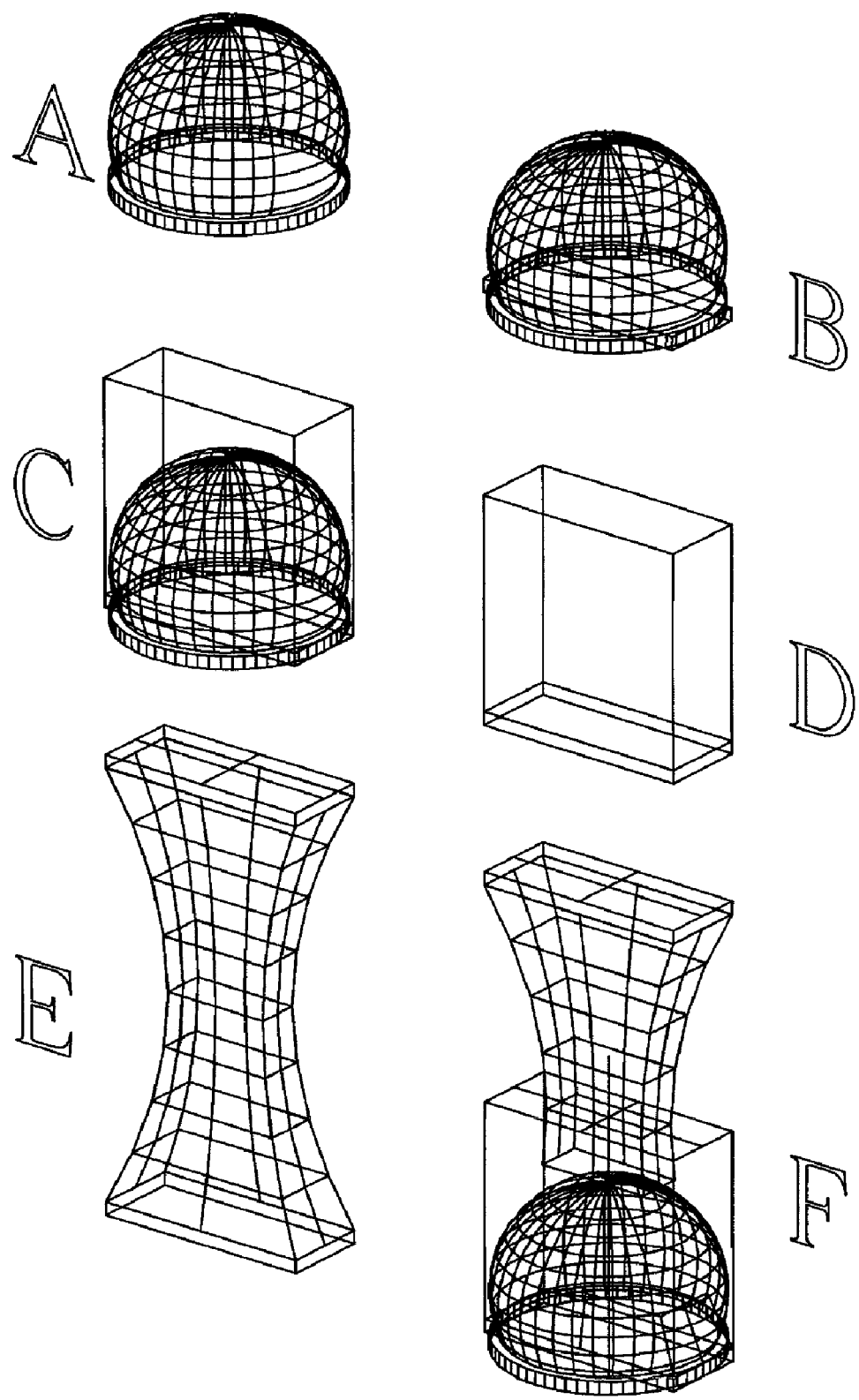
FIGS. 26 and 27 show a strange set of figures. They illustrate the relation between the solder balls, the vertical rectangular columns and the starved columns, and how they sit on top of rectangular solder pads.
Figure 27:
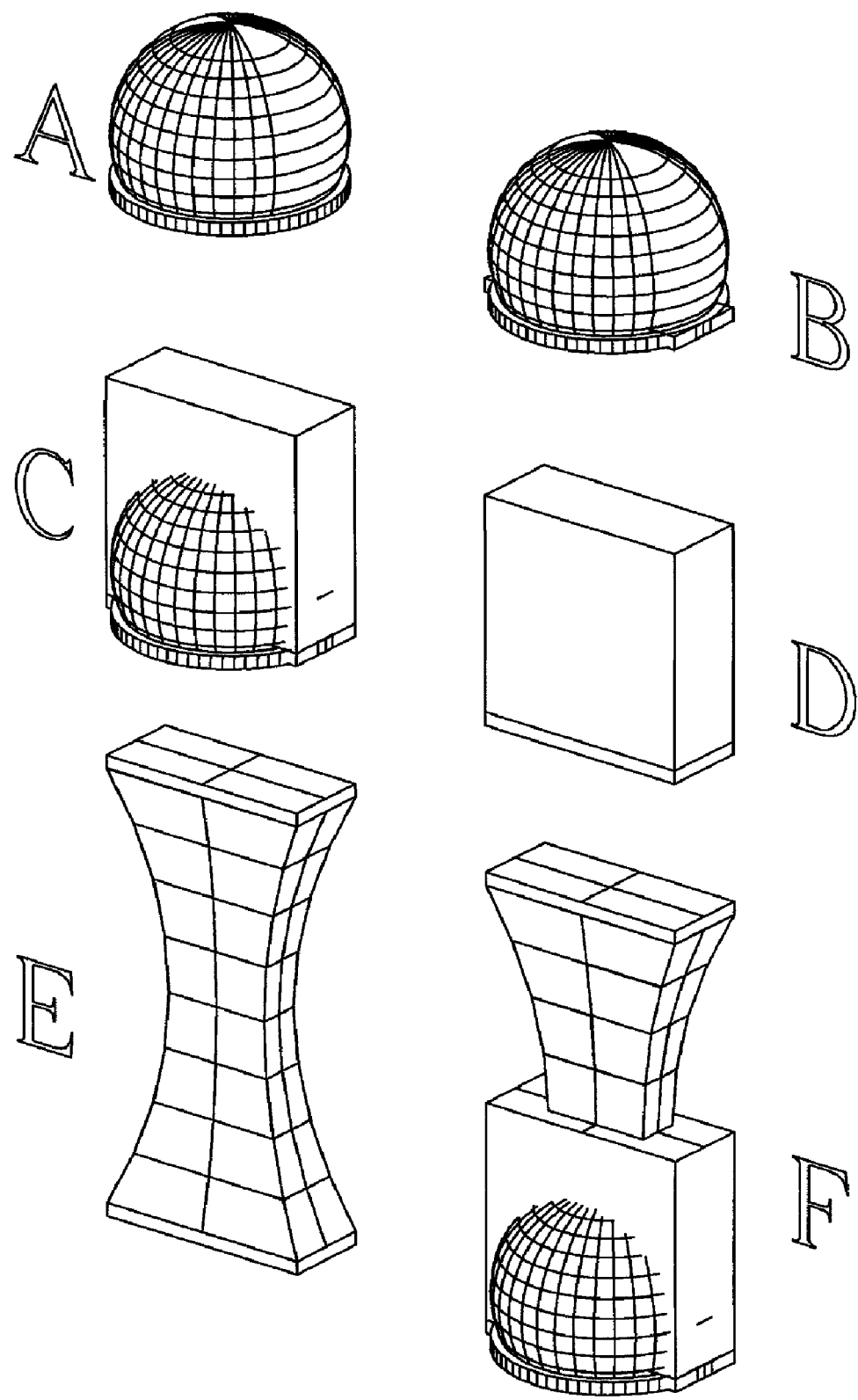

FIGS. 26 and 27 show the progression or rather the evolution of the solder joint.

All the figures in FIG. 26 are shown in the "wire form" format. In other words, the hidden lines have not been removed. FIG. 27 shows the same figures shown in FIG. 26, but with the hidden lines removed.

FIG. 26-A shows the conventional (truncated) solder ball on top of a conventional round pad.

FIG. 26-B shows the same ball, but on top of a rectangular pad, which ideally would also be oriented properly, as per present invention.

FIG. 26-C shows a uniform rectangular column, superimposed on top of the figure shown in FIG. 26-B. The column is supposed to have the same "volume" as the ball. I did calculate the dimension of the column, such that both bodies do have the same volume. See calculations below. It is also assumed that the solder column has exactly straight vertical sides, i.e. that the solder is not bulging out creating a "fat" solder joint, nor is it sucking in creating a "skinny" solder joint. See FIGS. B-1 through B-7, Ref6, pages OC-D-05 through OC-D-11.

FIG. 26-D shows the uniform rectangular column by itself.

FIG. 26-E shows the starved column, superimposed on top of the uniform rectangular column. Again; they both have the same volume.

FIG. 26-F shows the three bodies superimposed one on top of each other, just to emphasize the point, that they all have the same volume, although their shapes are so much different from each other.

Figure 28:
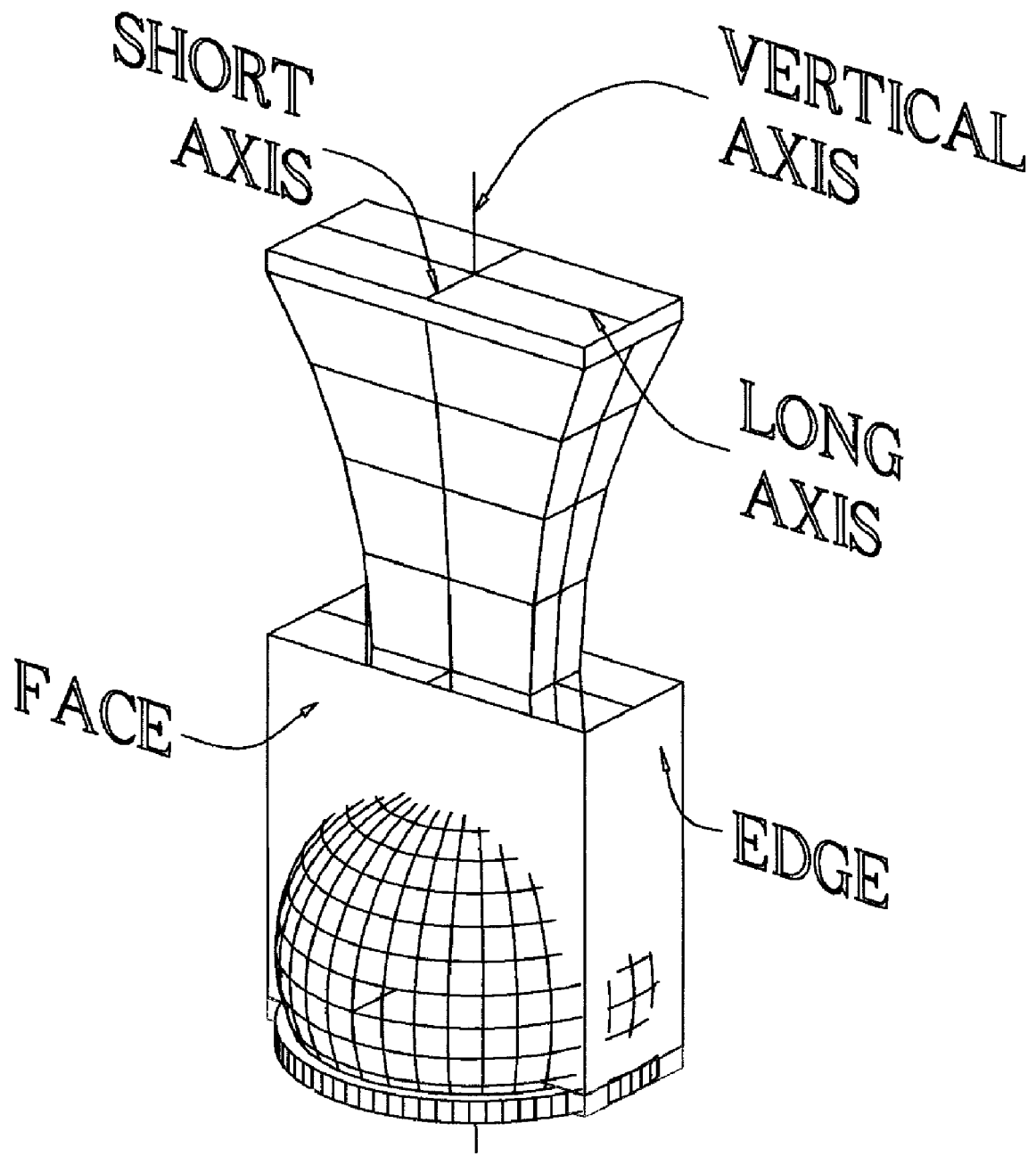
FIG. 28 shows some nomenclature to help visualize the meaning of some terms used in the specifications.

FIG. 28 is the same as FIG. 26-F, except that it shows some nomenclature. This is to support in visualizing some of the terms given in the "DEFINITIONS" section earlier.

Some Alternative Methods to Stretch the Columns.

1—Use Cored Solder Balls, or Conventional Solder Balls with Stand-Offs

Figure 29:
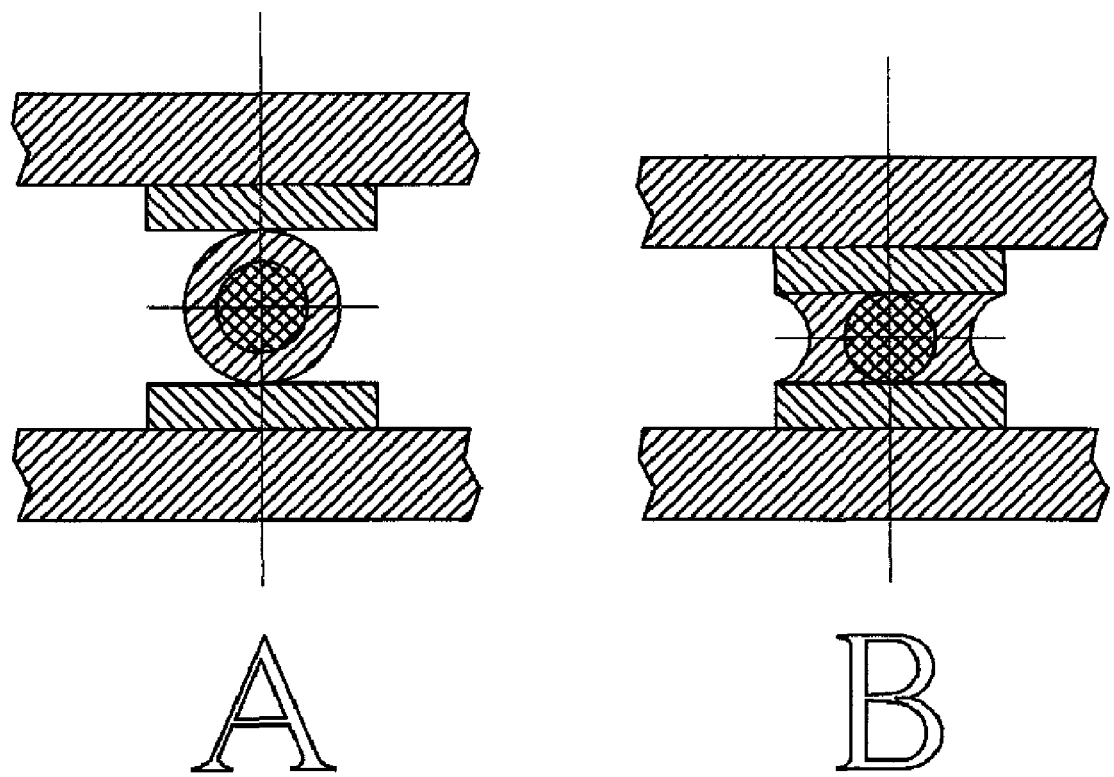
FIG. 29 shows the concept of using solder balls with a special core, which can act as a spacer.

FIG. 29 gives an illustrative summary of the proposed process.

In essence, we start with solder balls that have a core of special material, which is coated with a relatively thin layer of solder. The core can be made of a solder alloy that has a higher melting temperature, or can be made of copper or even a glass sphere, or the like. We'll refer to such solder balls as "cored" solder balls.

We place such cored solder balls on the pads of the package or of the substrate, as in FIG. 29-A. The size of the core and the amount of meltable solder on top of the core, have to be calculated, so as to accomplish the desired end results, as explained below. The size of the core will be such that it will provide the proper height of the resulting end solder joint, and the size of the ball will be chosen, such that the amount of solder will not be enough to create a fat solder joint. It would rather give us the desired starved joint.

The end result is that when we place the mating package on top of another package or substrate, as in FIG. 29-A, and reflow, then the solder would melt and will start to wet both the top and bottom pads. The non-meltable core would either float in the middle of the joint, or fall to the bottom, or even may rise to the top, depending on its specific gravity and that of the molten solder.

The solder will wet the pads. But the amount of solder would have been chosen, such that there will not be enough solder to create a fat solder joint, even with the presence of the core. It will wet the two pads and spread as much as possible over the whole surface of each pad, but eventually, the top package would drop and fall towards the bottom package, and finally would come to rest on top of the cores, as in FIG. 29-B. The cores will act as "stops" or "stand-offs", and will control the spacing or gap between the two devices.

The end effect will be that we will have solder joints that have large pads, or "feet", but with a narrower waist.

This will work with rectangular pads, as well as with round or square pads, too.

FIG. 29-C shows a similar arrangement, but with an external stand-off, separate from the solder cores. In this case, the external stand-offs, will control the spacing, instead of the cores, assuming that the external stand-offs are larger/taller than the cores. Also, in this case, we could just as well start with conventional solder balls, i.e. without any special core as described above, and rely on the stand-offs to control the height of the end resulting columns.

In either case, the stand-offs will have to have a total height that is slightly smaller than the diameter of the balls, or the total height of the balls in case the balls are truncated. The reason is that the balls need to touch the pads and wet them before the stand-offs take over.

3—Use Controlled Volume Preform and Individual/Separate Stand-Offs

FIG. 30 illustrates this method.

FIGS. 30-A and 30-B show an overview of the idea. We start with a preform, as shown, which has the proper predetermined volume "VP", which would be needed for the final end result, which is to obtain the Starved Columns that we want to end up with. The preform is taller than the final starved column, but it is skinnier. The preform can be a uniform cylinder, as shown in FIG. 30-A, or it can have a conical shape, as in FIG. 30-B.

Note: The conical shape preform in FIG. 30-B looks like a prior art design covered by a patent issued to IBM or AT&T??, but I don't remember the patent number. I think it was called "solder cones". The cones were cast on the package.

Some "stand-offs" or "stops" would be placed between the two devices, to control the distance between them during the reflow process. The height of the stand-off would be smaller (shorter) than the height of the preforms.

A) Reflow without Stand-Offs. (See Top Figures of FIG. 30)

Let's first see what would happen, if we reflow the solder preform, without having the stand-offs.

Let's say we have the preform attached to the top device pads, and let's say that it is a BGA package. Sometimes, such a package with columns sticking out from its bottom is referred to as a "dead roach" or simply a "roach". It will also look very much like a Pin Grid Array Package (PGAP), except that the legs will be made out of those solder preforms.

Let's also say that the bottom device is another package or a substrate or rather, a PCB.

We place the roached BGA on the PCB, as in FIG. 30-A or -B. I am showing only one preform and one stand-off here, just for clarity.

At this point in time, i.e. before the reflow process, the distance between the BGA and the PCB pads will be practically equal to the height of the preforms, plus whatever non-planarity that may beat the tips of the preforms. The pads themselves have their own thickness, which will add to the total gap between the bodies of the BGA and the PCB.

When we start the reflow process, the solder preforms will soften and start to melt. The bottom tips of the tallest preforms would be sitting on top of the PCB pads. If some preforms are slightly shorter, due to manufacturing tolerances, they will not be touching their respective PCB pads. In order to enhance the wetting, we can apply some flux on the PCB pads, or even some solder paste. This would help in connecting the preform to the pads and to transfer heat, and in keeping the surfaces of the pads clean, etc.

Once the taller preforms start to melt and the top BGA starts to move downwards, due to its own weight or due to some external forces, then these shorter preforms will reach their respective PCB pads and touch and wet.

I figured that one good way to explain the concept is to use some concrete dimensions, as in the example shown in FIG. 30. I will use these abbreviations for the various dimensions, which I have selected for this example:

DC is the diameter of a Circular pad, which we will assume to be 0.025 inch. See FIG. 30-C.

AC is the Area of the Circular pad. The area AC will be equal to $(\Pi/4 \times D^2)=4.91E-04$ inch square.

LR is the Length of a Rectangular pad, which we will assume to have a length of 0.025 inch. See FIG. 30-D.

WR is the Width of the Rectangular pad, which we will assume to have a length of 0.010 inch.

AR is the Area of the Rectangular pad, which we will assume to have a length of LR and a width of WR. AR will be equal to $(LR \times WR)=2.50E-04$ inch square.

DP is the diameter of the Preform, which we will assume to be 0.010 inch. See FIG. 30-A & C.

AP is the cross-section Area of the Preform. The area AP will be equal to $(\Pi/4 \times DP^2)=7.85E-05$ inch square.

HS is the Height of the "Starved" solder joint, which we will obtain on top of the Rectangular pads, as per this invention. The rectangular pad in this case will be similar to the above one, i.e. with a length LR and a width WR. For this example, I have decided to make this Height=0.025 inch. See FIG. 30-G.

VS is the volume of the Starved solder joint. This volume can be calculated in different ways. I have sliced it into several thin trapezoidal shapes, calculated the volume of each and added them together to get an approximate volume of the total starved column. For the starved column that I am using here, the volume VS is xxx, for a column height HS of 0.025 inch, on a Rectangular pad of length LS of 0.025 inch and a width WS of 0.010 inch. This is assuming a certain curvature for the sides of the column, which is as shown in all my figures. With all these assumptions, the volume VS turns out to be=2.96E-06 inch cube.

We will calculate the following dimensions now here below.

VP is the volume of the Preform and it is equal to (AP×HP).

VC is the volume of the Circular solder joint and it is equal to (AC×HC).

VR is the volume of the Rectangular solder joint and it is equal to (AR×HR).

HC is the Height of the "uniform" solder joint, which we will obtain on top of the Circular pads.

HR is the Height of the "uniform" solder joint, which we will obtain on top of the Rectangular pads.

HP is the Height of the Preform.

Since we can easily assume that the volume of solder, not solder paste, will not change, and since we have decided and determined that the volume of the end resulting Starved columns VS is =2.96E-06 inch cube, then all the other volumes, i.e. VP, VC and VR, will also equal that same volume. We will use this knowledge/assumption/fact to determine the three remaining unknown values, i.e. HC, HR and HP. For these calculations here, we will assume that there are no solder fillets to affect our calculations.

We will now proceed with the case, where there are no stand-offs in this case.

In FIG. 30-C, we will also assume that the pads are Circular, and have a diameter DC of 0.025 inch, hence a surface area of 4.91E-04 inch square.

When the preforms will melt, each preform will try to wet all the surface of its respective pads and still tries to stay as one single "lump" of solder. The top BGA will drop and will create solder joints, connecting each BGA pad to its corresponding PCB pad. These solder joints would have a similar shape as the pads, but they would have a much shorter height (HC), than the preform's original height (HP).

It is easy to calculate the joint height HC in this case, using simple mathematics.

The volume of the solder in the solder joint VC is=2.96E-06 inch cube, as discussed above. The area of its circular pad AC is=4.91E-04 inch square. Hence, the height HC of this solder joint is=VC/AC=0.0060 inch.

Note that we are assuming that the circular solder joint will have straight vertical wall, i.e. the joint is not fat or skinny, and that there will be no fillets effect.

This means that, for the same amount of solder that we need to create the 0.025 inch tall Starved column on a Rectangular pad that is 0.025 long by 0.010 wide, we would get a solder joint height of only 0.006 inch, if we had used a circular pad of 0.025 inch diameter.

In FIG. 30-D, we will again assume that the pads are Rectangular, and have a length LR of 0.025 inch and a width WR of 0.010 inch.

When the preforms will melt, again each preform will try to wet all the surface of its respective pads and still tries to stay as one single "lump" of solder. The top BGA will drop and will create solder joints, connecting each BGA pad to its corresponding PCB pad. These solder joints would have a similar shape as the pads, but their height HR will be different.

Again, it is easy to calculate the joint height HR in this case, using similar mathematics, as above.

The volume of the solder joint VR is still=2.96E-06 inch cube, as discussed above. The area of its Rectangular pad AR is=2.50E-04 inch square. Hence, the height HR of this solder joint is=VR/AR=0.0118 inch.

Note that we are again assuming that the Rectangular solder joint will have straight vertical wall, i.e. the joint is not fat or skinny, and again there is no fillets effect.

B) Reflow with Stand-Offs. (See Bottom Figures in FIG. 30)

Now, we will compare the above case with a case where we do use "stand-offs" or "stops".

We will arrange to have the height of the stand-offs to be equal to the height of the Starved columns, plus the thickness of the solder pads on the BGA and the PCB. This is because the stand-off will not be placed between the pads themselves, but between the body of the BGA and the general surface of the PCB. If we assume that both groups of pads are 0.005 inch thick, then the height of the stand-offs should be HS+0.005+0.005=0.035 inch.

We have also decided to make the Preform with a diameter DP of 0.010 inch, hence its cross-section area AP is=7.85E-05 inch square.

And since we know that the volume VP of the Preform is equal to the volume VS of the Starved column, which is=2.96E-06 inch cube, we can now calculate the height HP of the Preform. HP will be=VP/AP=0.377 inch.

This is the height of the Preform between the pads.

This means that the distance between the body of the BGA and the general body of the PCB would be=0.0377+0.005+0.005=0.0477 inch. This gives us the height of the Stand-Off, which then should be=0.0477 inch.

According to all the above calculations, we can see that, during the reflow process, the Preforms will collapse through a distance=0.0377−0.0250=0.0127 inch.

Other Preform Shapes

A similar situation would occur if the preforms were made of different shapes, but still with the same volume. For example, the preforms can have a conical shape as in FIG. 30-B or E. As long as the volume is still equal to VP, i.e. the volume of the cylindrical preform described above, and all other parameters stay the same, then we should end up with the same height for the solder joints. Conical preforms can be cast directly on the BGA, more easily than if we would want to attach cylindrical preforms to the same package.

3—Use Solder Paste and Stand-Offs

A variation to the above method is to start with solder paste, that we would apply to one device, or to both. Ideally, the paste would be shaped as a "cone", so that the volume/amount of solder would be limited. We would have "stops" or "stand-offs", as in FIG. 28-C. This leads us in a way into the next alternative. See Alternative 3, for the reason of having cones, i.e. tall shapes but with limited volume.

SPECIAL EMBODIMENTS

The above examples, using the preforms and the standoffs on circular pads, or even on square pads, i.e. on standard conventional packages and pads, can also be used in the industry, simply to provide the assemblies with "flex-joints", and thus enhance their reliability and extend their operating life, compared with the normal cases of having short stubby solder joints.

We could extend this same thinking and apply it to other shapes of pads. For example the pads could be rectangular, or elliptical or oblong or elongated in any desirable fashion.

Then, the pads could also be "oriented" as per the present invention, to take advantage of the additional expected benefits.

4—Shape Memory Method

We can also use shape memory materials, e.g. shape memory plastic like the one used by Raychem Corporation, now TYCO, to make their heat shrink tubing. We could also use shape memory metals, again used by Raychem. These metals include Tinel, which is a trade name for an alloy of Titanium Nickel, or Betalloy, which is a trade name for a shape memory Copper Alloy. Betalloy is also used to make eyeglasses frames, which can be deformed at will and when they get placed under a hot water faucet and the hot water hits them, they jump back to their original shape.

We can use such shape memory materials, plastics or metals, to create the "lifting" devices/means, to increase the distance between the mating pads and to stretch the solder joints/columns.

Figure 32:
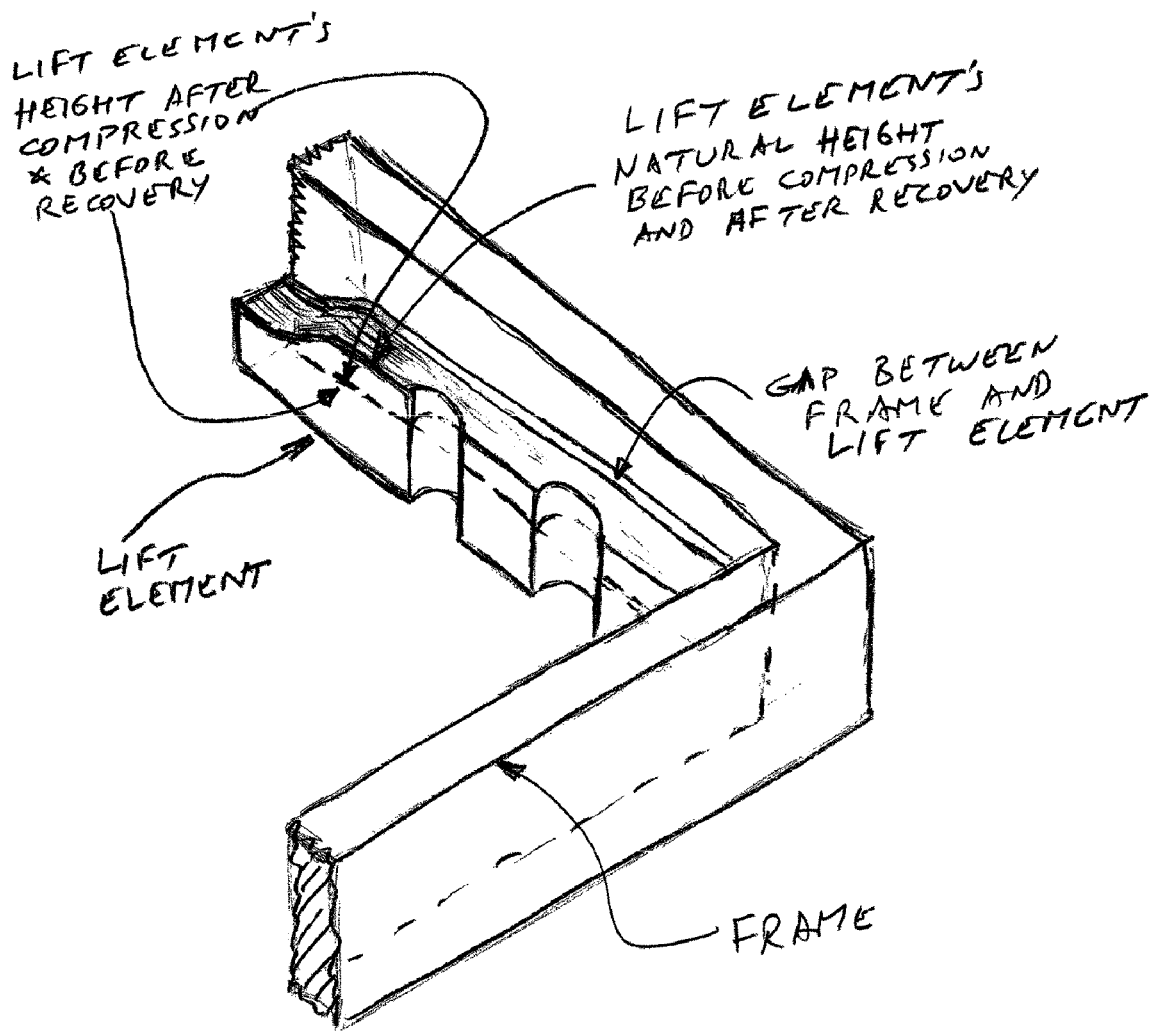
Figure 33:
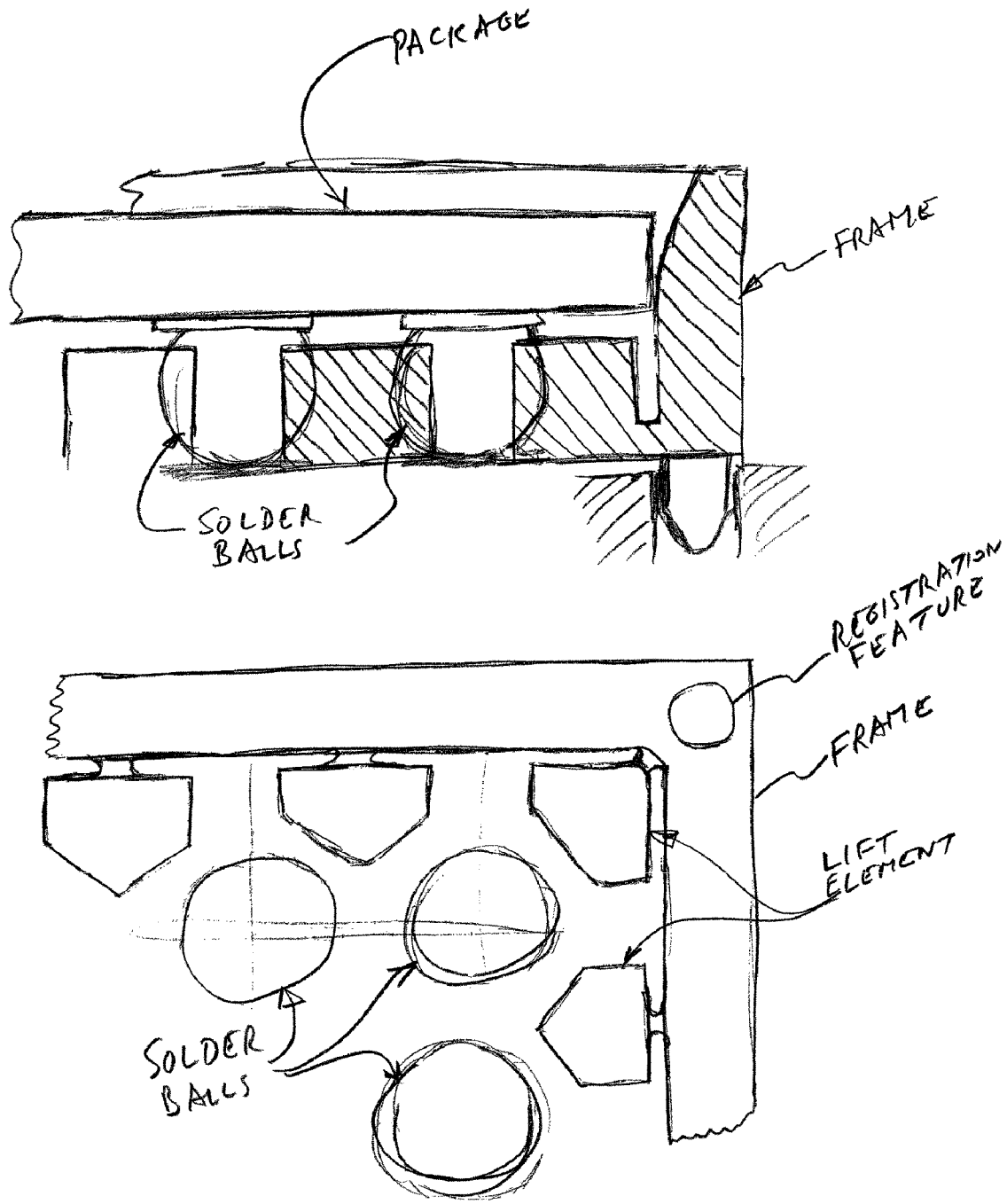

So, FIGS. 31 through 33 give examples of such a lifting device. They show a frame of some sort, which would have the desired "lifting" features. These could have a sort of a "lip" that would lodge between the package and the substrate. The lip would have been made originally with a certain thickness/height. Then it would be cross-linked to keep its original manufactured shape in memory. Then it would be compressed cold, to make it thinner at room temperature. Then it would be place between the substrate and the package. When the stack gets in the oven to reflow the solder, the solder would melt and attach to both the substrate and the package, and then at the right time and/or temperature, the lip would activate and remember its original shape and thickness, so it would lift the package increasing the gap between the package and the substrate, thus stretching the solder columns to their desired shape.

5—Selective Heating Method

We could also activate the memory of the lifting elements by other means. For example, using selective frequency lasers. We could use a laser with the proper frequency to melt and reflow the solder while the lifting elements are still dormant. When we know that the solder has molten and is attached to both the package and the substrate, then we activate the laser with a different frequency which would then wake up the memory of the lift elements so that they would lift the package and increase the gap and thus stretch the columns to the desired height and shape.

The frame with the lift elements can be made to be removed after the soldering operation is completed. It could be made with some breakaway tabs to facilitate its removal. It could also be made out a material that could be dissolved and removed this way, e.g. like the carrying wafer that was used with the CCMD. See Ref14, U.S. Pat. No. 4,655,382, invented by Geoffrey B. Wong, et al., and who were members of the effort on that project. In this case, we could have the lifting elements inserted in a similar dissolvable carrying wafer.

The lift elements could be made out of Betalloy or Tinel as mentioned above, and could be incorporated in the frame or in any other contraption that is suitable.

The lifting could be done also by other means, such as fixturing of any suitable shape or form, as desired by the particular user or manufacturer.

6—Lifting Element with Large TCE

Instead of using devices made of shape memory material to lift the top package, say the BGA, and to increase the gap between it and the lower PCB, we can use a lifting elements made out of a material that has a relatively large TCE. We could for example use a foam material, possibly closed cell foam, which would expand at a considerably larger rate than the other components in the assembly. We would place such a lifting means, let's just call it the foam, between the BGA and the PCB, where the foam would be much thinner than the height "H2". During the reflow, the foam would expand but would still be smaller than the height "H2", up to a certain point or rather up to a certain temperature. When the temperature reaches the liquidus temperature of the solder and the solder would melt totally, then the thickness of the foam will be just about equal to the height "H2", just a little thinner. So, up to this temperature, the foam has not done any lifting. Then when the temp exceed the melting temp of the solder, and is in the reflow holding zone, the foam will expand to a larger size and will lift the BGA and increase the gap to H2 and then to goes beyond to H3, as required.

Other Embodiments of Oriented and Starved Solder Columns

A. Tall Preforms "Fall" on the Stops and Package Rests on the "Stops" (Devices and Methods):

Fill the solder with copper particle, so that we can shape it into the required preform shapes, like the "LONG CONES", or the "½ TAPERED AND REST CYLINDRICAL COMPOSITE CONES", etc.

Preforms will be TALL AND SLENDER, Taller than the end-height of the finished column. The volume of the preform will be the same as the volume of the finished column. But since the finished column will be large at the base of the BGA and of the PCB, and May West at the center, then for the same volume, the height will be shorter.

During reflow of the tall slender preforms, the BGA will "fall" or "drop" down, until its stops at the correct height, sitting on the "stops", which will control the ultimate height of the solder columns.

B. Regular Solder Balls, "Lifted" by "Magic" (Devices and Methods):

The solder balls are of regular, spherical shapes, or truncated spherical shapes.

The BGA is placed on the PCB and the solder is reflowed the normal way.

The BGA is lifted while the solder is molten, so that the solder joint gets stretched.

The molten solder will stay sticking to the solder pads on the PCB as well as on the BGA and will have a cross section that will match pretty closely the shape of the respective contact pads at each end of the solder joint.

The center portion, between the two pads, will get thinner and will form an hour glass shape, or a "May West" waist shape.

By controlling the volume of the original solder ball and the areas of the contact pads of the PCB and of the BGA, and also the ultimate height of the "stretched" solder column, we can calculate pretty close enough, the new height of the solder joint. We will call this "stretched or starved" solder column.

C. The "Magic" that Will "Lift" the BGA

We can have an element placed between the BGA and the PCB, which would expand in its height so that the BGA gets lifter, AFTER THE SOLDER HAS MOLTEN AND HAS ATTACHED ITSELF TO THE CONTACT PADS OF BOTH THE BGA AND THE PCB.

The element can be made of expandable plastic, either using SHAPE MEMORY Features or using a foam plastic with certain "air" or other material.

The solder used for these assemblies could also be "filled solder", e.g. solder mixed with particles of copper or the like, to make it stick together and hold its shape better and longer than regular (unfilled) solder. Such filled solder is already in the prior art, and I have known it and encountered it since 1980 when I was working on my CCMD. However, I could not find it, when I did a patent search recently.

We could also use "conductive adhesives" to create and/or to attach these oriented rectangular columns or starved columns, with or without solder, or with or without filled solder.

We could also start with the same preform material (column wire stock) that I had used for the CCMD, flatten it and insert it into carrier wafer, which have "oriented" holes and where the flattened columns will be properly oriented, and then use that to mount packages on substrates.

Figure 34:
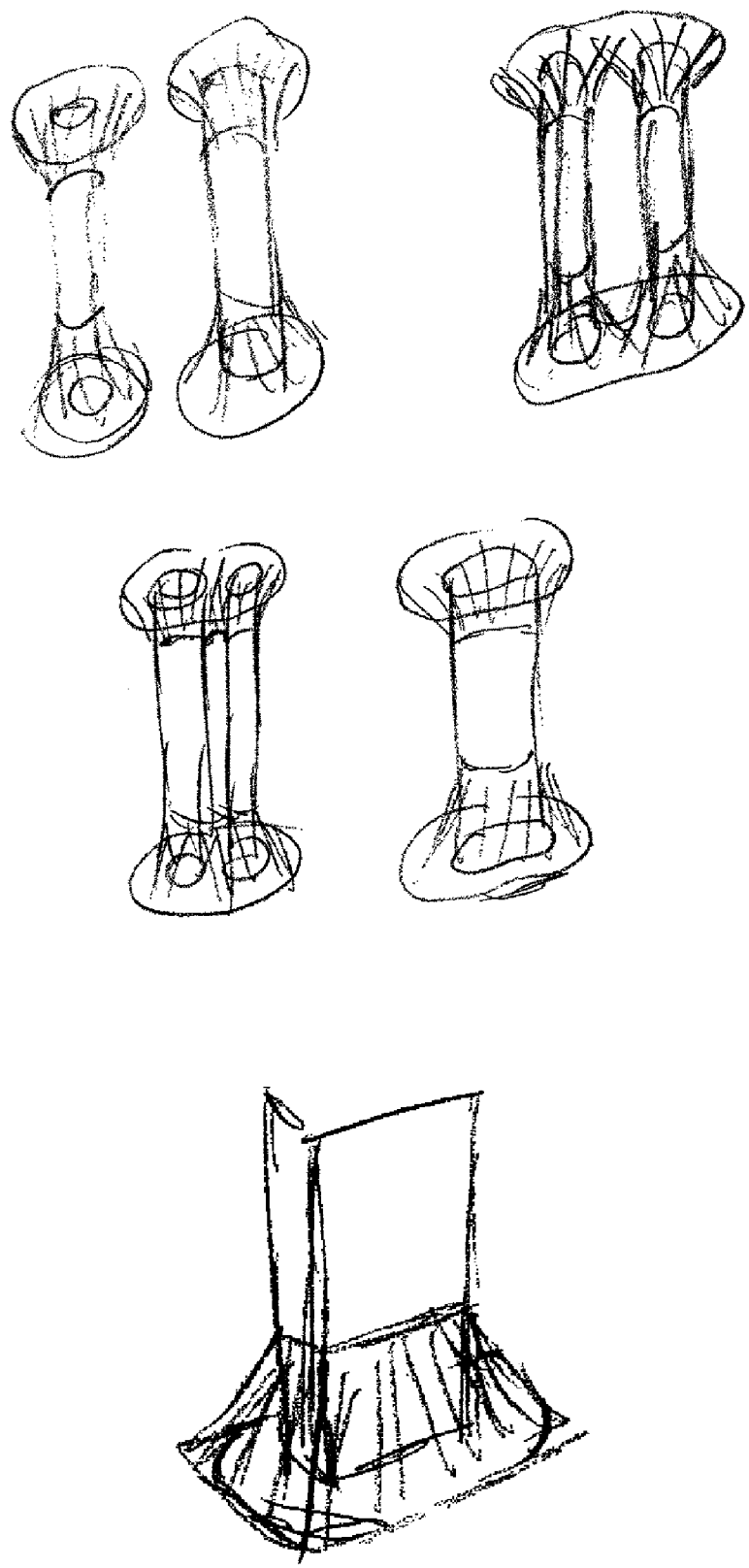
FIG. 34 shows the concept of using two wires to simulate the effect of a tall wide column with a rectangular cross section.

FIG. 34 shows some other embodiments that could be used to accomplish the same end goals. For example, a) We could use two wire-bonded wires, side by side to simulate the effect of the rectangular columns. B) We could use the wires and mount them in place using conductive adhesive, if we do not want to use the wire bonding technique.

The left bottom figure/sketch in FIG. 35 shows one way to "grow" a uniform rectangular solder column, using for example the masking and deposition techniques used for the manufacturing of chips or multilayer boards, or simply using solder masks and the like.

We can also envision, that by using multiple, repeated steps of masking and deposition, we can shape the solder columns to have, already from the start, the desired end-shape of the hour-glass or the Mae West form, or a shape approximately close enough to it. This can easily be accomplished, say, by starting a first masking and deposition step, where the lower one third of the column would be large, then we would repeat the masking and deposition step, but with a narrower cross-section for the solder column, and then finally the third masking and deposition step would have again a large cross-section for the solder column. This would produce a solder column that has three sizes of cross-sections, step-wise, or step-shape profile. During the reflow, the shape will change from a step-shape profile, to a rather smooth-curve profile, due to the high surface tension of the solder. More than three steps could be used if necessary.

The right bottom figure shows a cross section of the figure on the left, but shows also the package sitting on top of the "grown solder column" and also we could add some solder cream that could screen printed, so as to facilitate the wetting of the solder column to the pads on the substrate and/or package.

Oriented Sockets & Universal Sockets

Once these packages and substrates with oriented pads become popular and used on the market, then we will need sockets that can handle such packages and can sit and be mounted on such substrates. It is easy to make such sockets and connectors. Simply install the contact springs in a way that would match the orientation of the pads, "et voila!". Such sockets and connectors are part of this invention as well and I would like to claim them as well.

Other Quick Thoughts:

Based on the above, I am proposing to create solder columns that have a cross-section that is more elongated than circular, and where the columns are oriented such that their wider surface would be facing the thermal center of the package or of the anticipated assembly.

Another basis for this invention is the fact that a solder joint in general usually follow the shape of the solder pads it is attached to.

For that reason, I propose to shape the solder pads so as to be conducive to creating such solder joints.

So, the solder pads should be shaped to fit/suit the desired ultimate shape of the column.

For example, if the column is desired to have a roughly rectangular cross-section, then the solder pad should also have roughly a rectangular shape.

The effect of the shape of the solder pad on the shape of the column cross-section does fade away as we move away farther from the pad along the solder column length/height.

For example, if we start with square solder pads on both the package and the substrate, which will be joined together by a solder joint, then the following would be expected.

If the space between the two pads is very narrow (short height, or short gap or space between the pads), then the solder joint will have practically the same shape as the two solder pads, i.e. square, assuming the proper volume of solder is used.

If the solder volume is too large for the space available, then the solder would bulge out and may even overflow. If allowed to float, then the joint may become higher/taller as well.

If the volume is too small, and if the height/space is allowed to float, then the thickness/height of the joint would be smaller.

If the proper volume is provided, and if the two pads were pulled apart a certain distance, then we would be forming a "column". The shape of the column would depend on the ratio of H/S, where H is the Height and S is the Side of the square.

For a small H/S, the cross-section of the column would be relatively uniform as a square throughout its whole height or length of the column.

If H/S get larger, then the column cross-section, near the pads, would still be square, and then the further away we go, away from the pads towards the mid-height of the column, the cross-section of the column will start to get more rounded at the corners, or rather filleted, until at a certain point or height, it may reach a circular shape, rather than a square.

Another similar example is when we start with rectangular pads.

The same thing would happen, but starting with a rectangular basis.

If the solder joint is short, then the joint is exactly rectangular.

If we increase the height to a relatively small/medium height, then the joint will be exactly rectangular at base (pads), and the farther we get away from the pads the more rounded (filleted) the corners of the rectangle, and when the column gets pretty tall, then at the center of the column, close to its mid-height, i.e. at mid-distance between the pads, we would get an ellipse, and for even taller columns yet, we may even get a circular cross-section at the mid-height of the column.

Separation and the Use of Supported or Filled Solder

All the above is assuming that the solder would not separate and cut-off into two separate individual portions, where one portion would stick/adhere to the lower pad and the other portion would stick/adhere to the upper pad, or it may even separate totally from the top pad and the whole amount of solder would sit on top of the lower pad.

I had solved this problem as seen in two of my previous inventions. Please see Ref15. U.S. Pat. No. 4,664,309, dated May 12, 1987, entitled "CHIP MOUNTING DEVICE"; and Ref16. U.S. Pat. No. 4,705,205, dated Nov. 10, 1987, entitled "CHIP CARRIER MOUNTING DEVICE". There, I have "supported" the solder, by wrapping a thin narrow band (ribbon) of copper tape around the solder column, to keep its columnar shape.

If we find it necessary in certain cases here, then we can use a similar approach for this present invention.

There is a difference, however. In the CCMD case, the height of the columns were staying practically constant. In this present invention, the columns change their height as described herein.

We can absorb the difference, i.e. the change in height of the columns, by using a thin wire to wrap around the solder column, in such a way that the wire would be more flexible than the ribbon tape. The thin wire, preferably with a round cross-section, instead of the rectangular cross-section of the ribbon, would be more flexible and more receptive to allowing the column to compress or to stretch.

Another change that we can introduce, over the CCMD, is to flatten the CCMD columns. The CCMD columns were made in a continuous shape, like a continuous wire. We called it the "columns wire stock" or simply the "wire stock". The wire stock was then cut to the proper length, to create the "preforms", and then the preforms were inserted into fixtures, sometimes we used dissolvable carrying wafer, to be used for the assembly process.

We can do the same thing here, except for two additional steps.

First, we need to "flatten" the wire stock. After the wire stock is formed, using the thin wire instead of the ribbon, we can run the wire stock between two rolls under pressure, to "flatten" the wire stock.

Second, when the wire stock is cut to the proper length of the individual preforms, each preform would be oriented, as per the present invention, when it is inserted into the carrying fixture or the carrying wafer, or when it is attached to the packages, regardless of the method of attachment.

Another alternative is to use "filled" solder.

The term filled solder had been used in an old patent, that I encountered around 1980-84, when I was working on the CCMD. That patent has included some copper particles into the solder, homogeneously dispersed in the solder. I had wanted to use that approach myself as an alternate method of maintaining the shape of the solder columns, but because of that prior art. I was told that I could not claim myself anymore. That prior art patent wanted to use that filled solder to close large gaps between copper plates or the like. Because of the copper filler, the solder was supposed to maintain the shape given to it, overcoming the high surface tension of the solder.

I did a patent search on filled solder, but I could not find that old prior art patent.

Regardless, that patent is now in the public domain, since it has been over 17/20 years since the time I encountered it.

So, if we make oriented starved columns as per present invention, and encounter cases, where the regular solder does separate, then we can use "filled solder" as described above, to reduce or eliminate the separations. Filled solder would allow us to have taller starved columns, without separation, than if we were to use regular, i.e. unfilled, solder. Hence, taller columns without separation.

Double Wires

FIG. 34 shows another method to create solder columns as per present invention. It is a way to simulate the flat columns, and to orient them as desired. We would have two round wires, placed near each other, both on each of the solder pads, to simulate the effect of a column with rectangular cross-section. The plane, which contains the vertical axes of the two wires, would need to be oriented, so as to face the thermal center. The two wires could be "wire-bonded" to one device, e.g. the BGA, and then soldered to the other device, e.g. the PCB.

Solder Bumping

FIG. 35 shows a method of "bumping" the solder pads, so that they would have tall solder columns. FIG. 34-A shows one such method of bumping. This can be done by "deposition" on top of the chip, or by screen printing the proper solder paste on the substrates or on the BGAs.

All these methods are well know in the industry and are not novel.

The novelty here is two-fold.

First, that the solder bump would have a rectangular or elongated cross-section, as implied by the rectangular opening in the mask shown in FIG. 34-B. FIG. 34-B shows a mask that could be used to create such a solder column/bump, with a rectangular or elongated cross-section, where the opening or aperture in the mask is rectangular or elongated as needed.

Second, the fact that these solder bumps would be "oriented" as per the present invention. This means that the flat face of each solder bump, or column for that matter, would be facing the thermal center of the package or of the assembly, or in other words, the short axis of the solder bump cross-section would be in the direction of the thermal deformation ray to that specific bump. Hence, each opening or aperture in the mask should be oriented, as needed, to satisfy the requirements, as per present invention.

SPECIFIC BACKGROUND

Leaded

Field of the Invention

This section of the specification relates to and covers the second group of products, which includes LEADED packages.

Please refer also the "GENERAL BACKGROUND" section at the top of the present specification, for additional remarks.

Prior Art

Please refer to Ref5 for any known prior art.

I have not found any additional information in these regards.

Background

I had mentioned in my previous applications, especially in Ref3, as well as in Ref5, that "Oriented Leads or Columns" can improve the life and reliability of plastic packages.

I had also shown a number of ways to achieve the desired designs and goals, mostly grouped under two methods.

A—Two-Step Method—Twist and Fold

In the two-step operation, the leg blanks exit in an "orthogonal" direction from the package body, i.e. in a direction that is "normal" or "perpendicular" to the body sides and/or axed. So, if we simply fold the leg blanks, then the vertical parts of the legs will also be "orthogonal", hence not oriented as per invention. In order to get them "oriented" as required, we have to add a "twisting" operation. This was all described at length in Ref3 and Ref5.

B—One-Step Method—Oriented Leg Blank with Fold Only

The other method was to use a flat leadframe with the leg blanks already oriented and radiating directly from the plastic body already in the proper direction, i.e. exiting already on an angle from the package body, i.e. on an angle to the package sides and axes. This allowed us to be able to simply "fold" the leg blanks and through this one single operation, we were able to get the vertical part of the legs to be "oriented" as per recommendations of the invention.

This "one single step" folding operation compares favorably against the other alternative, i.e. the "fold and twist" method. The reasons are that it is a one-step operation only instead of a "two-step" operation, and where we need to also "twist" the legs to get them into the proper "orientation". The second reason is that twisting, if not done properly and carefully, can overstress the plastic body or even the legs material itself.

In Ref3 and Ref5, I had mentioned and described the "one-step" method, and have shown some figures illustrating the proposed method. Many of those figures were pretty small and it may have been too difficult to recognize the fine details of the concept.

So, in this present application, I will show some figures, with more details, to make sure that the concept is well understood.

I will also show another "one-step" method, which could be considered a compromise between method A and B. I will call this method, method C, the "Normal-Oriented" or "Orthogonal-Oriented" Leg Blank with Fold Only" method. I will briefly describe it here, but I will, further below, show some figures to describe this method more fully in the section on "DETAILED DESCRIPTION OF THE INVENTION—LEADED PRODUCTS".

C—One-Step Method—"Orthogonal-Oriented" Leg Blank with Fold Only" Method.

In the two drawings attached to Ref6, FIGS. 1 & 2, I showed a proposed way to create oriented leads out a flat leadframe. I will call this method, method C, the "Orthogonal-Oriented" or "Normal-Oriented" Leg Blank with Fold Only" method. Compare this with the two other methods, mentioned earlier above.

Here the portion of the leadframe that would generate each individual leg of the package, hereinafter referred to as "leg blank", would be coming out of, or protruding from, or exiting from, the plastic body will be orthogonal, i.e. perpendicular to the body's sides and centerlines, the same way like the present conventional leadframes are made today in the industry. However, the leg blanks would then be formed, or rather blanked, to radiate out in the proper desired oriented direction, while they are still flat, as shown in the two figures. The big difference is that the portion of the leg blanks coming out of the plastic body would be orthogonal instead of on an angle. This makes it easier to provide the "dams" that are necessary for the encapsulation or molding process and then later to cut-off or trim the dams after the encapsulation or molding process is finished.

Objectives

To enhance the reliability and to prolong the operating life of leaded packages by reducing the stresses on the packages body; and also by reducing the stresses on the assemblies' solder joints and solder pads between the tips of the gull-wing legs of the packages and the substrates, on which the packages are mounted.

SUMMARY OF THE INVENTION

In this present invention, I will describe the third method of forming the legs of leaded packages, i.e. Method C, the "Normal-Oriented" Leg Blank with Fold Only" method.

I will also show some more examples of the second method, which was described in Ref3 and Ref5, i.e. Method B—One-Step Method—Oriented Leg Blank with Fold Only.

I will also show more figures describing the solder pads that would accept the proposed oriented leads, especially the "combination" pads. These solder pads were also described in Ref3 and Ref5, but the present figures will give more details.

DETAILED DESCRIPTION OF THE INVENTION

Leaded Products

Review of Earlier Applications

First, let's refer to Ref5.

I will briefly review the drawings in that Ref5, which have some special relevance to the present specification.

Figure 41:
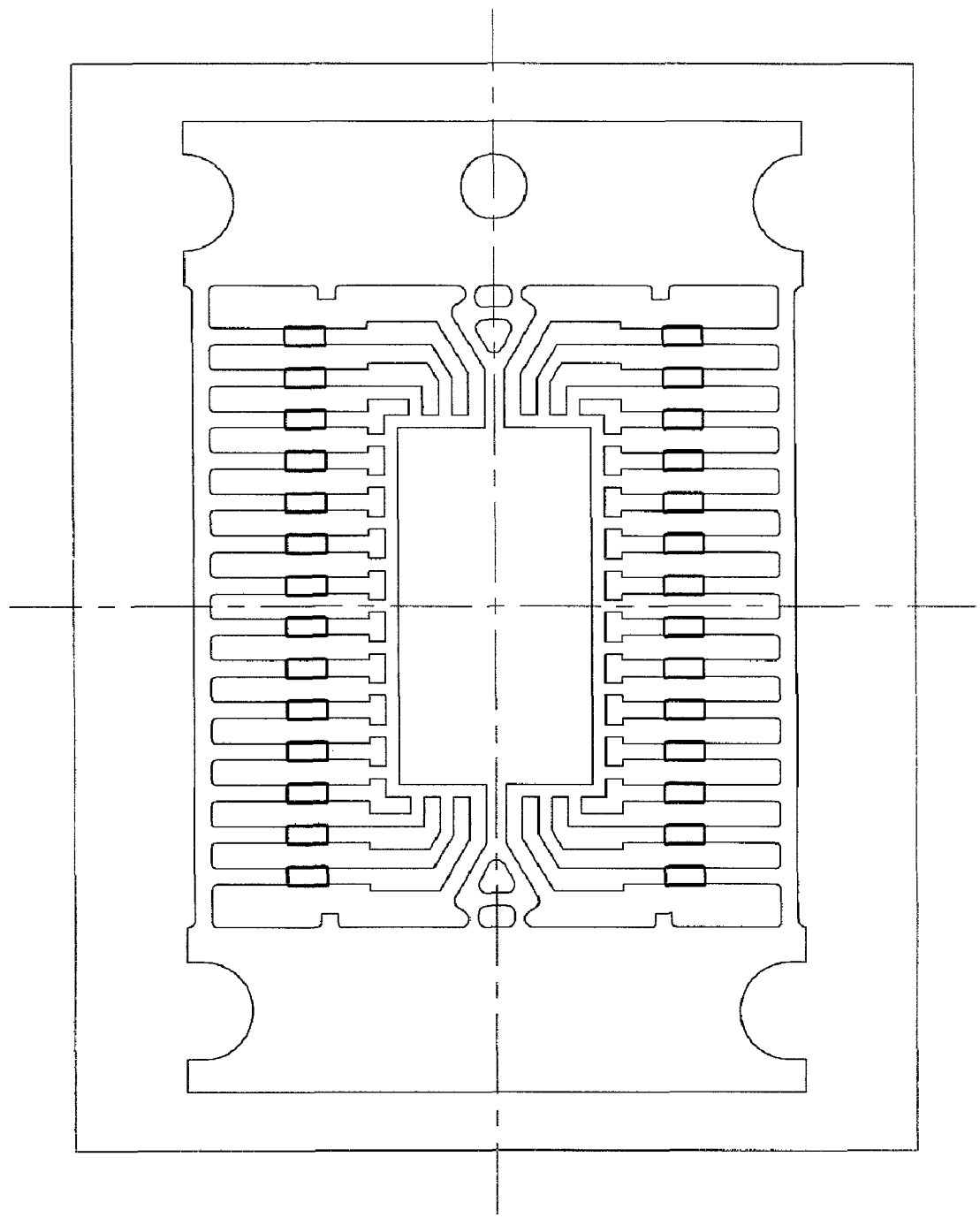
Figure 42:
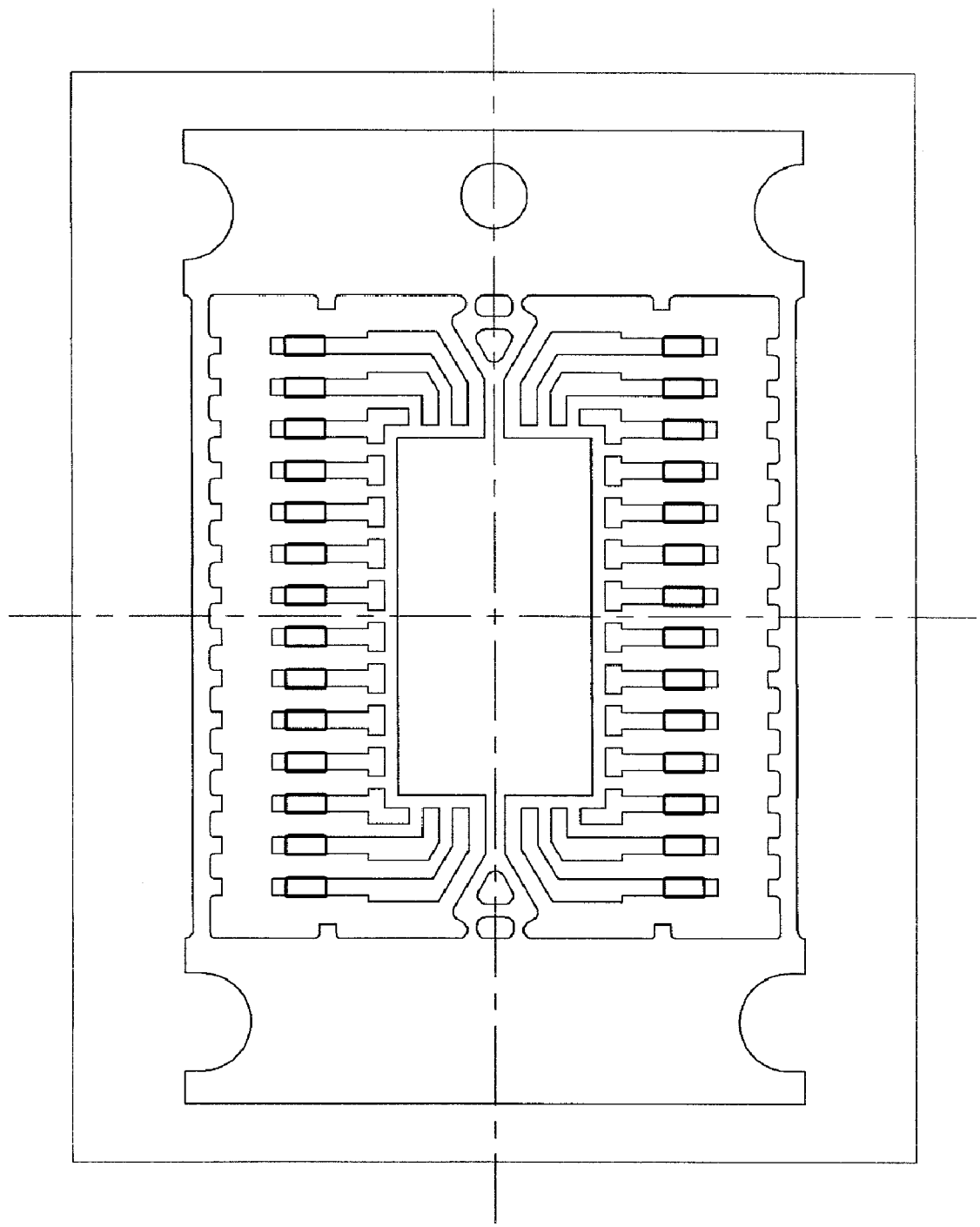

Ref5, FIGS. 41 and 42 illustrate my definitions of "Fold" and "Twist". Ref5, FIG. 41-B shows a "Twist" in a strip of sheet metal, which started "Flat", and Ref5, FIG. 41-C shows a "Fold" in a similar strip of sheet metal. Ref5, FIG. 42-D shows a progression from "Flat" to "Twist" and then to "Fold". Ref5, FIG. 42-E reverses the order and shows a progression from "Flat" to "Fold" to "Twist".

Ref5, FIGS. 2 and 3 show a (Prior Art) package with standard conventional legs. The leg blanks exit, or protrude from, the package body in a perpendicular direction to the sides and to the centerlines of the package. I refer to this condition as an "orthogonal" direction or sometimes as a "normal" direction. The leg blanks are later folded, to create the vertical parts of the legs, or "leg columns". No twisting of the leg material is involved here.

Ref5, FIGS. 12 and 13 show an example of standard, conventional flat leadframe. They also show the leg blanks are laid-out to be orthogonal, i.e. perpendicular to the sides and centerlines of the expected body of the package.

Ref5, FIGS. 20 and 21 appear to have their leg blanks in an orthogonal direction as well. The two external leg blanks, at either side of the central one, are then folded at some angle, to create the oriented legs as shown.

Ref5, FIG. 22-A shows the legs, orthogonal and folded, but FIG. 22-B shows the leg blanks oriented and folded.

Ref5, FIG. 23-C shows solder pads that are rectangular and oriented, in line with the thermal deformation rays. I will refer to such pads as "dedicated" solder pads. See more explanation later below.

Ref5, FIG. 23-D shows solder pads that can accept both conventional gull-wing legs as well as oriented legs. I will refer to such pads as "combination" solder pads or simply "combo pads". See more explanation later below.

Ref5, FIG. 25, top view shows the legs protruding from the body in an orthogonal direction, but bottom view shows them in a radial or rather oriented direction.

Ref5. FIG. 26 at first glance may look like Ref5. FIG. 21, but there is a difference. Here the two external leg blanks seem to exit already on an angle to the side of the package body. We can say that they are oriented already. The fold is orthogonal with the leg blank and at an angle to the package body.

Ref5, FIGS. 32 through 40 show oriented leg blanks. Such leadframes will be referred to as "radial" or rather "oriented" leadframes. We only need to "fold" each leg blank orthogonally to the direction of the leg blank itself and we would then get the vertical part of each leg column oriented properly, as per present invention. We do not need to "twist" anything.

Ref5. FIGS. 32, 33, 35, 67 and 39 show the leadframe in its flat condition. Ref5, FIGS. 34, 36, 38 and 40 after the leg blanks had been folded and automatically oriented.

Now, we'll review Ref6.

Ref6, FIG. 1 shows a flat leadframe, where the leg blanks exit or protrude orthogonally, but then they curve around, while still in the flat leadframe condition, so that the following part of the leg blank, which would generate the vertical part of the legs, becomes oriented as required by the present invention. I will refer to that portion of the leg blank that curves around as the "neck" of the leg blank. The included angle of each neck is different for each leg.

When we "fold" the leg blank, orthogonally, at the outer end of the neck, then the resulting vertical portion of the legs will automatically be oriented properly, as per present invention.

Since each leg is supposed to be oriented at some respective proper angle, at its own respective angle with respect to the body's sides or centerlines, then the included angle of each neck will also be different for the different legs, to suit the requirements, as per present invention.

Ref6. FIG. 2 shows the leg blanks shown in Ref6. FIG. 1, but after they have been "folded", after each individual neck. We can see that the vertical part of each leg is oriented properly, as per present invention.

Now, I will show and describe the new drawings.

I have used a standard, conventional package as a model for my example. It is a "TSSOP" package. JEDEC (Joint Electronic Device Engineering Industry Development Association) defines TSSOP as "Thin Shrink Small Outline Package". I have used the package with twenty-eight (63) legs, i.e. seven (7) legs per quadrant.

This is just a model to demonstrate the concepts. The same concepts do apply to any other package, that has leads/legs, regardless of size of package, number of legs, or whether the leads are on only two sides of the package or on all four sides, etc.

Figure 36:
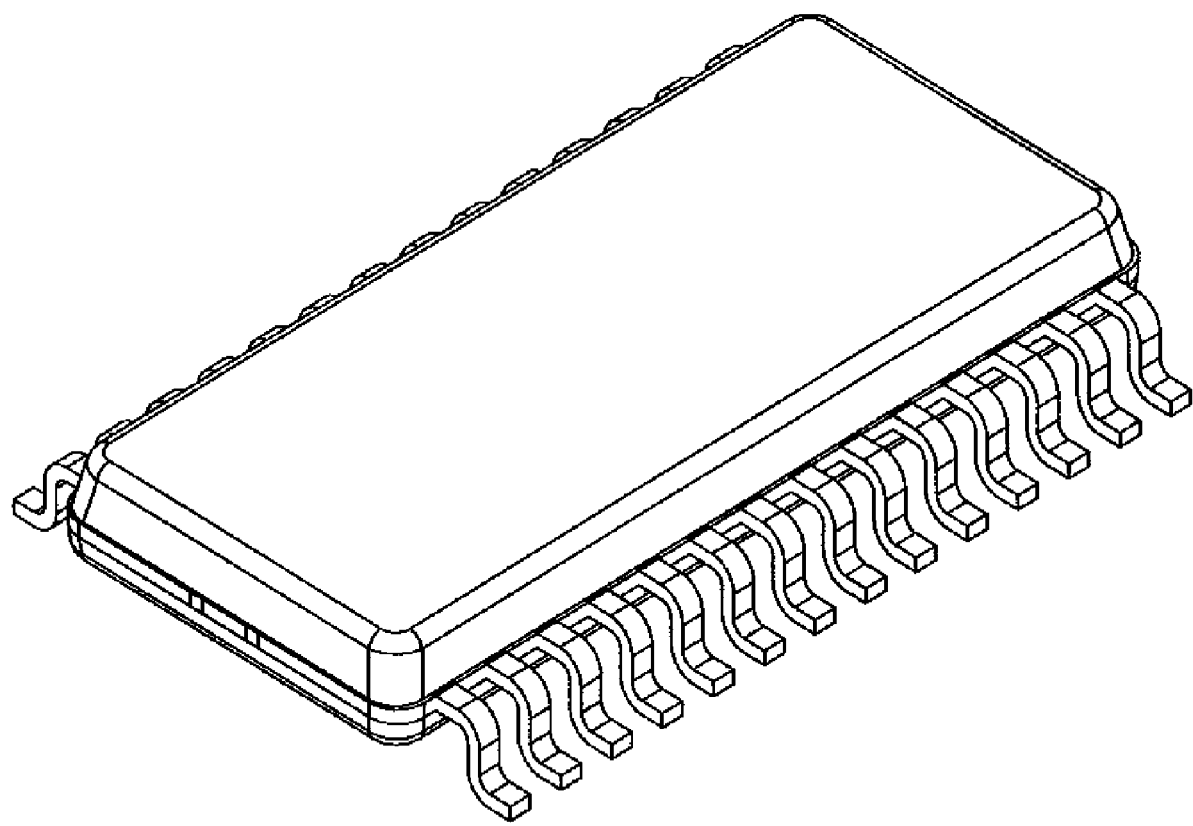
FIGS. 36 through 44 show a standard conventional leaded package (Prior Art) and some details of how such a package is manufactured and mounted on solder pads on a PCB. These drawings are here just to be able to compare and to visualize the differences between the state of the art and the new concepts presented in the present invention.

FIG. 36 shows the TSSOP (Prior Art) package, complete with body and legs, and ready to be assembled on a PCB or the like.

Figure 37:
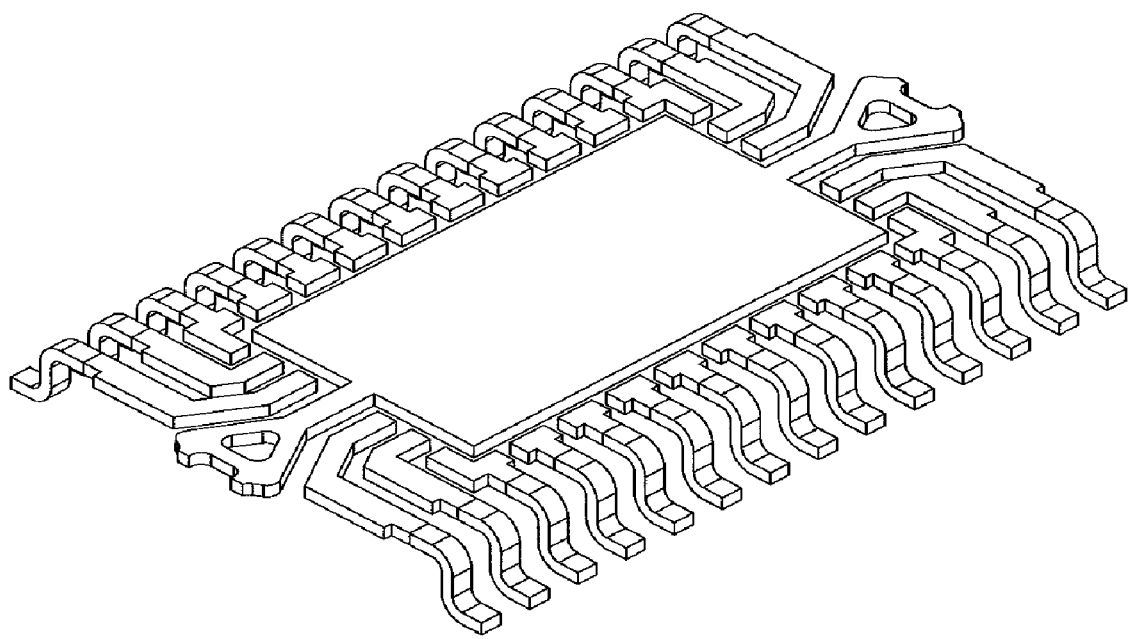

FIG. 37 shows the leadframe of the above package, without the plastic body or encapsulation. The leadframe is shown as if it has already gone through the manufacturing steps, i.e. encapsulation, de-damming, trimming/sizing and folding.

Figure 38:
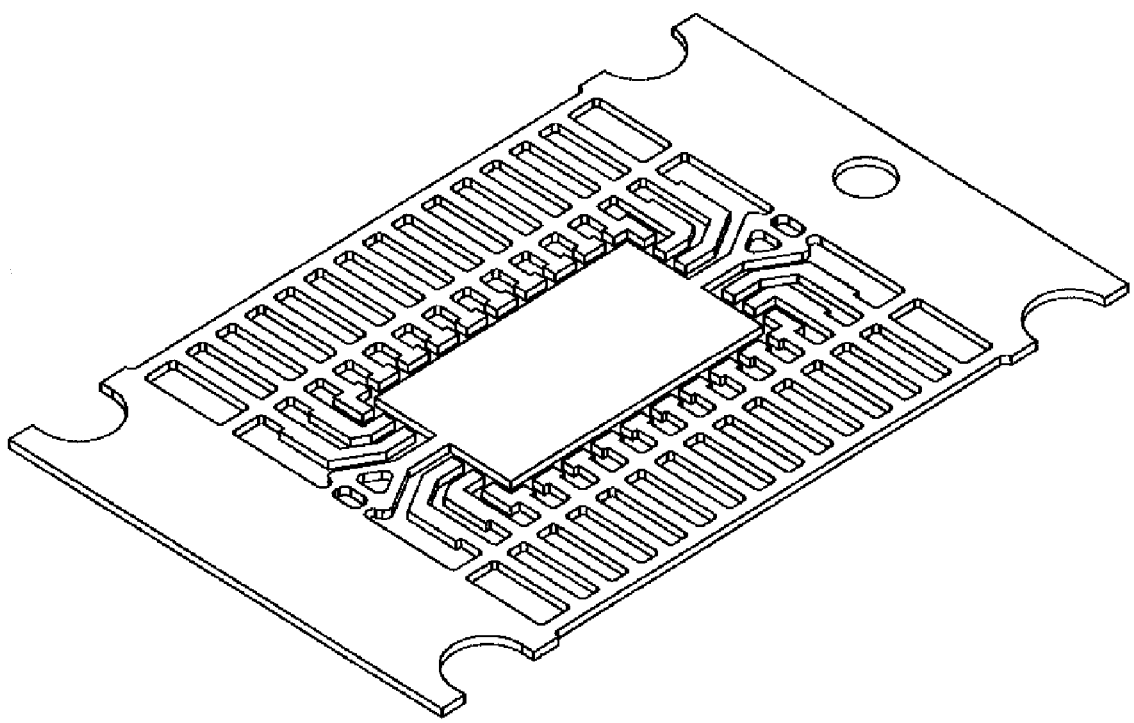

FIG. 38 shows a 3-D view of the whole leadframe, but in the flat condition. This is the leadframe for only one package. Usually, there are a number of such leadframes, all in a row, but I am showing only one leadframe for one package only here.

Figure 39:
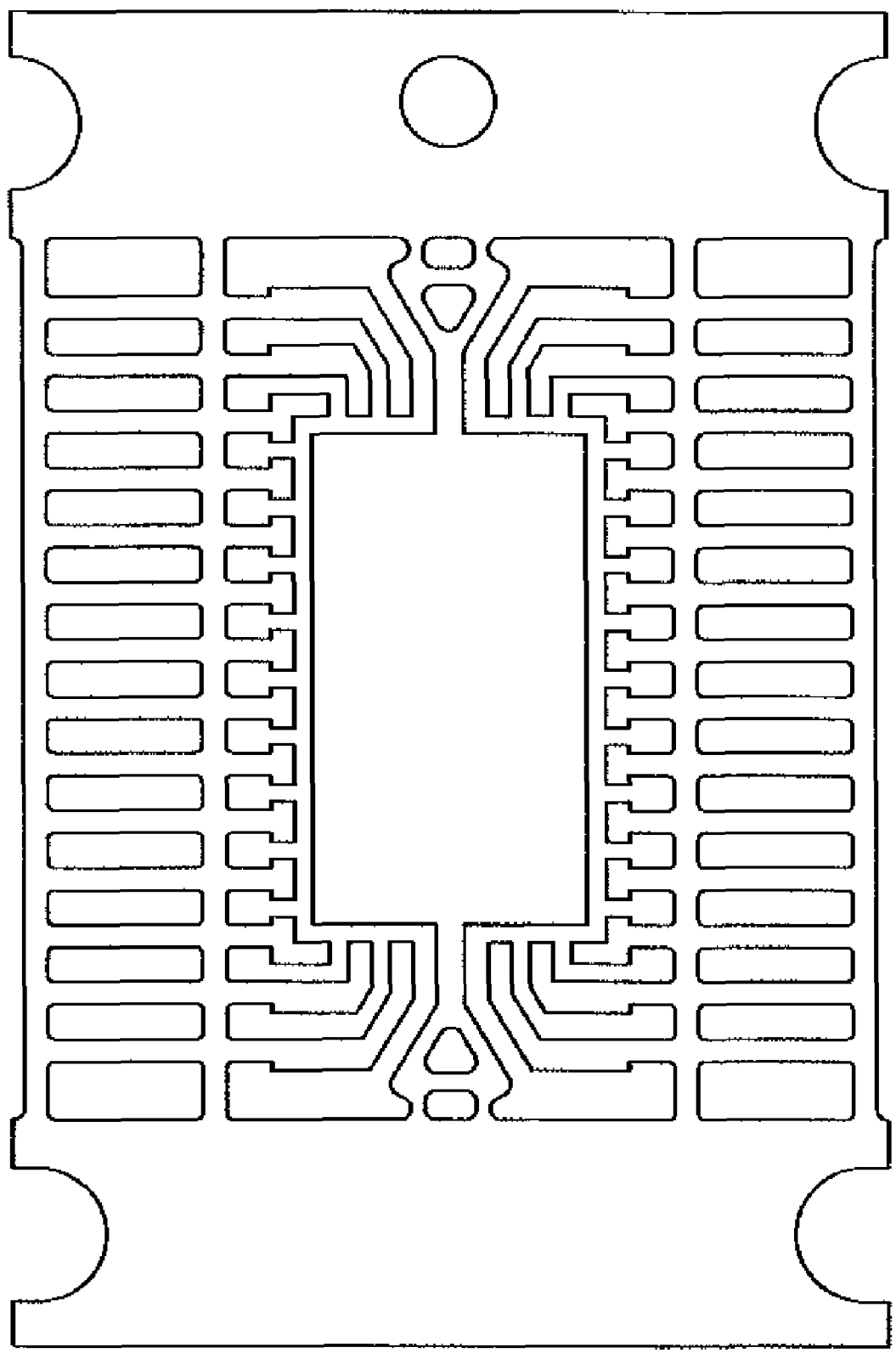

FIG. 39 shows the same leadframe shown in FIG. 38, but in an orthogonal view.

Figure 40:
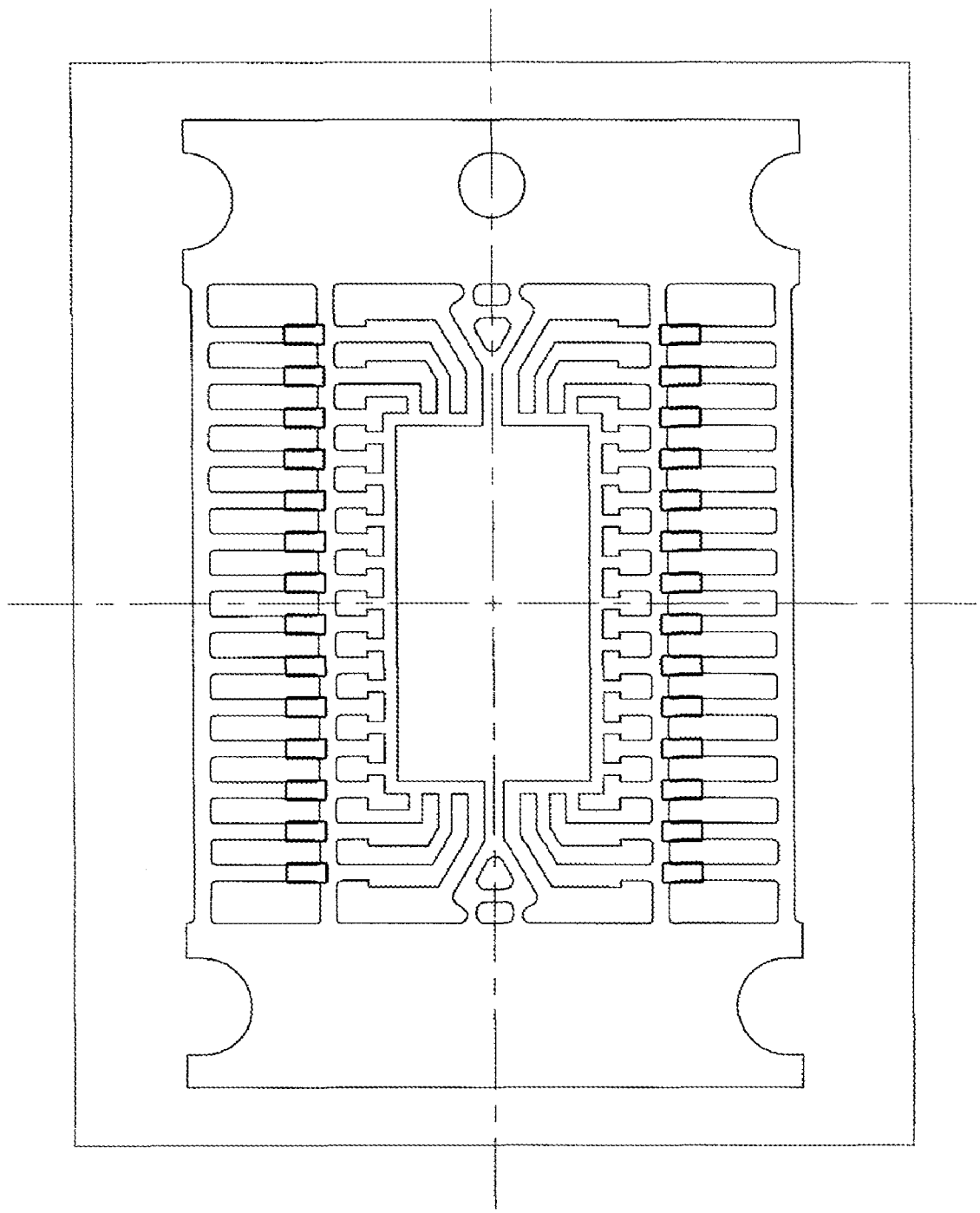

FIG. 40 shows the same leadframe again, but it also shows the locations of the solder pads, on the PCB, which will accept the tips of the package legs and get soldered to them.

FIG. 41 shows the same leadframe shown in FIG. 40, but with the "dams" trimmed off or "de-dammed".

FIG. 42 shows the same leadframe shown in FIG. 41, but after cutting or "sizing" the leg blanks to the proper length, so that they would form the gull-wing tips of the legs.

Figure 43:
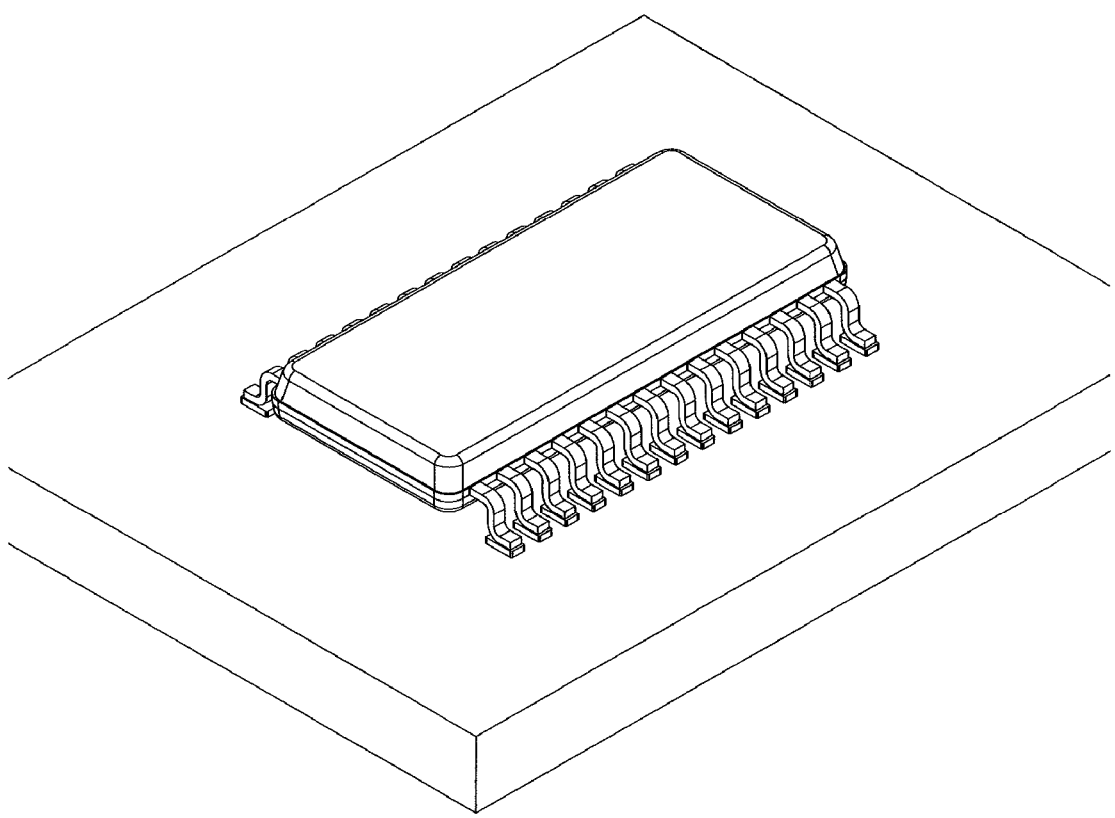
Figure 44:
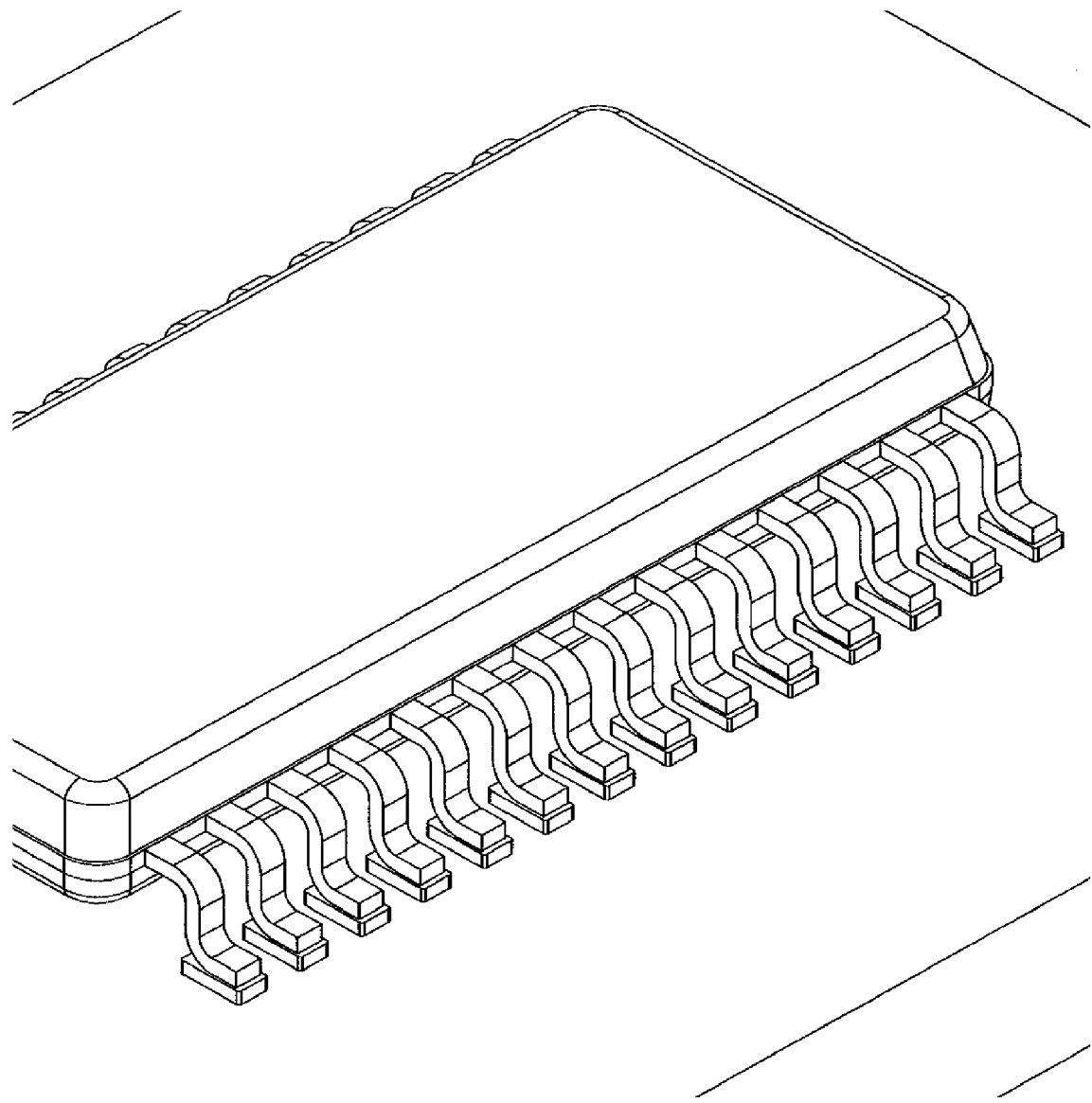

FIGS. 43 and 44 show 3-D views of the package, with the gull-wing tips of the legs sitting on top of the solder pads. These are the standard conventional solder pads.

All the above is "PRIOR ART".

DESCRIPTION OF THE PREFERRED EMBODIMENTS

Leadframe Embodiment #1

Now, I will describe a set of figures, showing a leadframe according to method B, the one-stop method of using "oriented leg blanks". See "Background" section.

Here the leg blanks protrude from, or exit, the package body on an angle with respect to the sides and centerlines of the package body. This permits that one folding operation would form the legs in the proper orientation.

Such an approach had already been described in Ref5. See FIGS. 32 through 40. The following figures duplicate the concepts shown in those earlier figures, and show the concepts as applied to a real life model.

Figure 45:
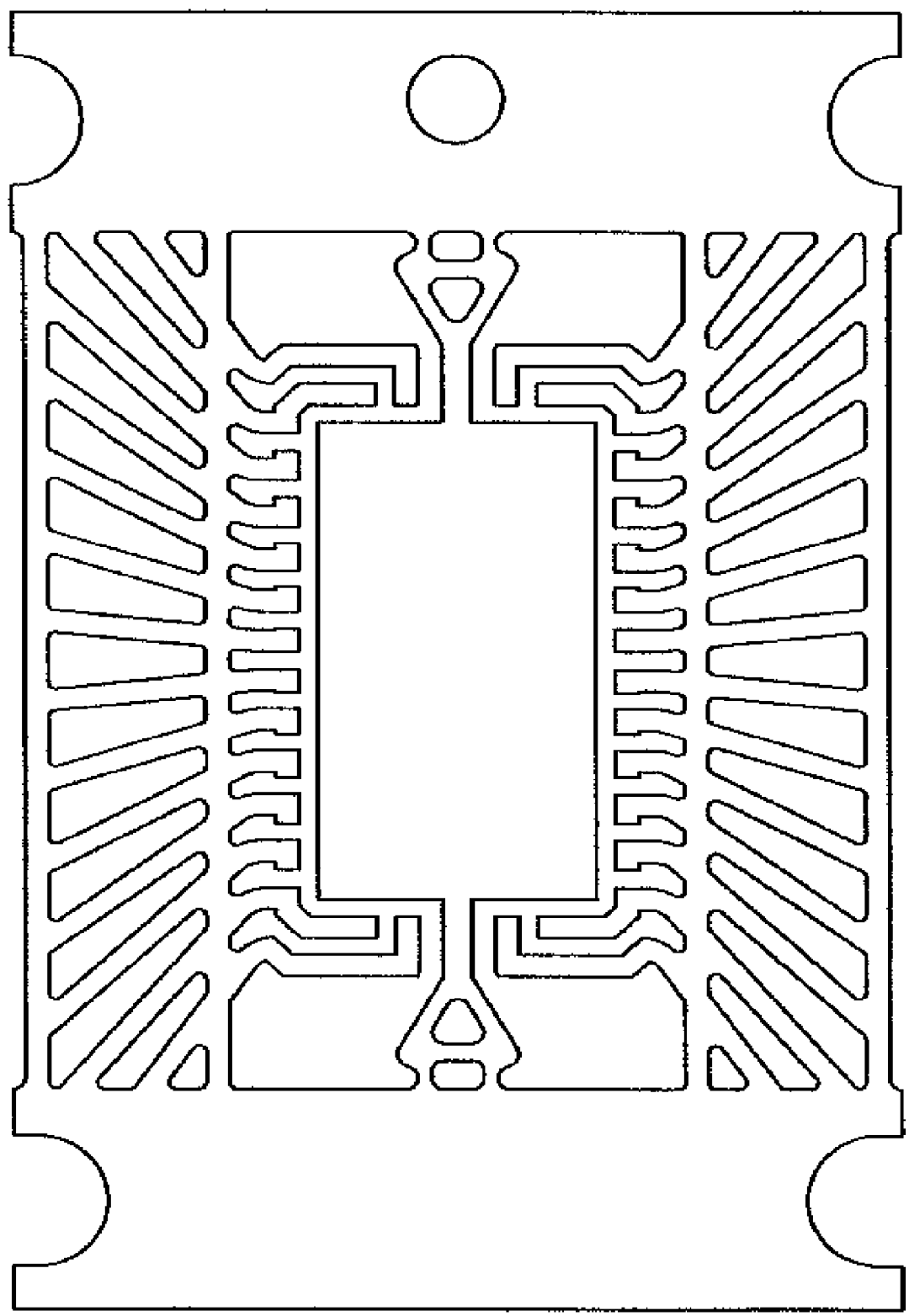
FIGS. 45 through 47 show a new leadframe, as per present invention, and compares it against the state of the art leadframe.

FIG. 45 shows the proposed leadframe, with the oriented leg blanks. Please notice the differences between this leadframe and the one shown in FIGS. 38 and 39. I will refer to such a leadframe as "oriented" leadframe or sometimes as "radiant" leadframe.

Figure 46:
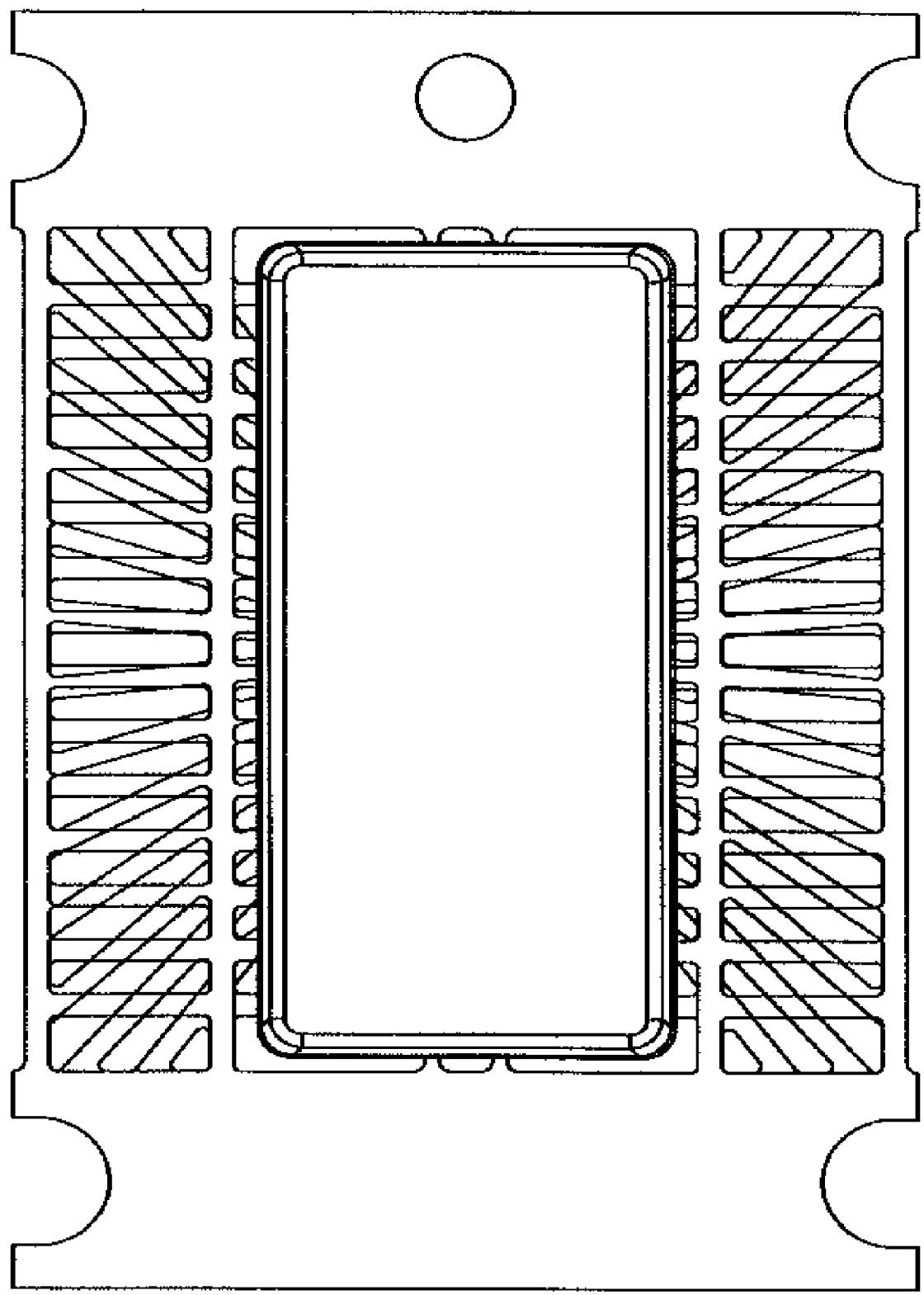
Figure 47:
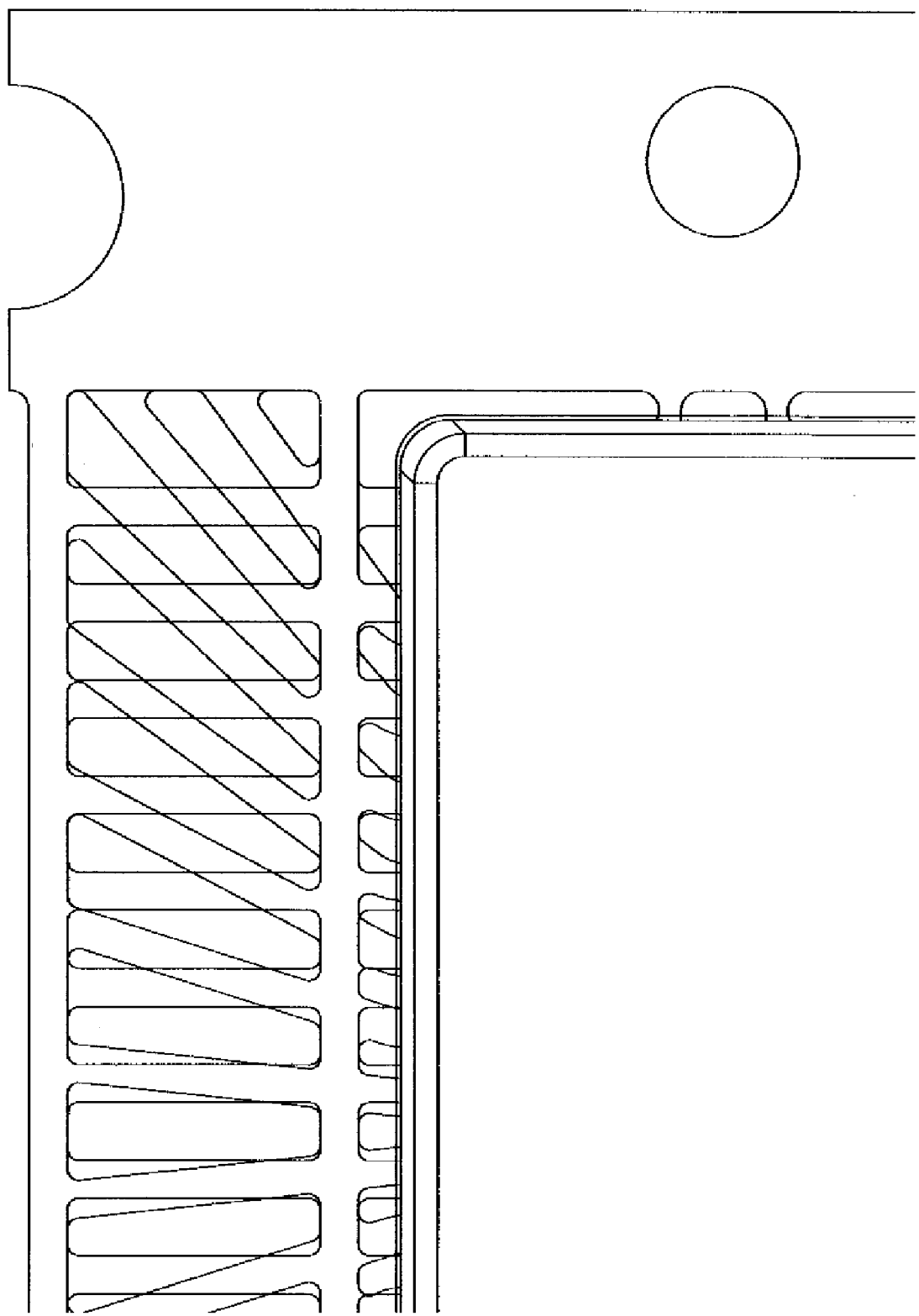

FIGS. 46 and 47 highlight those differences. FIG. 46 shows the whole leadframe and FIG. 47 shows a part of one quadrant only. The new, oriented leadframe is designed to have all the features that are important in both leadframes. These features include 1) the platform to mount the chip, 2) the wire bonding pads, and 3) the location of the mounting solder pads on the PCB. The new oriented leadframe satisfies all these three requirements.

FIGS. 48 through 54 show the progression of steps to manufacture a package, using this oriented leadframe. As it can be seen, they are not much different than with the standard conventional methods, except that it starts with the oriented leadframe, and that the dams needs also oriented tools to cut them off. Finally the folding tools will also have to be oriented accordingly. A good toolmaker can make these tools readily.

Figure 48:
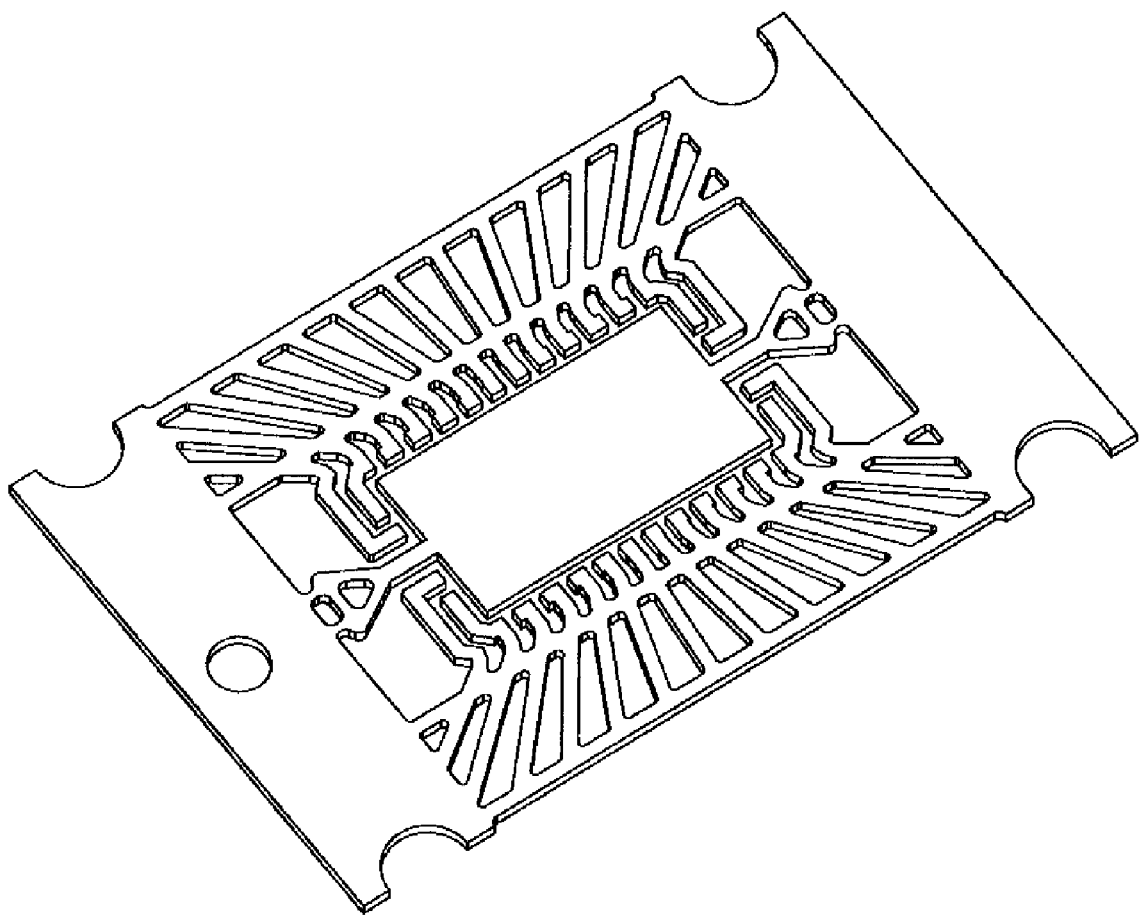
FIGS. 48 through 54 show the manufacturing steps used to work with the new leadframe, so as to end up with the new leaded package, as per present invention. The new package has it legs oriented, such that the "legs columns" are oriented to face the thermal center of the package, and eventually the thermal center of the assembly of this package on a substrate or a PCB.

FIG. 48 shows a 3-D view of the leadframe shown in FIG. 45.

Figure 49:
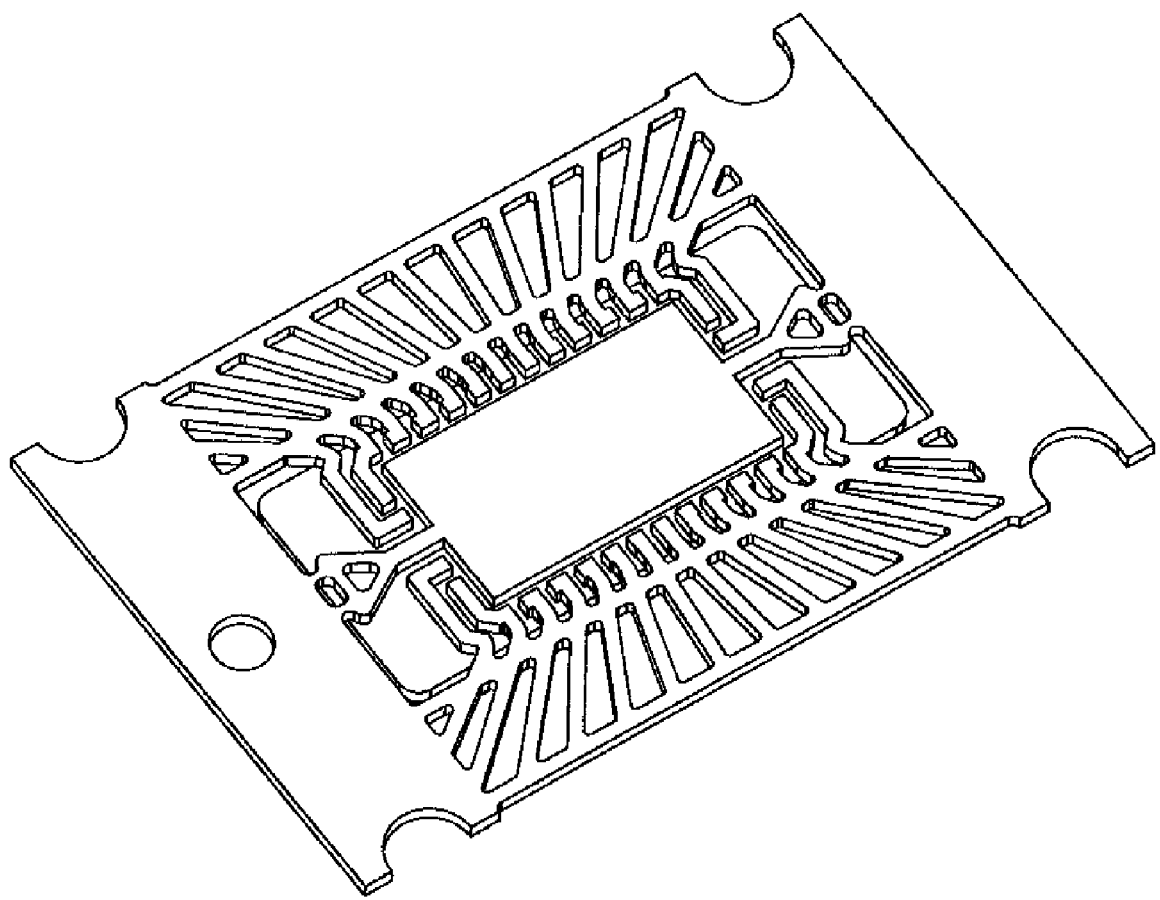

FIG. 49 shows the bottom part of the package body, placed under the leadframe. In reality the encapsulation process put the whole body on the leadframe in one shot, but I am showing it here in stages, just for clarification.

Figure 50:
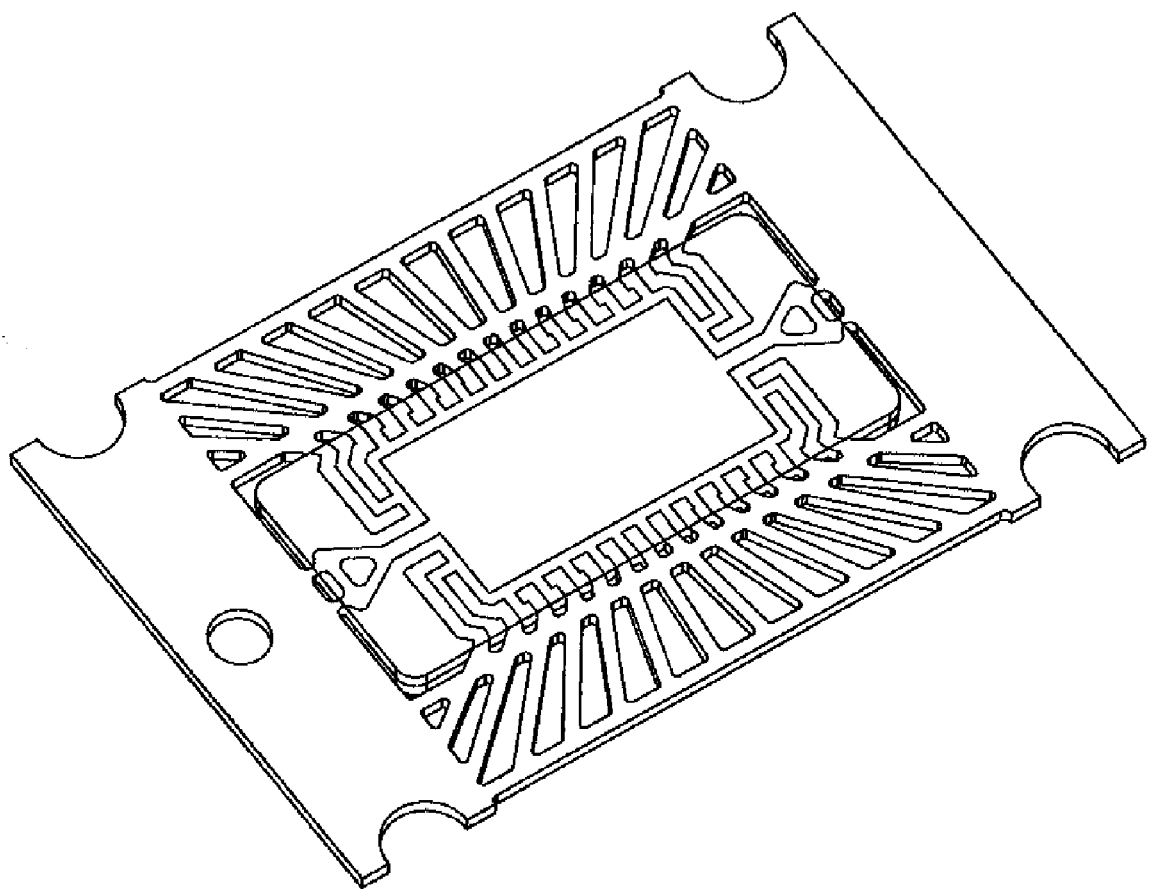

FIG. 50 shows the middle part of the body in place.

Figure 51:
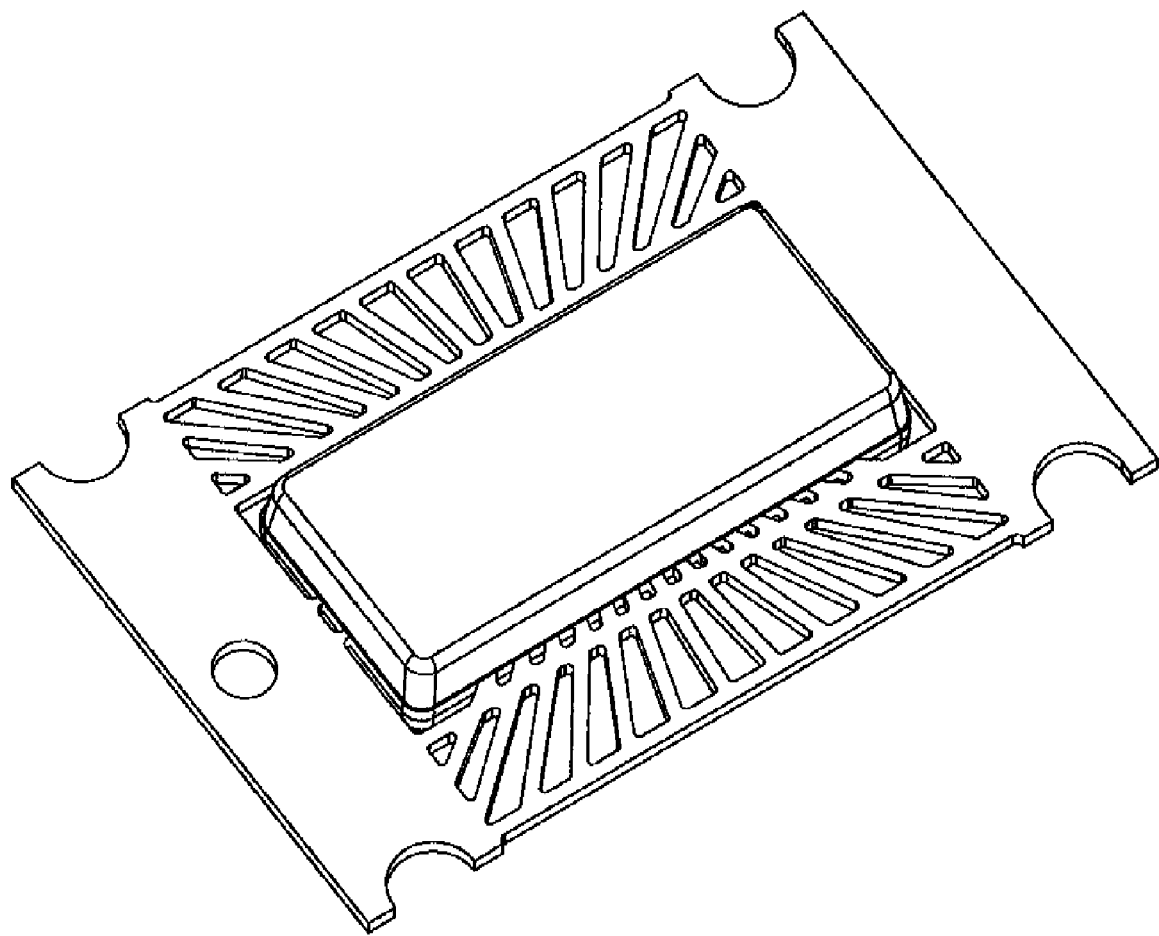

FIG. 51 shows the whole body molded on the leadframe. Again, in reality, there are a few more steps that have not been shown here. They are the steps of attaching the chip to the leadframe and connecting it electrically to the individual leg blanks. I am not proposing to change any of those steps, so I did not see the need to get into those details here. I kept the figures to the bare minimum essentials, just for clarity.

Figure 52:
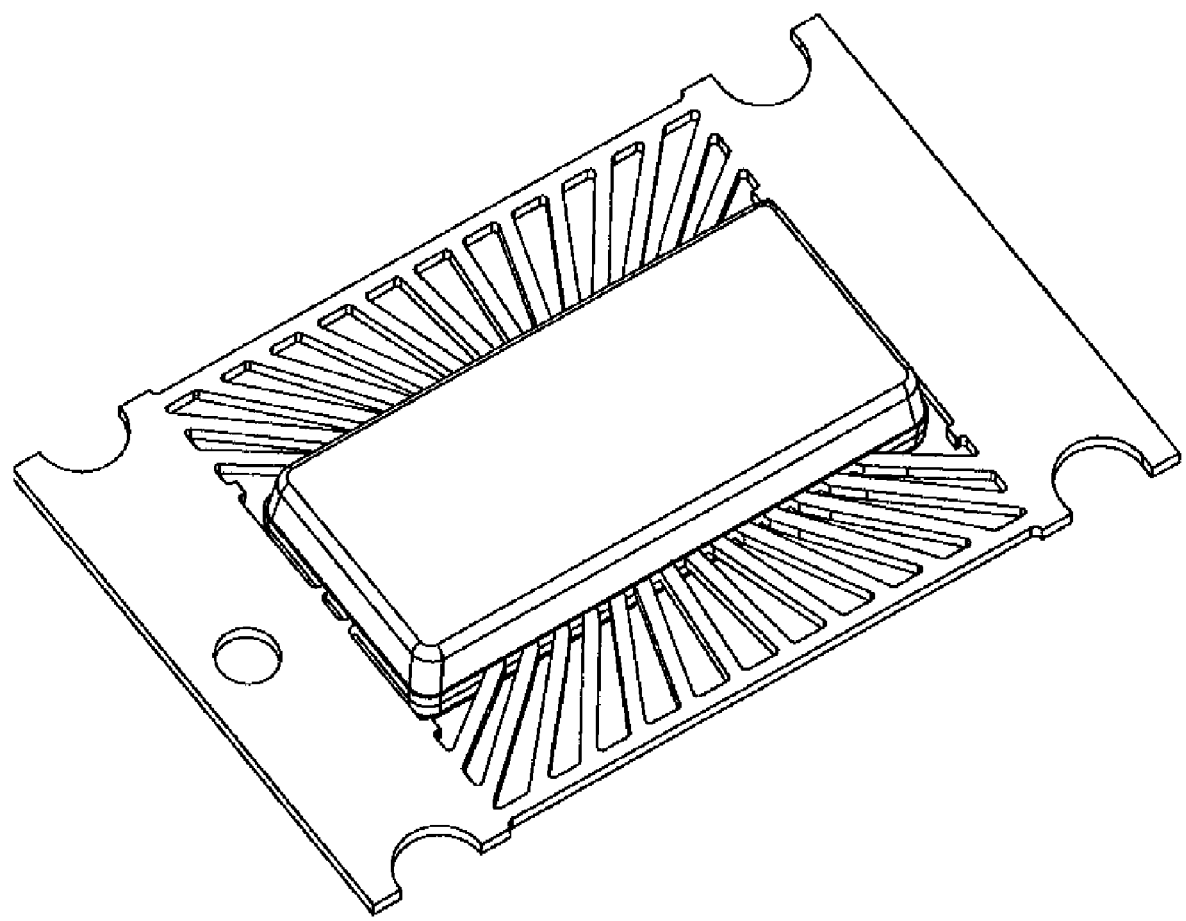

FIG. 52 shows the leadframe after the "de-damming" operation.

Figure 53:
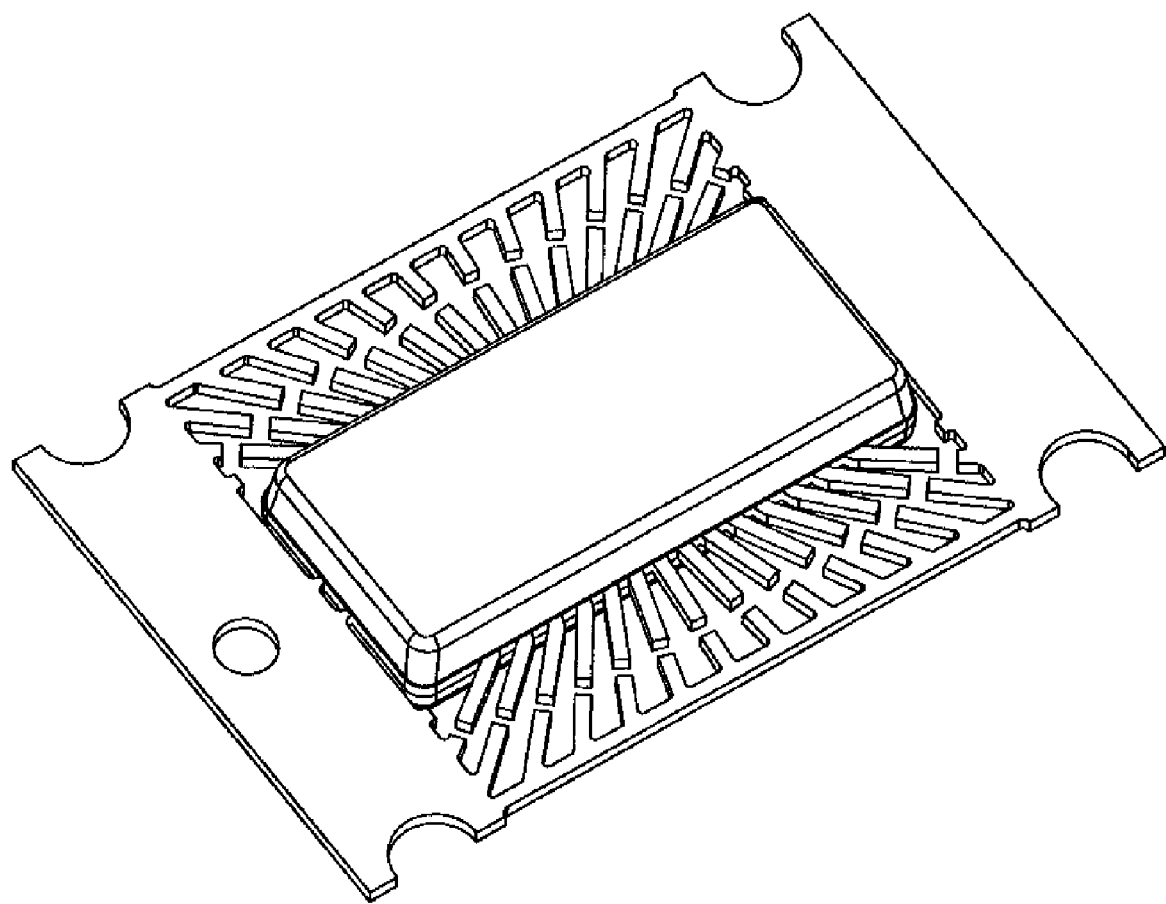

FIG. 53 shows the leg blanks, after the "sizing" operation, where the leg blanks are trimmed to the proper length, in preparation for "folding".

Figure 54:
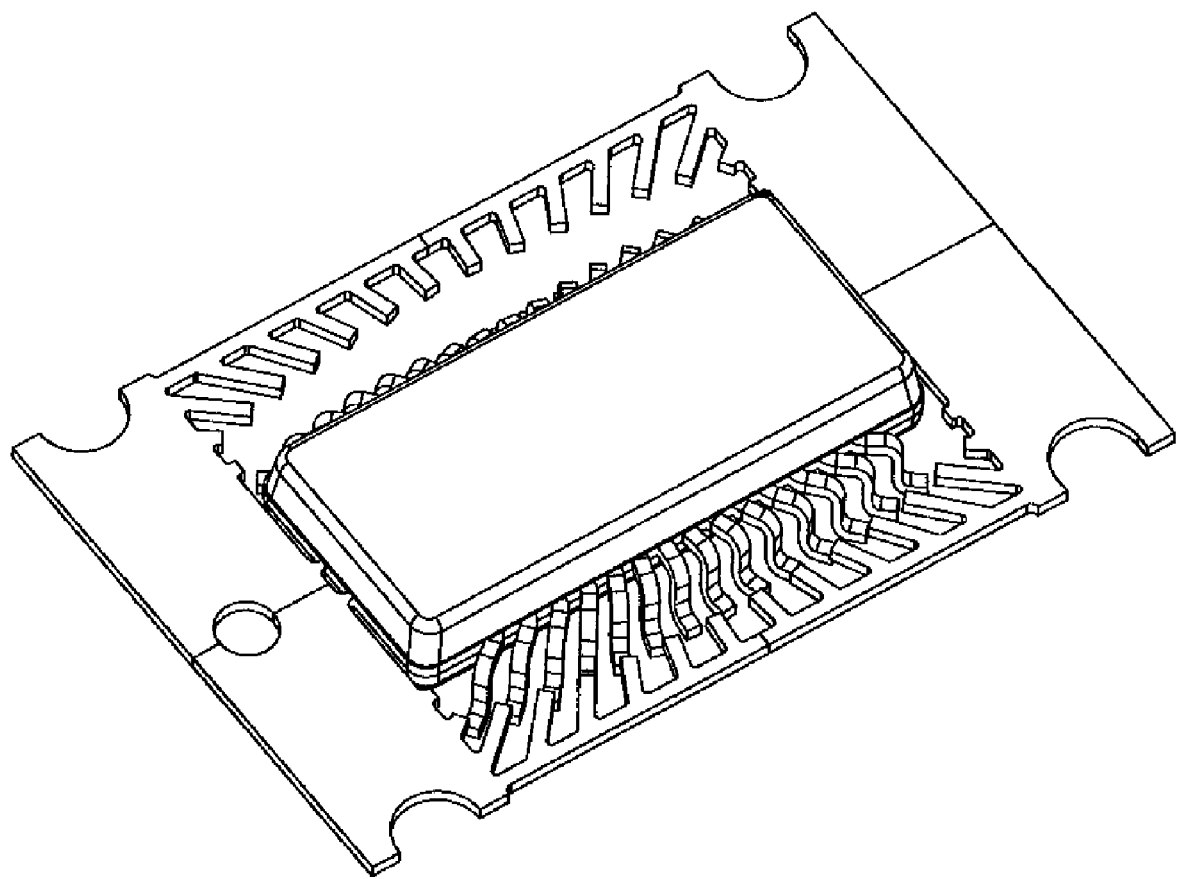
Figure 55:
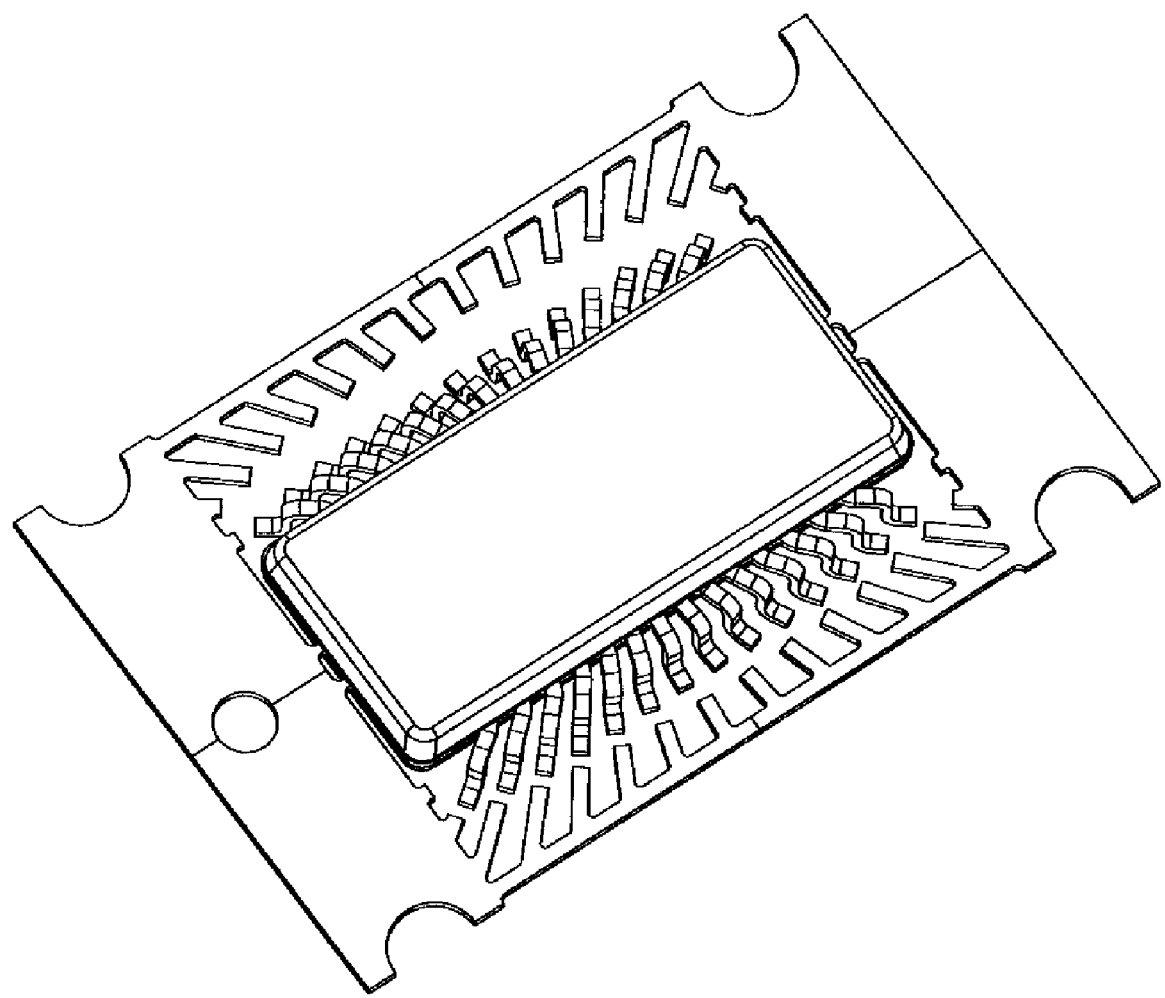
Figure 56:
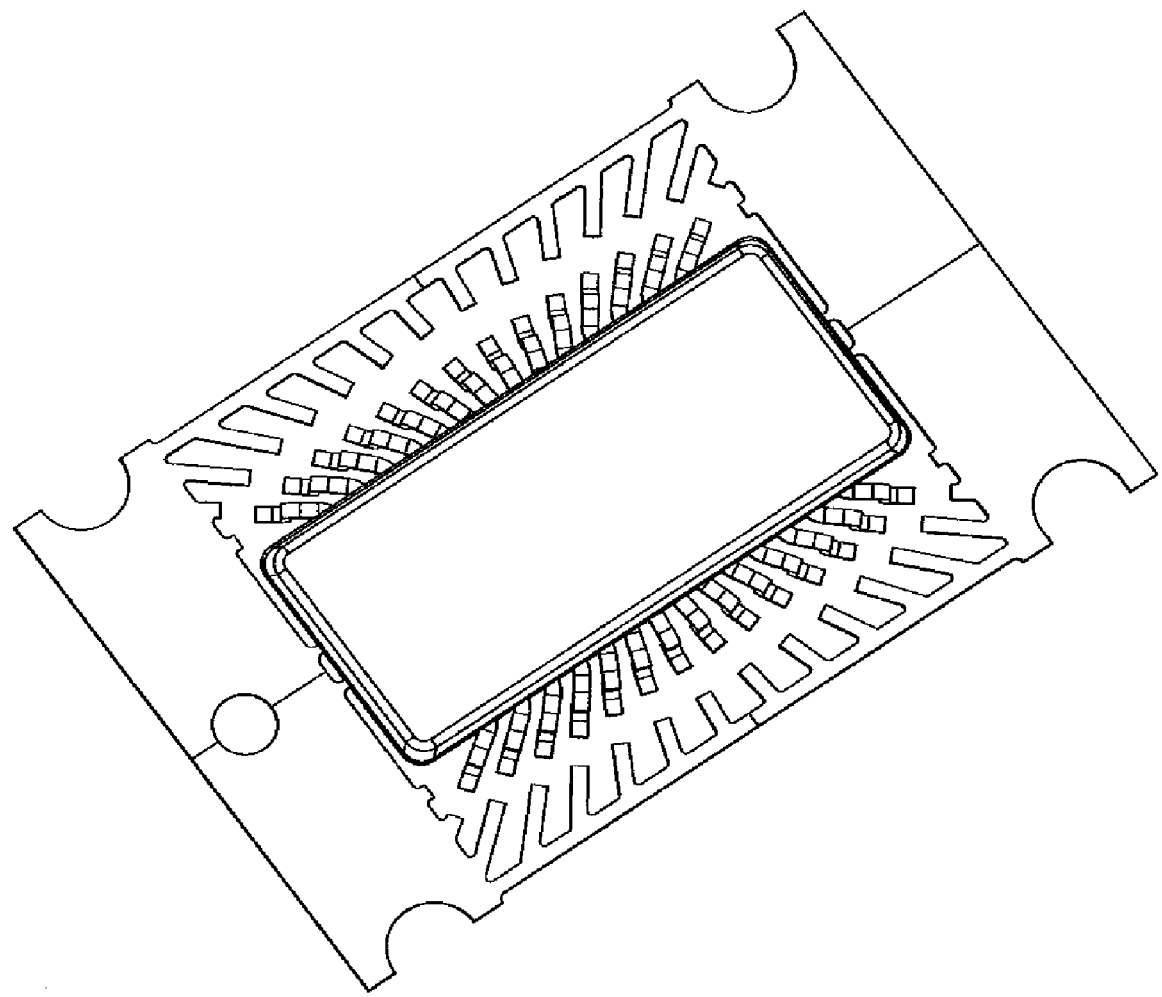
Figure 57:
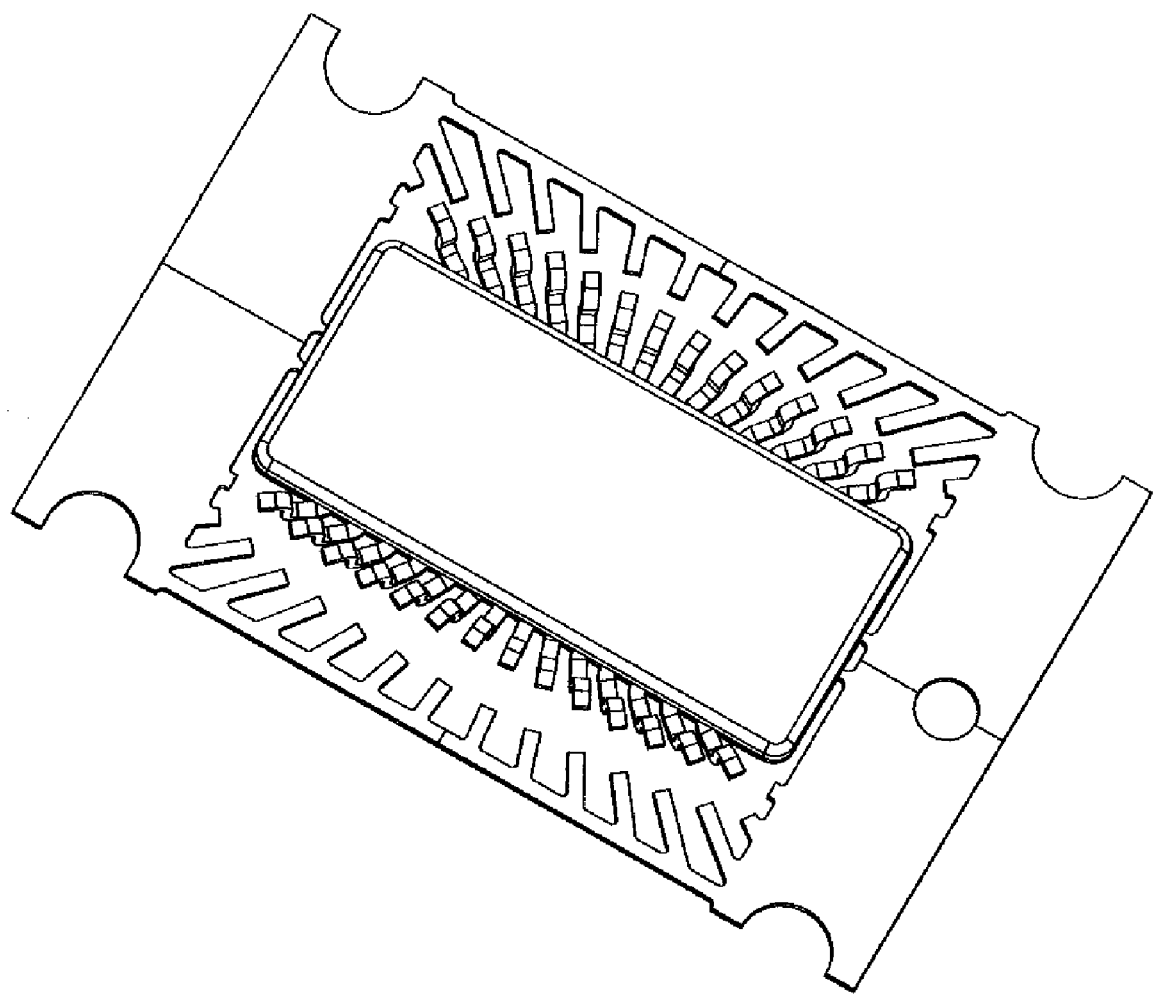

FIG. 54 shows the legs after the "folding" operation.

FIG. 54, together with FIG. 55 through FIGS. 58-A, 58-B, and 58-C show different views of the package after the legs have been folded to their final shape.

Note that the folding of the legs could be done at the same time as the de-damming and the sizing/trimming operations. This is optional.

Note also that the folding of each leg would have to be at the proper orientation, as per present invention.

Finally, note also that up to this point, the package is still attached to the carrier strip. They will be separated from each other afterwards.

Figure 59:
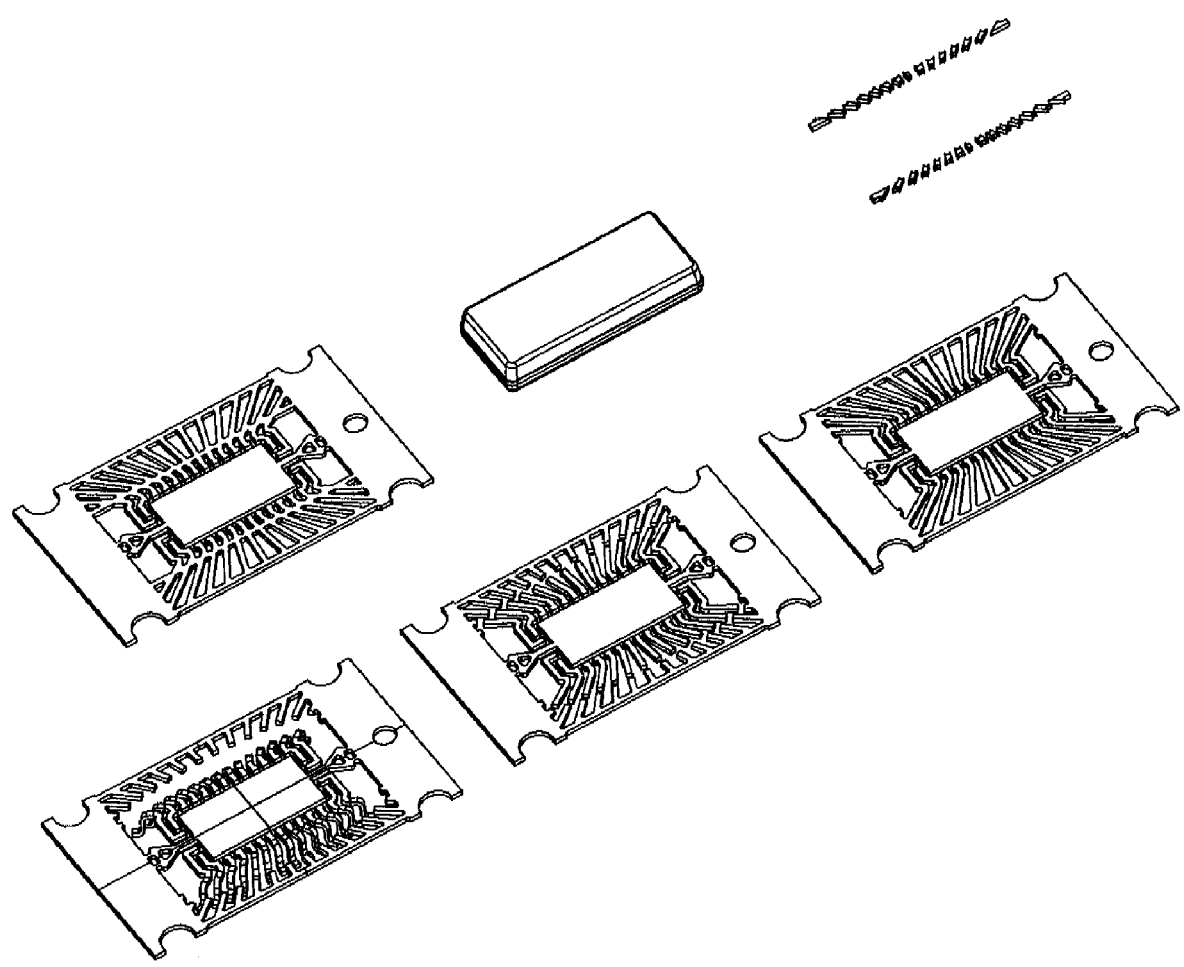
FIG. 59 shows a summary view of the important steps used to manufacture a package as proposed.

FIG. 59 shows an overview of the progression of the manufacturing steps described above.

SOLDER PADS EMBODIMENTS

Once the package has been formed, as shown in FIG. 54 through FIGS. 58-A, 58-B, and 58-C, then we can mount the package on a PCB or the like, by soldering the tips of the gull-wing legs to some solder pads.

Here we have at least four different options or alternatives to choose from.
1. Use the standard conventional solder pads, as they are. It will be OK as will be seen below.
2. Use round/circular or oblong/elliptical pads or the like. This may be questionable, but it sure is an alternative. I will not elaborate on this one, because it is easy to visualize.
3. Use "dedicated" solder pads, which would be designed specifically to accept these legs of the oriented legs packages. These pads could also accept the standard conventional packages, but it would be better yet to go to alternative 3 below.
4. Use "Combo" solder pads, which would be designed and optimized to accept both kinds of packages, i.e. the standard conventional packages, as well as the "oriented legs" packages.

Figure 60:
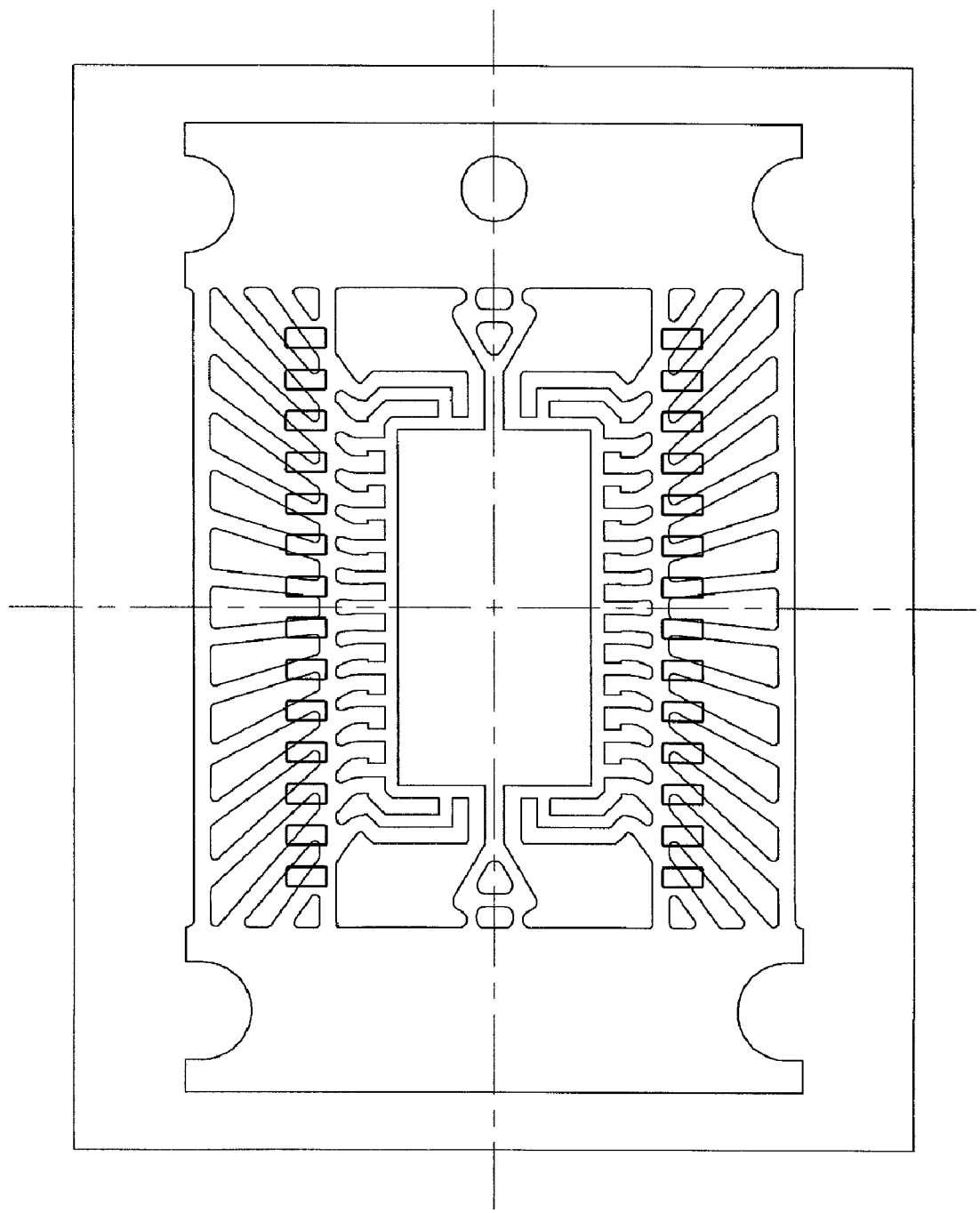
FIGS. 60 and 61 show the new leadframe at two important stages of its manufacturing, and compares them with the views in FIGS. 39 and 40.
Figure 61:
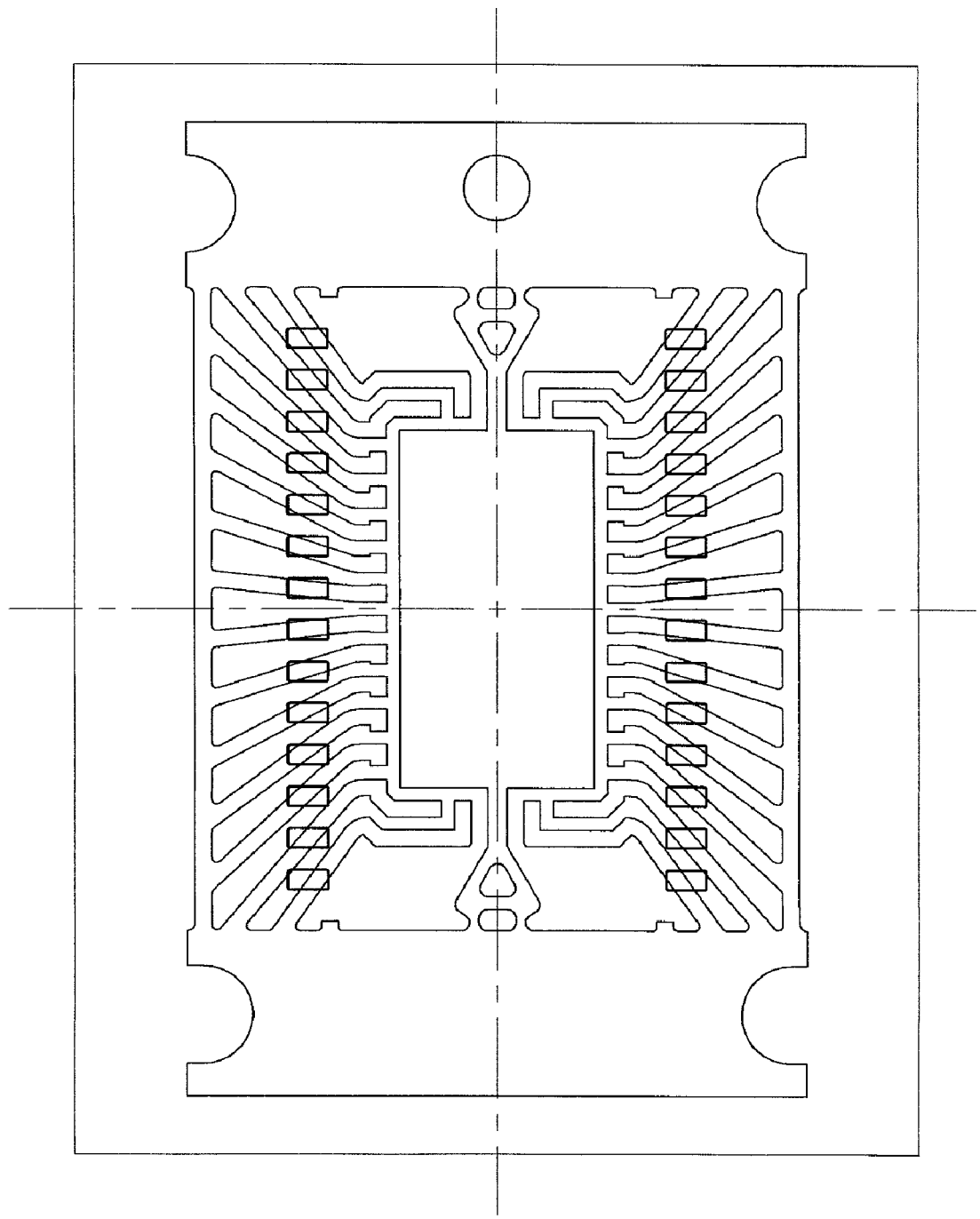

FIGS. 60 and 61 show the oriented leadframe, superimposed on top of the PCB solder pads. FIG. 60 is the counterpart of the leadframe shown in FIG. 40, where the leadframe dams are still in place. FIG. 61 is the counterpart of the leadframe shown in FIG. 41, after the dams have been removed.

Figure 62:
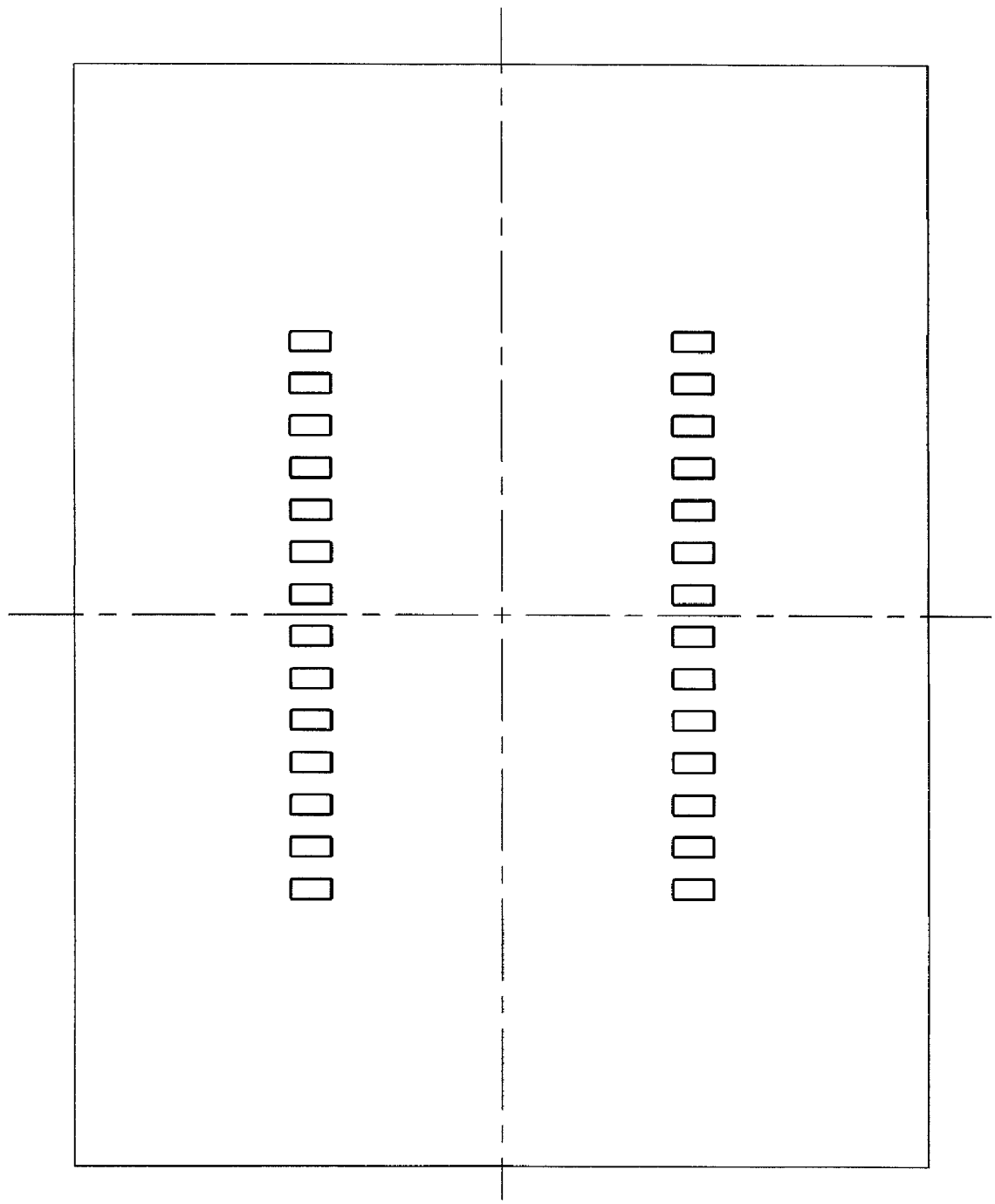
FIGS. 62 through 64 show different solder pads that can be used with the proposed packages.

FIG. 62 shows the standard conventional (Prior Art) "rectangular" solder pads, as specified by JEDEC. It is showing only the top right quadrant of the leadframe. This is according to Alternative 1 above.

Figure 63:
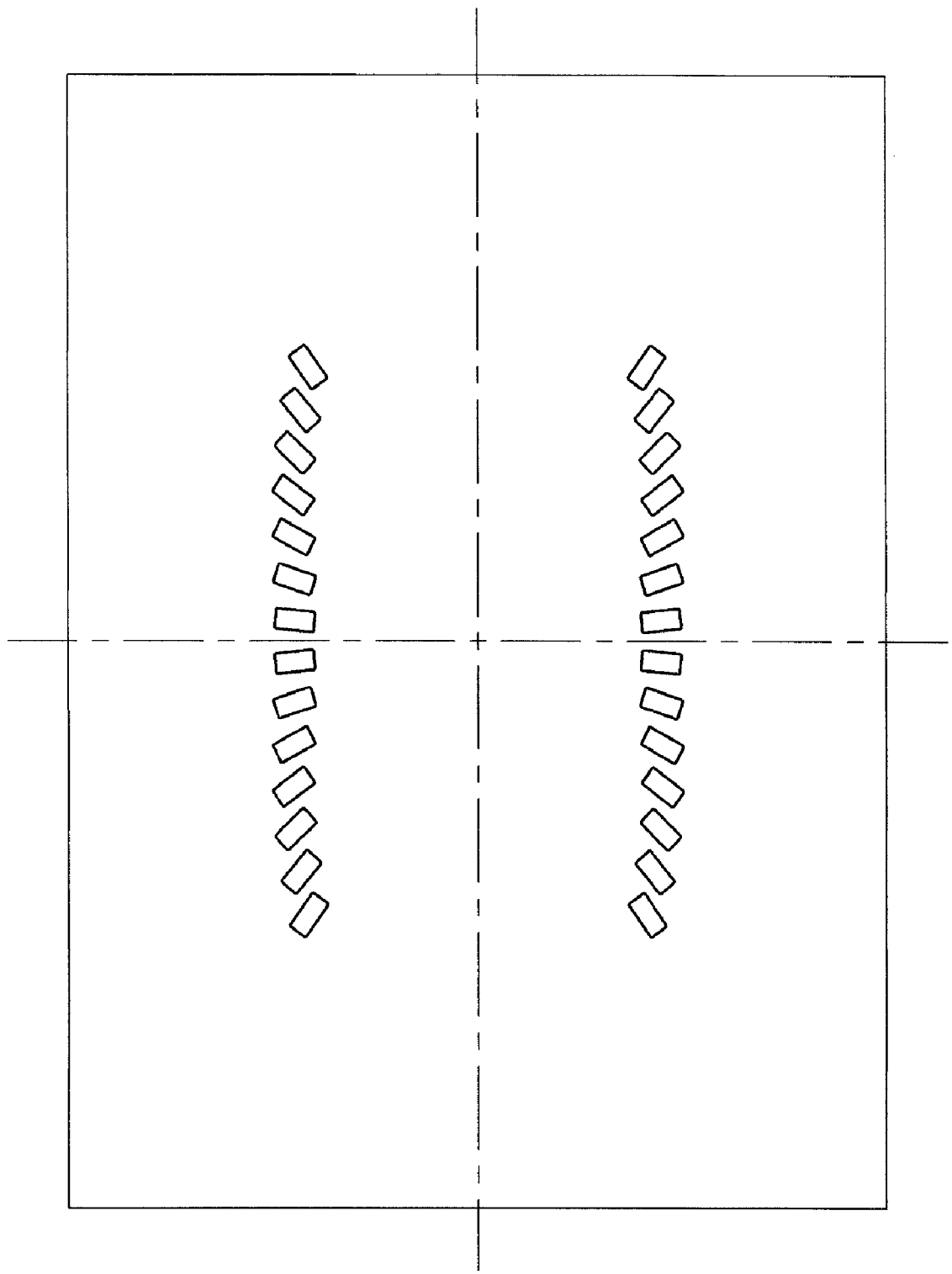

FIG. 63 shows the "dedicated" solder pads, as per present invention, as mentioned in Alternative 3 above.

Figure 64:
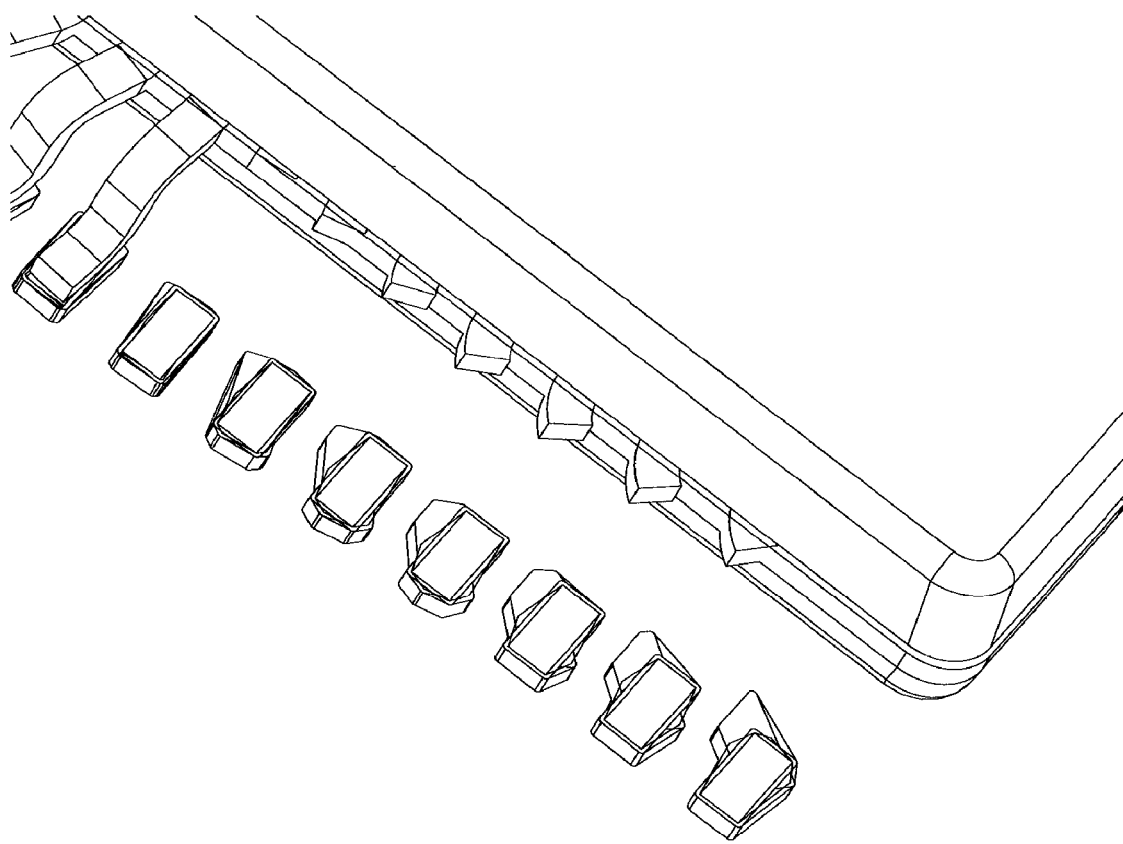

FIG. 64 shows the preferred "combo" solder pads, as per present invention, which can work with both standard conventional packages, as well as with the "oriented" packages, as proposed by the present invention.

There are several ways that we can use to arrive to the shape of these combo pads. I will not go into all these details here, because it can take too much time. I will be happy to present the process to the Examiner, if desired. There are at least two main criteria to try to satisfy, when designing such combo pads. First, try to provide the largest surface possible to be soldered to the corresponding "foot" of the mating device, with at least enough surface for good solder fillets. This, however, has to be tempered by the available space on the PCB. Second, try to make sure that there are proper clearances between all adjacent pads and/or adjacent features on the PCB, to make sure that there will not be any electrical shorts between these features and/or the pads themselves.

Figure 65:
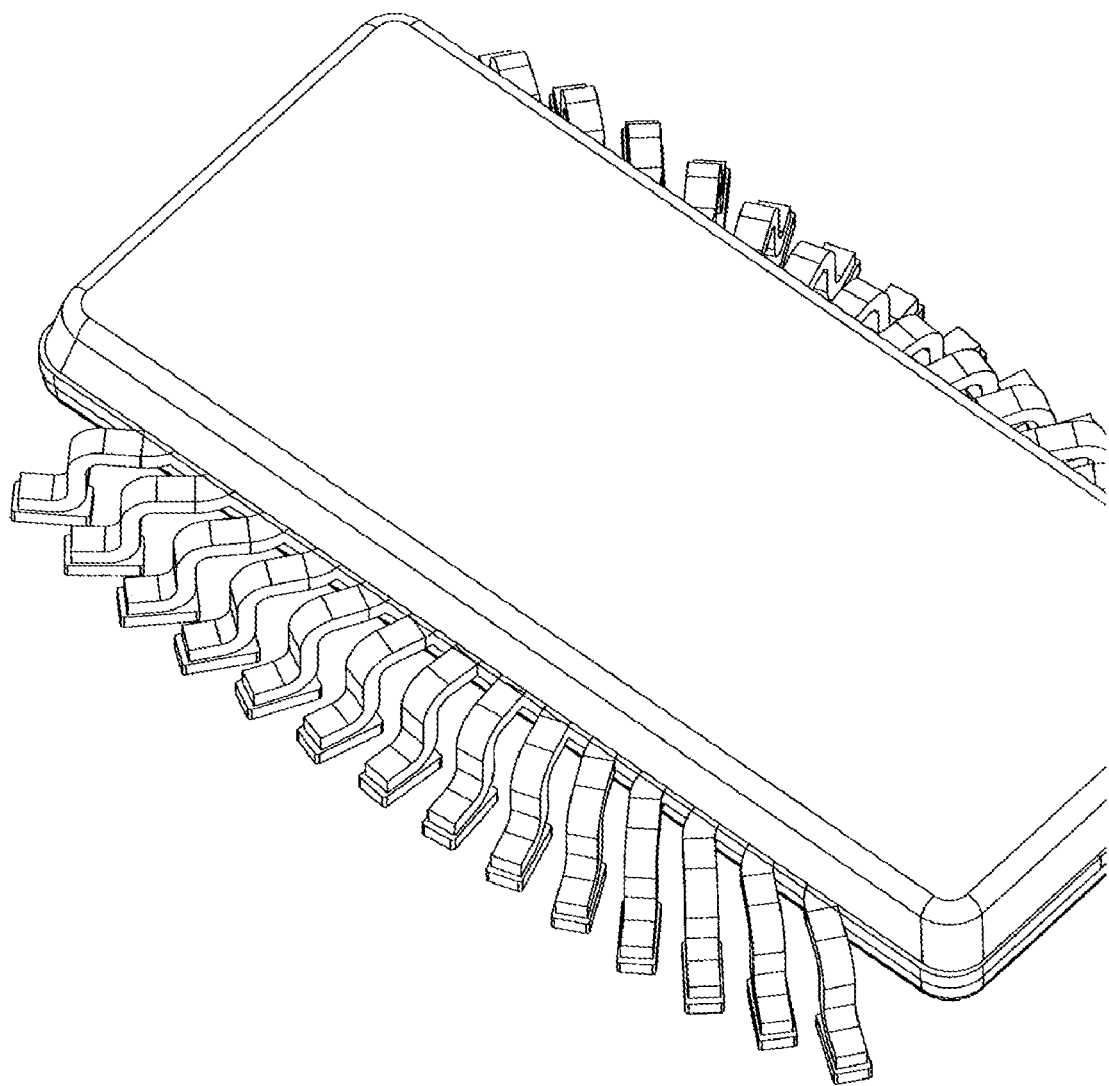
FIG. 65 shows a package with oriented legs, sitting on top of "dedicated" solder pads.
Figure 66:
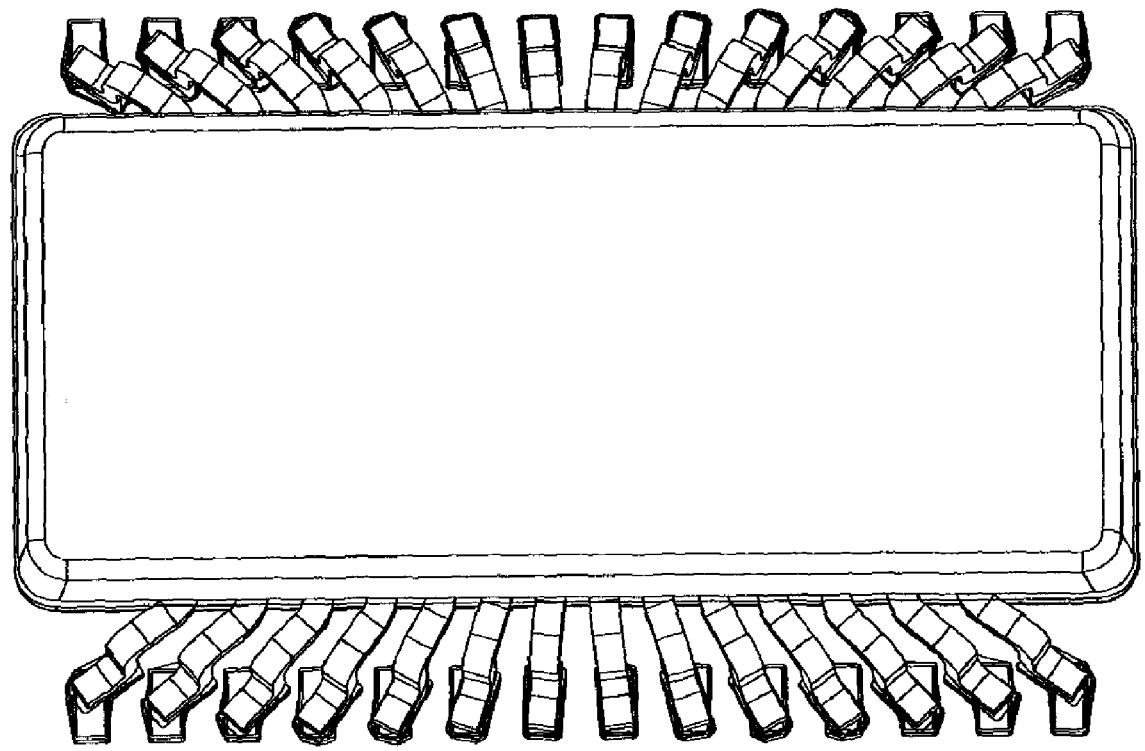
FIGS. 66 through 70 show a package with oriented legs, sitting on top of "combo" pads. Views from different viewpoints are shown, to help visualize the concept.
Figure 67:
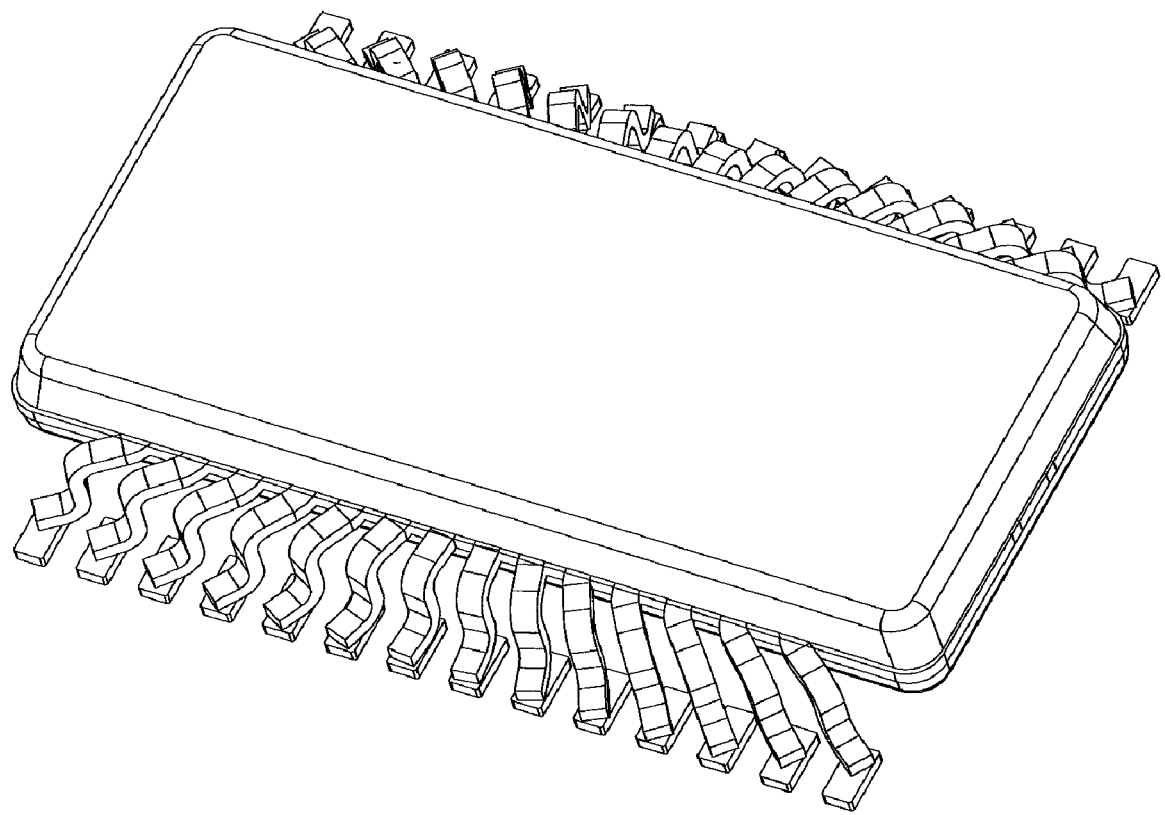
Figure 68:
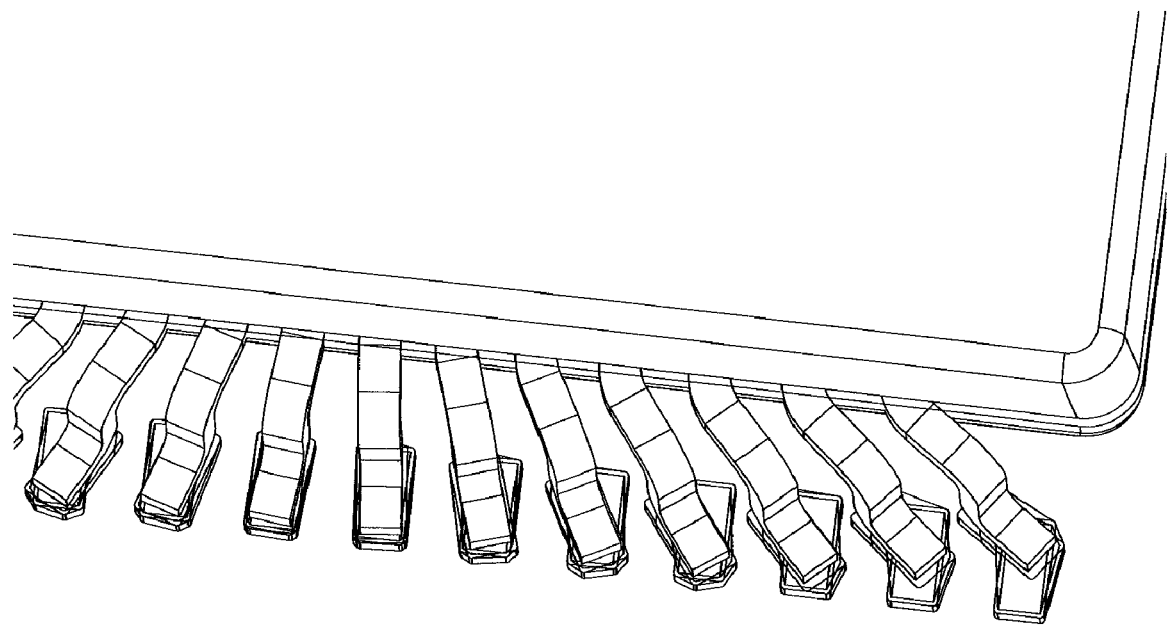
Figure 69:
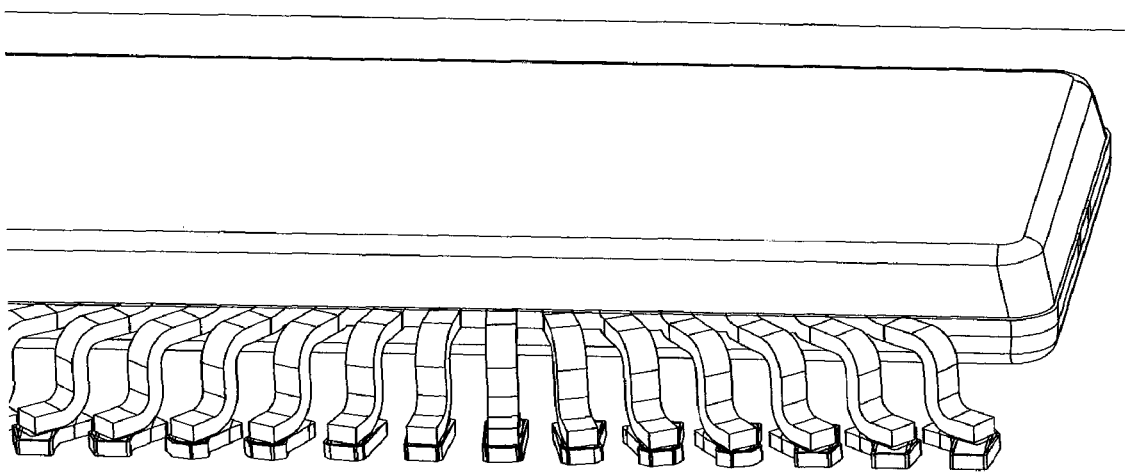
Figure 70:
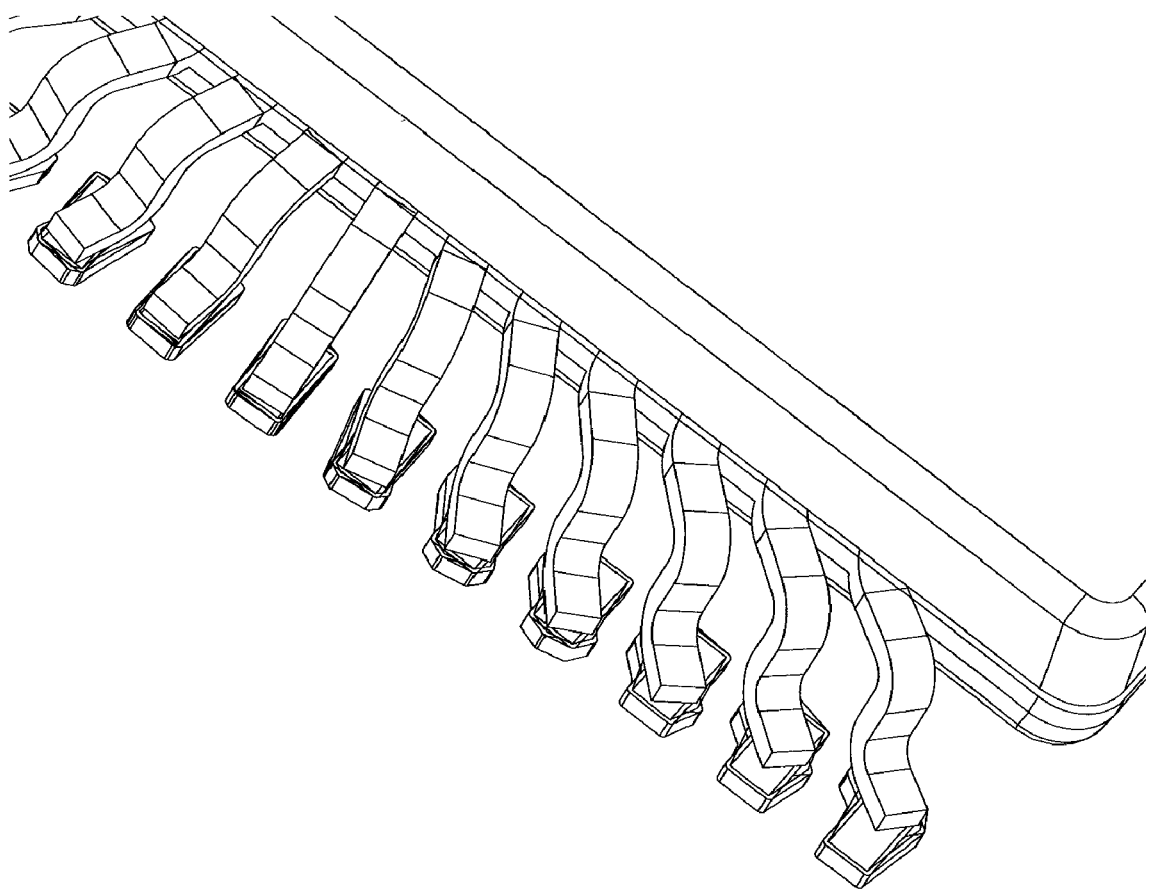

FIG. 65 shows an oriented package on top of dedicated pads.

FIGS. 66 through 70 show another similar oriented package, but this time, it is mounted on top of combo pads.

FIGS. 71 through 77 show a strange arrangement, just for clarification. Each figure shows both a standard leg and an oriented leg superimposed on the same combo pad, each figure for one pad position at a time. This is simply to highlight the fact that both types of legs would work on these combo pads, as per present invention.

Figure 71:
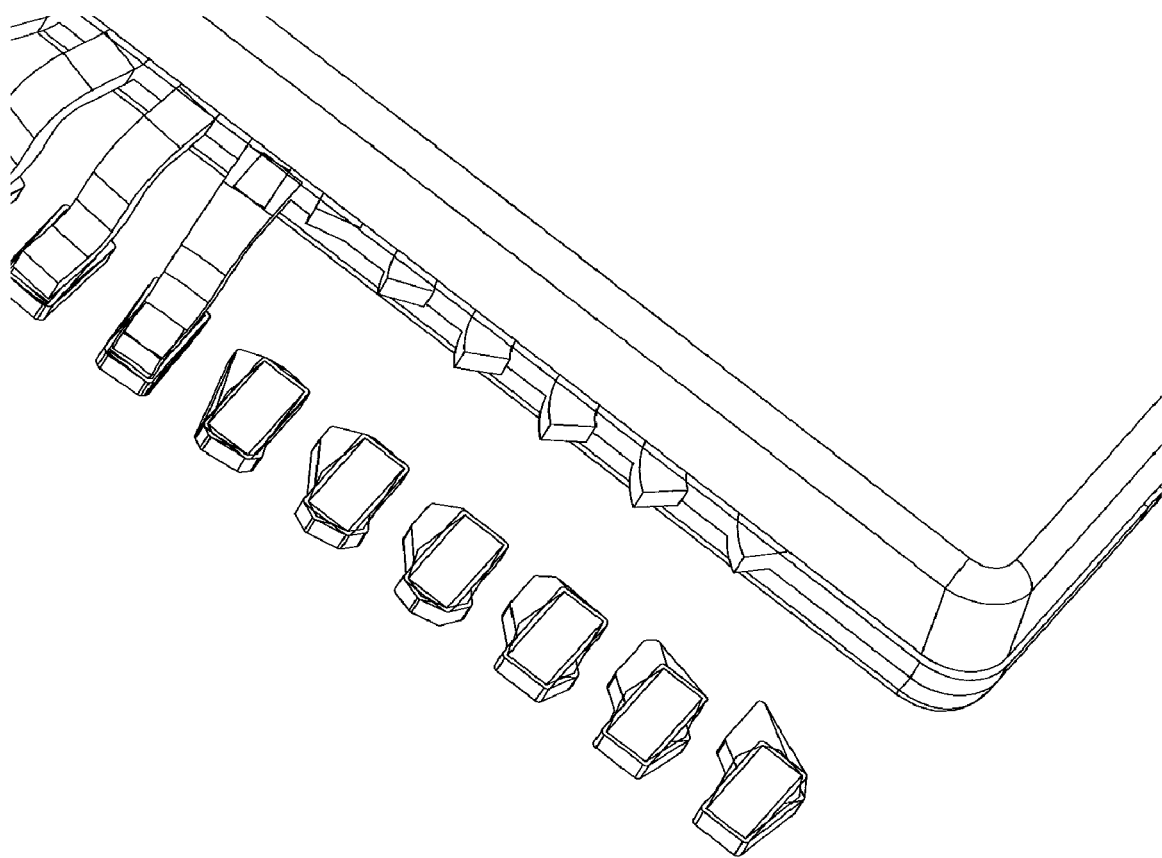
FIGS. 71 and 77 show a pair of legs on one individual pad in each of the figures. The idea here is to show that both the standard conventional state of the art packages can fit and work on the "combo" pads, as well as the new packages, with oriented legs, as per present invention.
Figure 72:
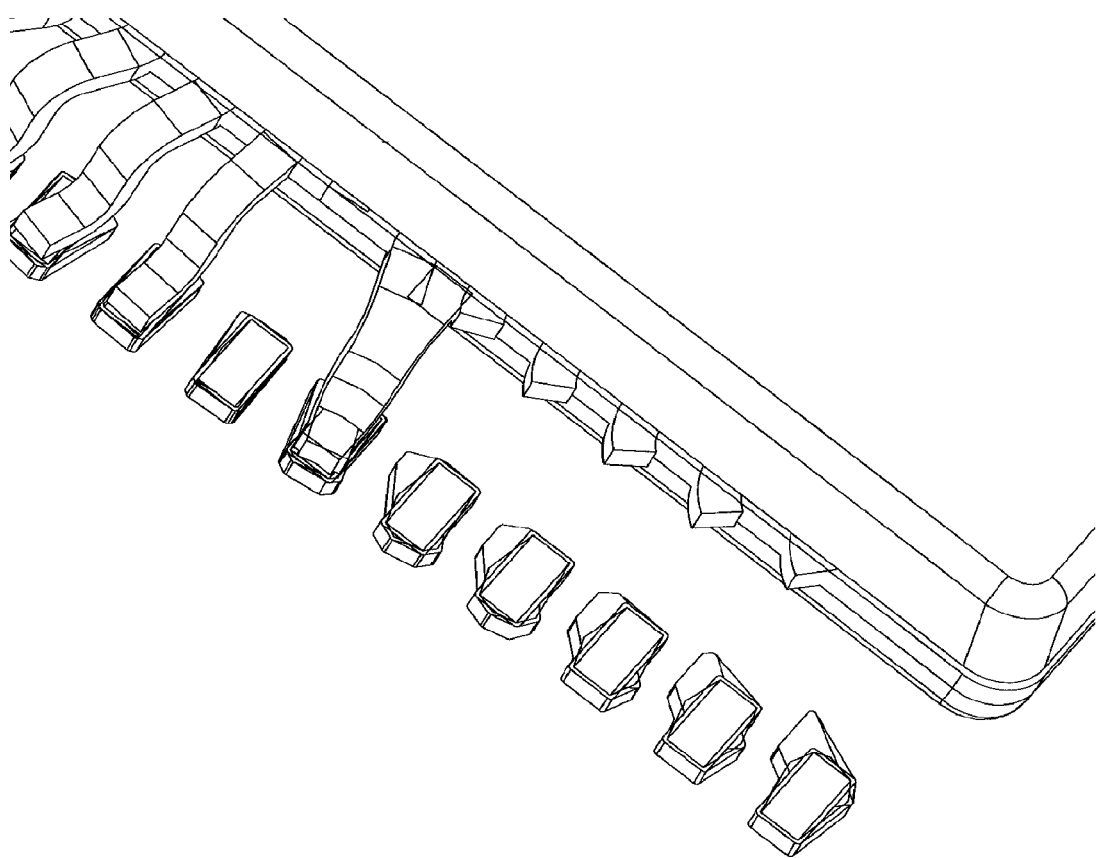
Figure 73:
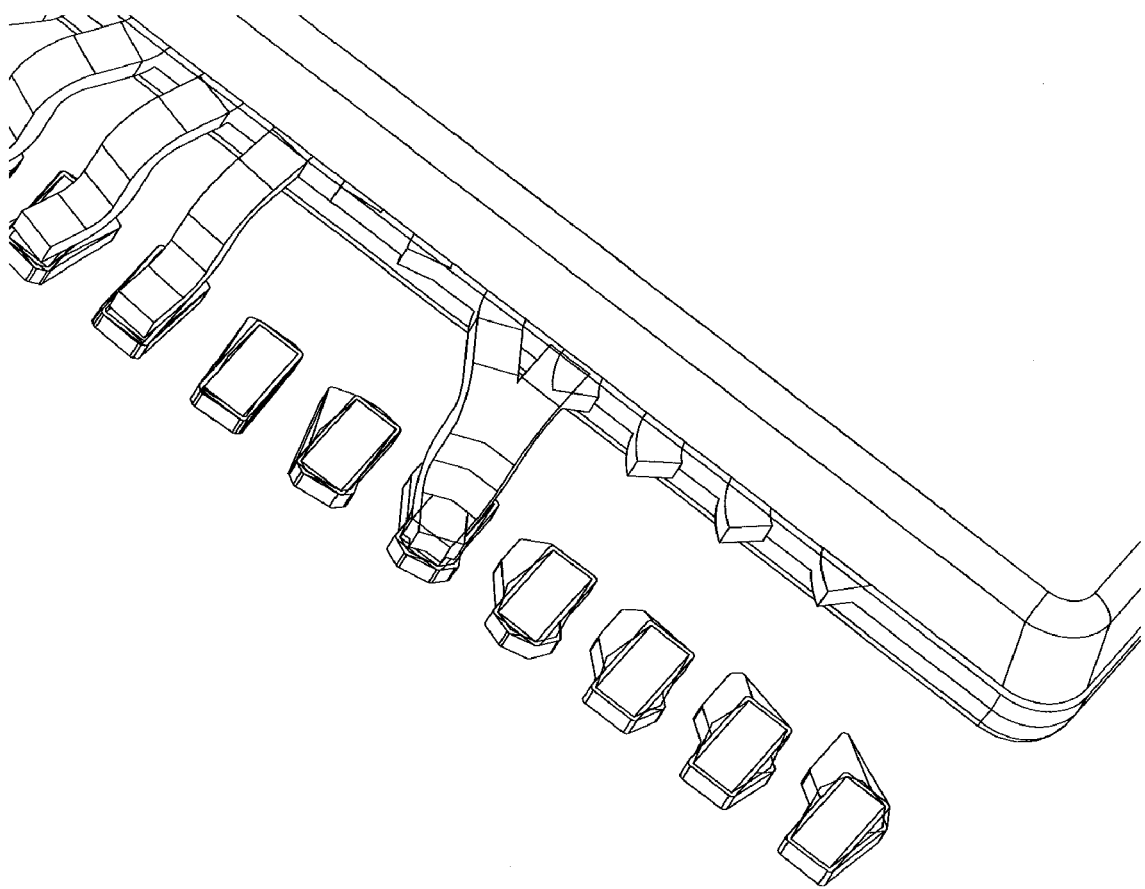
Figure 74:
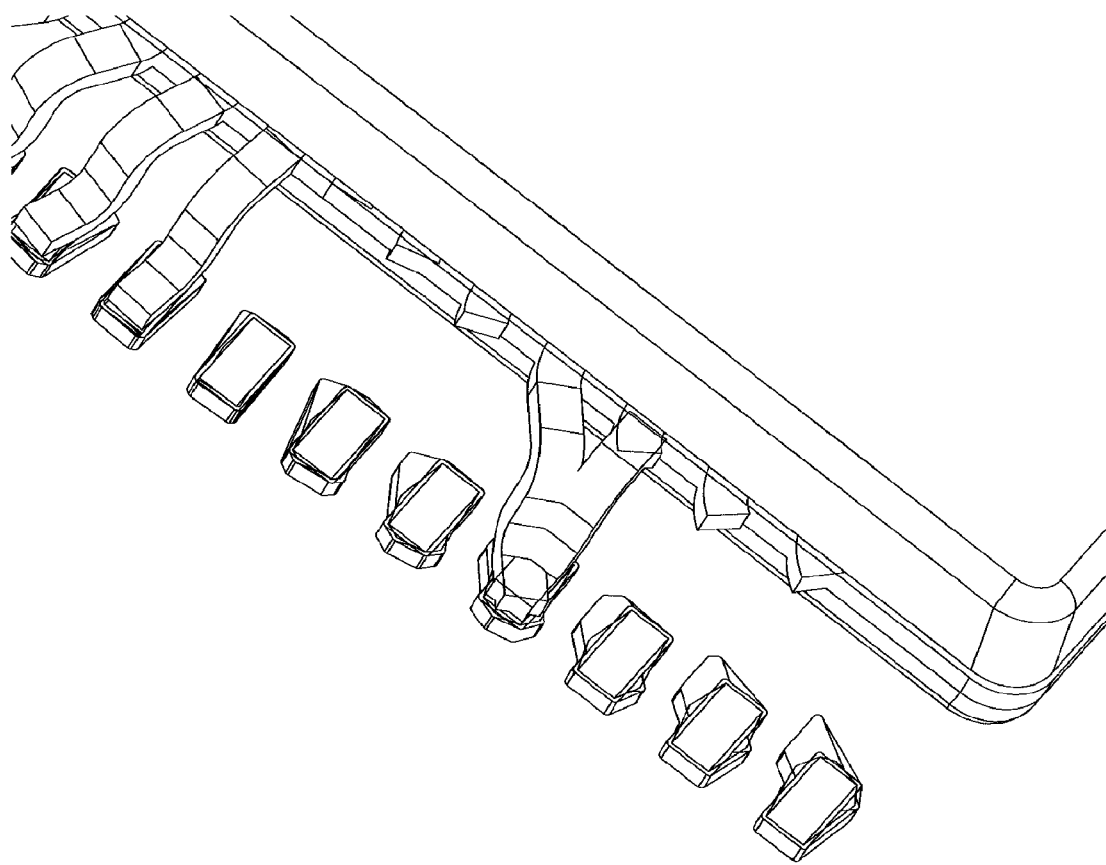
Figure 75:
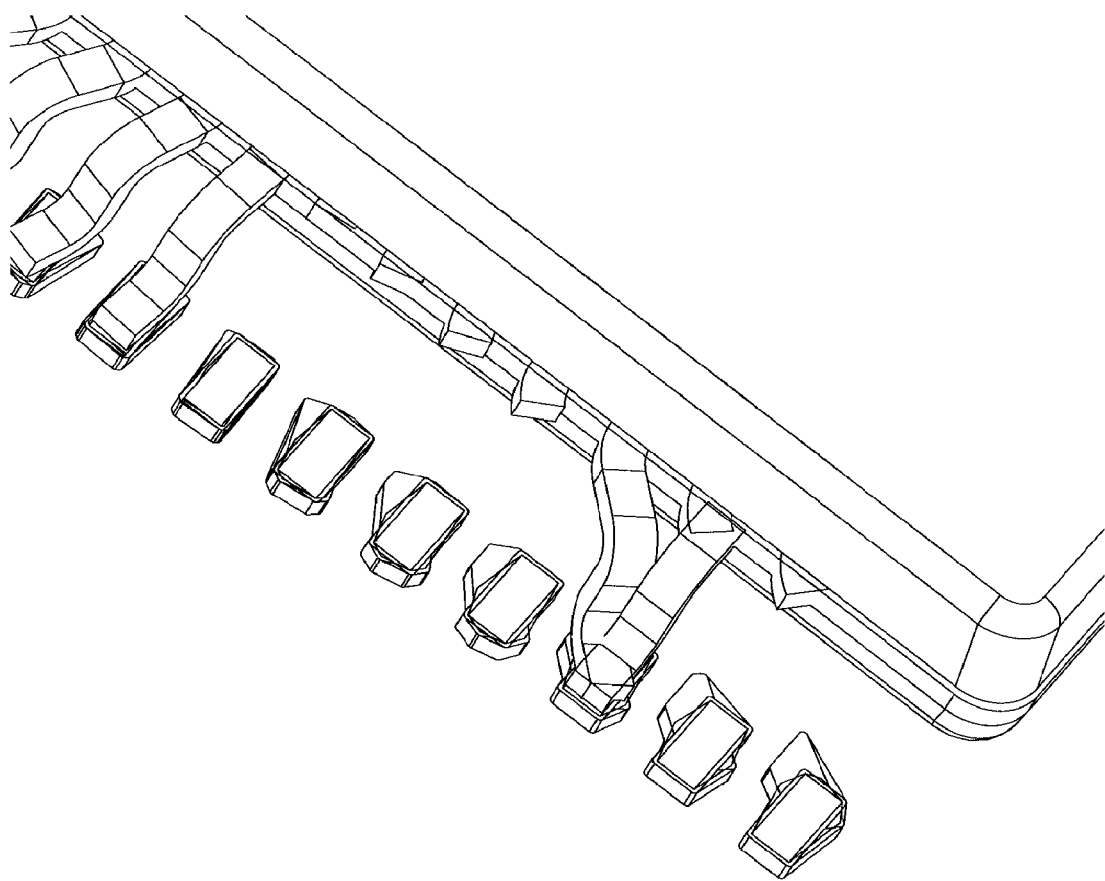
Figure 76:
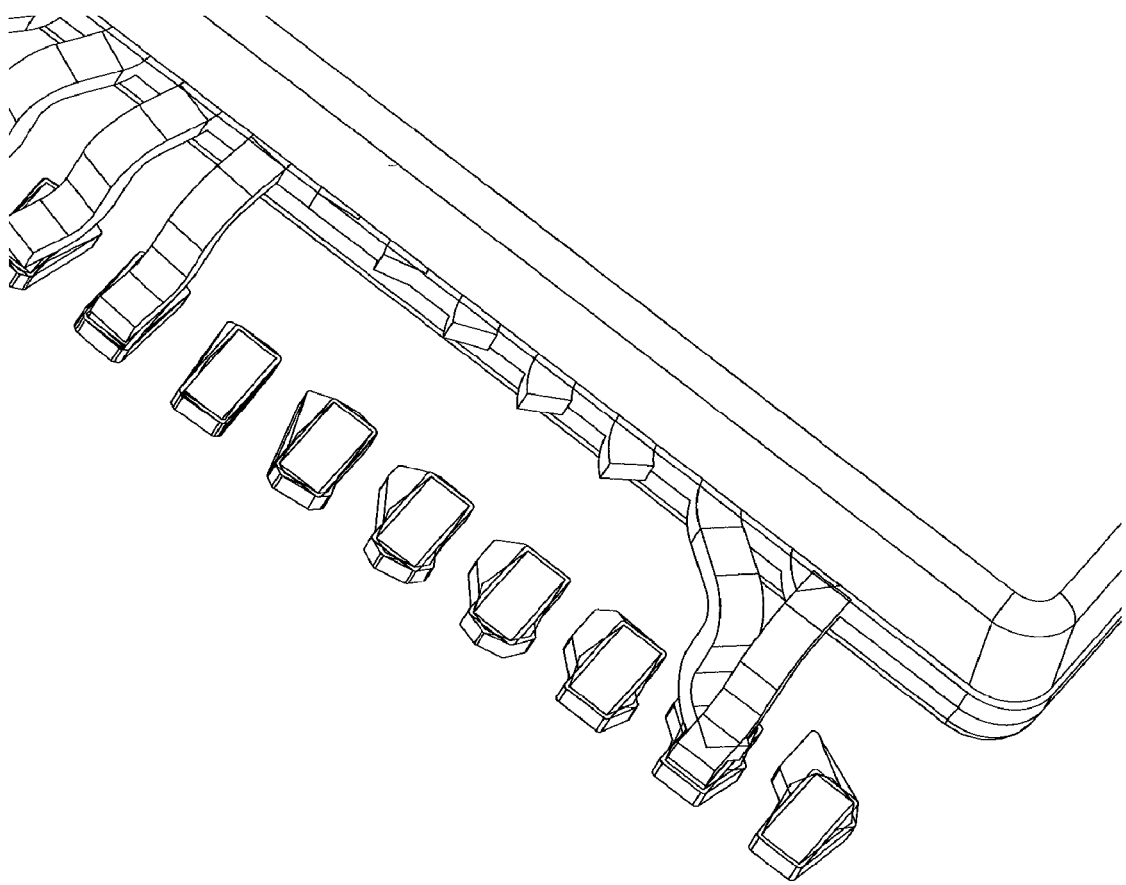
Figure 77:
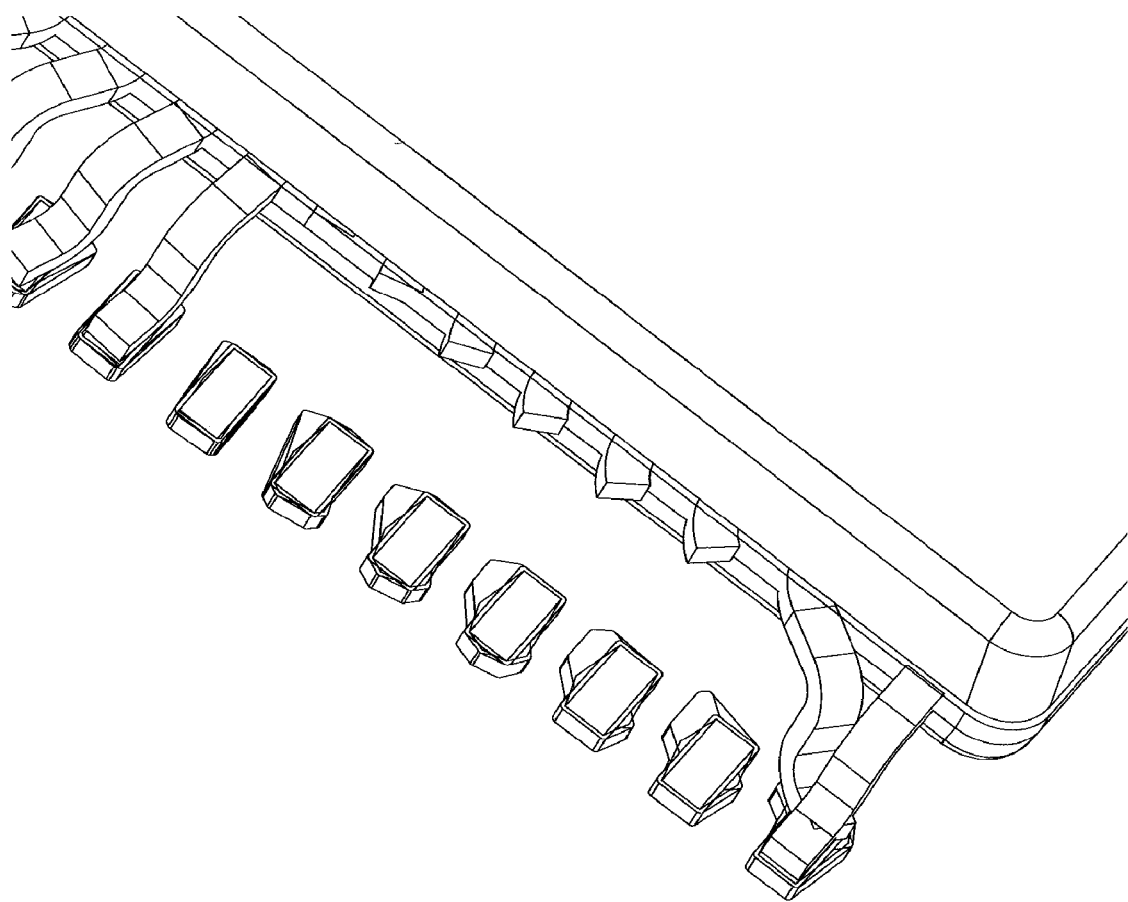

To make it easy to visualize, I have shown only one "pad position" at a time. For example, FIG. 71 shows the first pad above the short centerline of the package. On top of this pad, I have shown the corresponding leg of a standard package as well as the corresponding leg of an oriented package. Similarly, FIG. 72 shows the second pad above the centerline, together with the two corresponding legs from a standard package and an oriented package. Again, FIG. 73 shows the third pad and the two corresponding legs, etc., until FIG. 77, which shows the seventh pad and its two corresponding legs.

Leadframe Embodiment #2

Orthogonal & Oriented Leg Blanks

The following group of figures shows a new embodiment, which has not been shown previously, except in Ref6, FIGS. 1 and 2. The following figures will simply clarify the embodiment represented by these two above figures, showing more details thereof.

In the "BACKGROUND" section, I had mentioned three alternative methods to achieve our objectives. Methods A, B and C.

I will elaborate here on Method C, which I referred to it as "Orthogonal-Oriented" Leg Blank with Fold Only.

Method C, the "Orthogonal-Oriented" Leg Blank with Fold Only" Method.

In the two drawings attached to Ref6, FIGS. 1 & 2, I had shown a proposed way to create oriented leads out a flat leadframe. I will call this method, method C, the "Orthogonal-Oriented" or "Normal-Oriented" Leg Blank with Fold Only" method. Compare this with the two other methods, i.e. Methods A and B, mentioned earlier in the "Background" section.

In this method C, the portion of the leadframe that would generate each individual leg of the package, hereinafter referred to as "leg blank", would be coming out of, or protruding from, or exiting from, the plastic body will be orthogonal, i.e. perpendicular to the body's sides and centerlines, the same way like the present conventional leadframes are made today in the industry. However, the leg blanks would then be formed, or rather blanked, to radiate out in the proper desired oriented direction, while they are still flat, as shown in the two figures. The big difference between this method and method B, is that the portion of the leg blanks coming out of the plastic body would be orthogonal instead of on an angle. This makes it easier to provide the "dams" that are necessary for the encapsulation or molding process and then later to cut-off or trim the dams after the encapsulation or molding process is finished.

The following figures will show this proposed method C.

The major difference between the embodiment #2 and the previous one, is the way the leg blanks are formed or rather "blanked".

There is another difference also between this following group of figures and the earlier ones. It is the ending or termination of the legs. The earlier figures showed the legs endings shaped in a gull-wings form, so that they can be surface mounted to pads on a PCB. In the second group of figures, the legs are terminated with solder tails, which would be inserted into "through-holes" in a PCB, for clinching and/or soldering. Both endings can be used in either of the two embodiments. I chose one ending/termination for one embodiment and another ending/termination for the second, just for illustration purposes.

Figure 78:
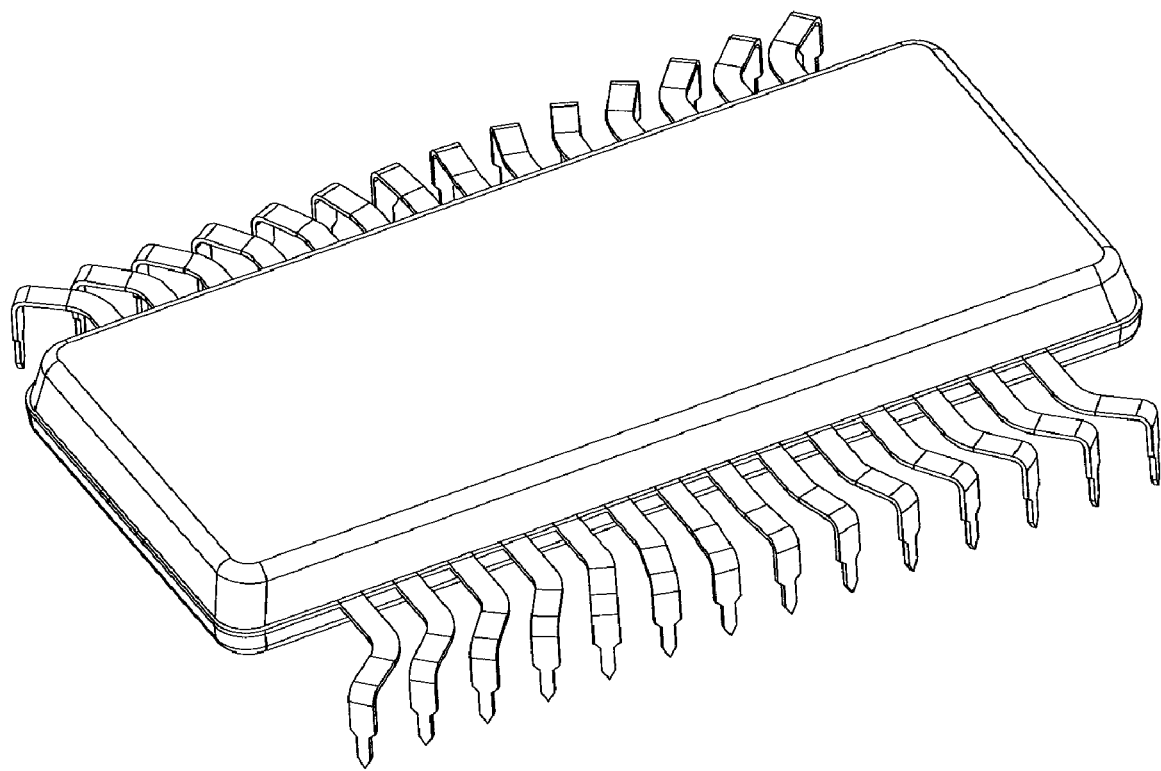
FIGS. 78 through 81 show four different views of another new package, with oriented legs too, but where the leadframe is different than the one in the previous figures.
Figure 79:
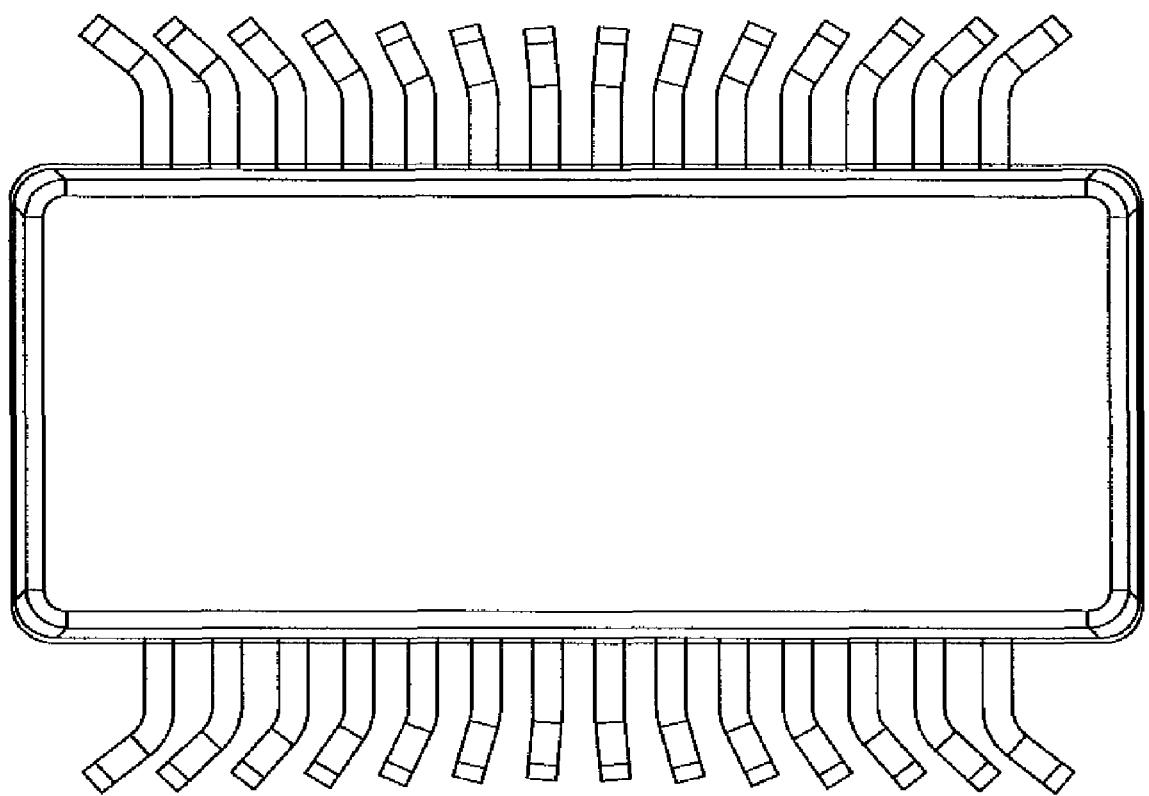
Figure 80:
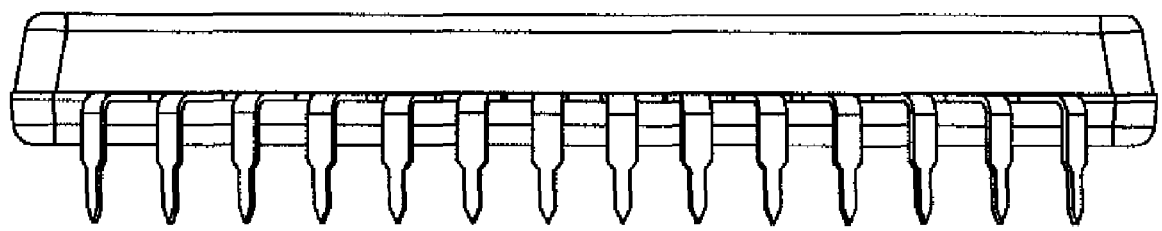
Figure 81:
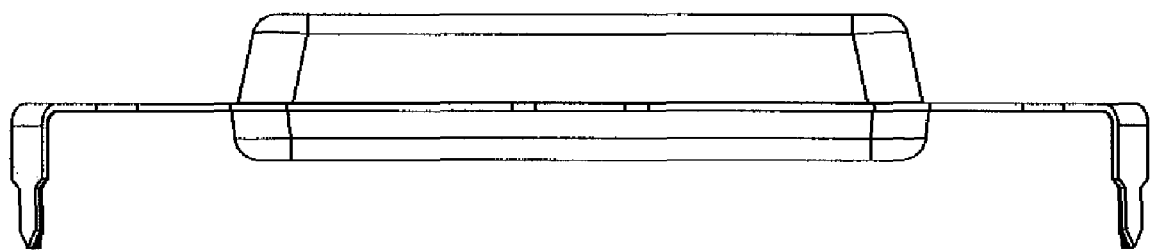

FIGS. 78 through 81 show four different views of the package as proposed by the present invention embodiment. FIG. 78 shows a 3-D view of the package, FIG. 79 shows a top view, FIG. 80 shows a side view and FIG. 81 shows an end view.

These four figures show that all the legs first protrude out from the package body in an orthogonal direction, i.e. perpendicular or normal to the body's sides and long centerline. We will refer to that portion of the legs as the base (1). See FIG. 78. However, after a certain distance along the base in that orthogonal direction, we see a "neck" (2) in each leg. The neck of each leg, in any one quadrant, is different than the necks in the adjacent legs. The neck encompasses a certain included angle (7). The neck ends up at a point, where the leg blank becomes straight again. We will refer to the first portion of this straight run as the shoulder (3). Then the leg blank is folded to create the vertical portion of the leg. The portion that is folded will be referred to as the "fold" (4). The subsequent vertical portion consists of at least the two following portions. First, the column (5) and then the solder tail (6). The shoulder makes a certain angle (7) with respect to the long axis (9) of the package body.

FIG. 82 shows a 3-D view of the package, with the solder tails of each leg inserted in the respective solder through-hole of a PCB.

FIG. 83 shows one side of the same package with the solder tails inserted in the through-holes. The PCB in this figure is shown as if it semi-transparent.

FIG. 84 shows the blank leadframe, which would be used to make the above package. This is the counterpart of the leadframes shown in FIG. 45 or 48, which were to be used for method B.

FIG. 85 shows a 3-D view of the leadframe shown in FIG. 84.

Figure 86:
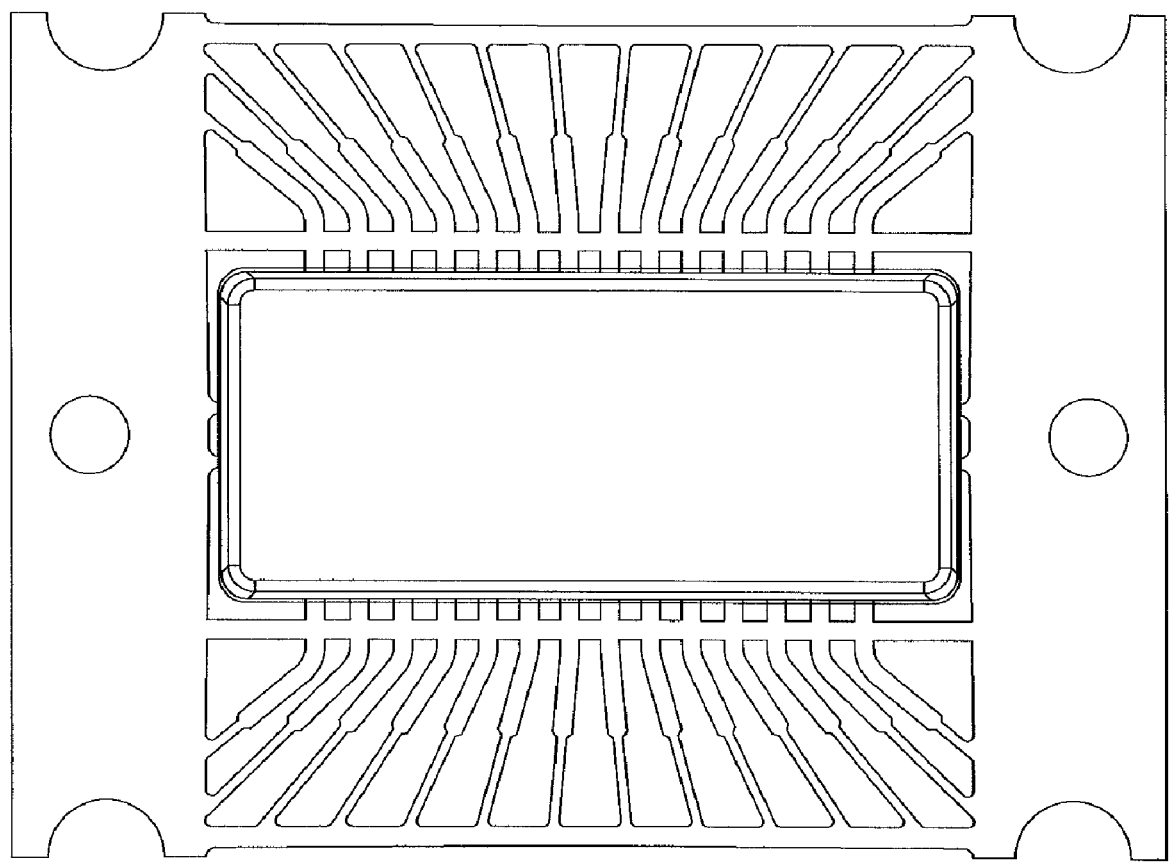

FIG. 86 shows the leadframe shown in FIGS. 84 and 85, but with the package body already on it. The dams are still in place.

Figure 87:
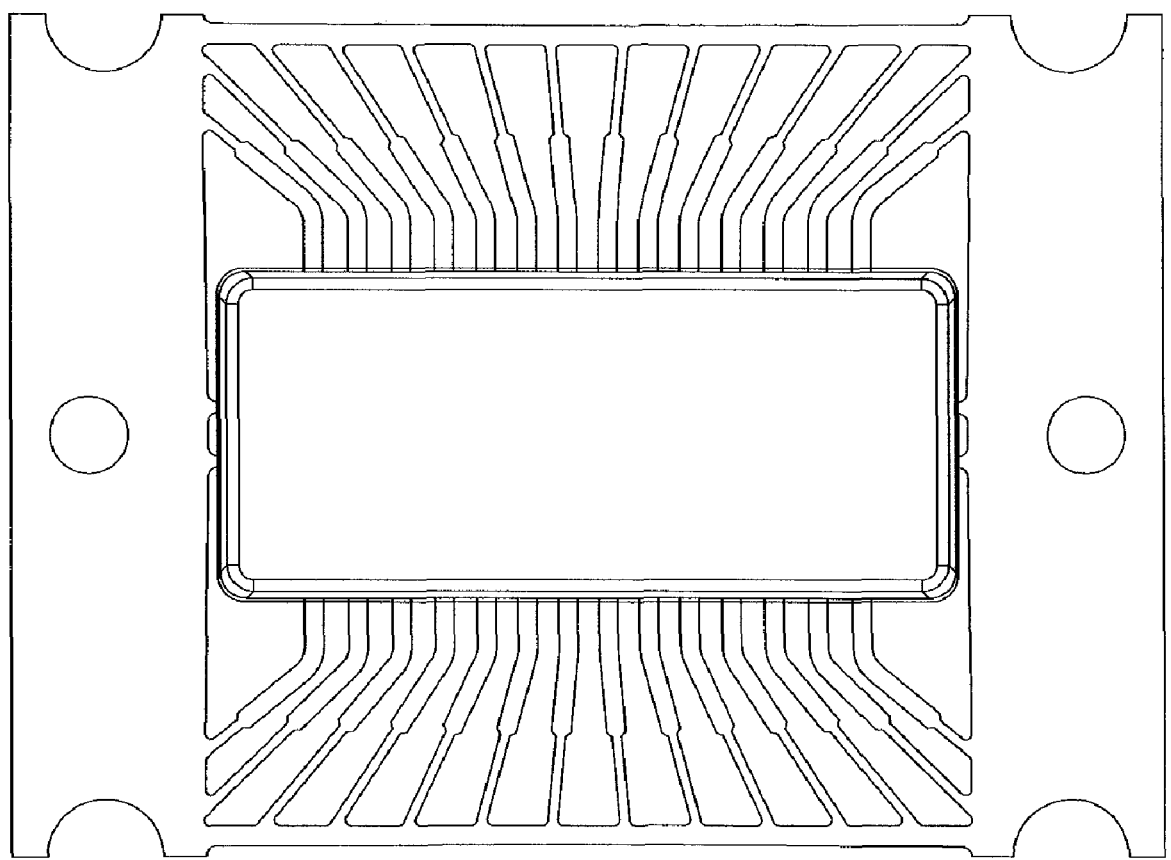

FIG. 87 shows the dams cut-off and removed.

Figure 88:
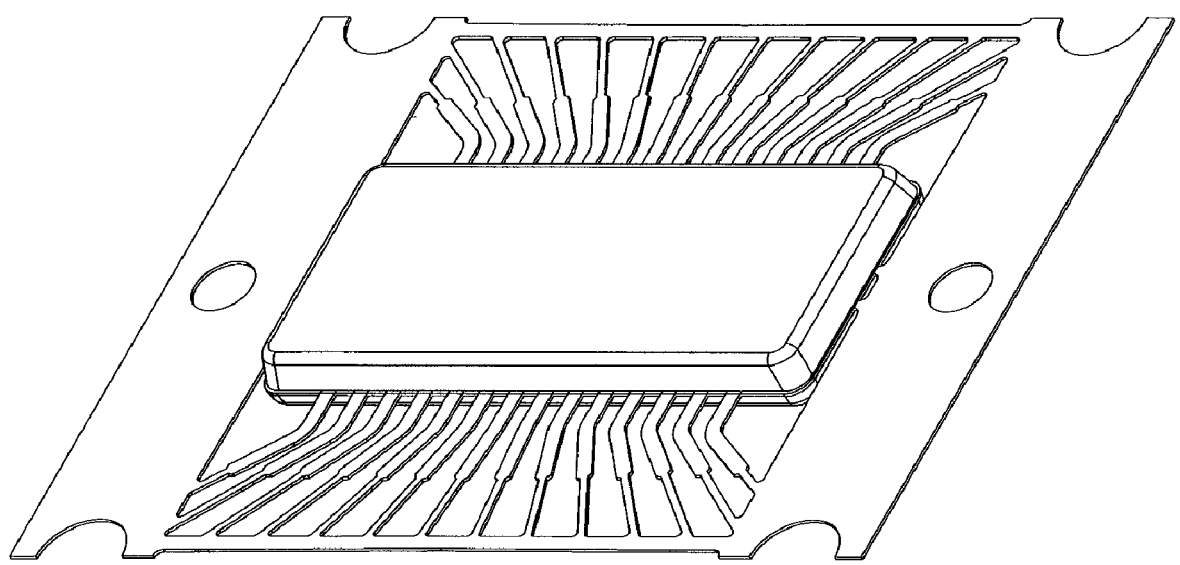
Figure 89:
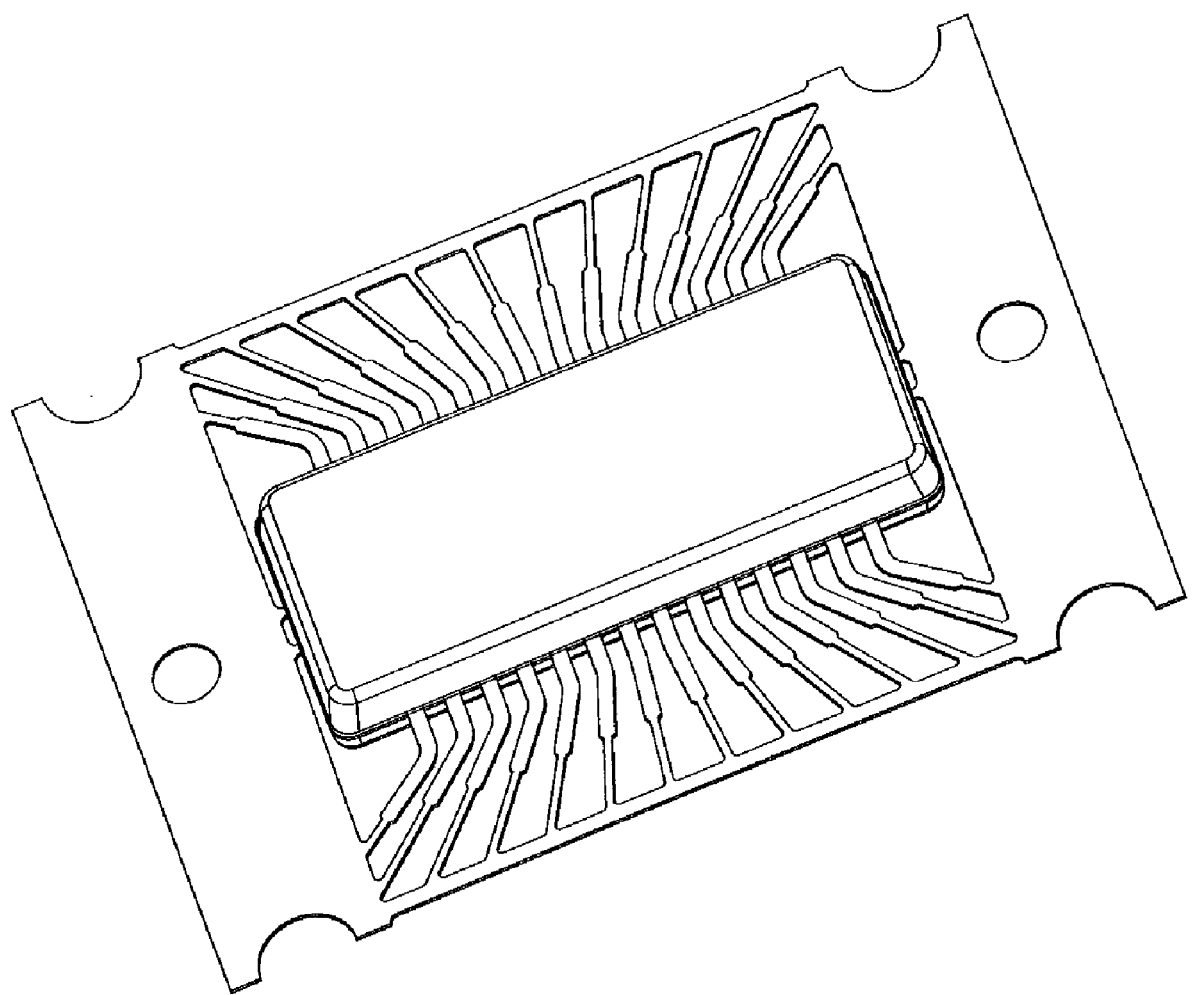

FIGS. 88 and 89 show 3-D views of the above leadframe, with the package on it.

Figure 90:
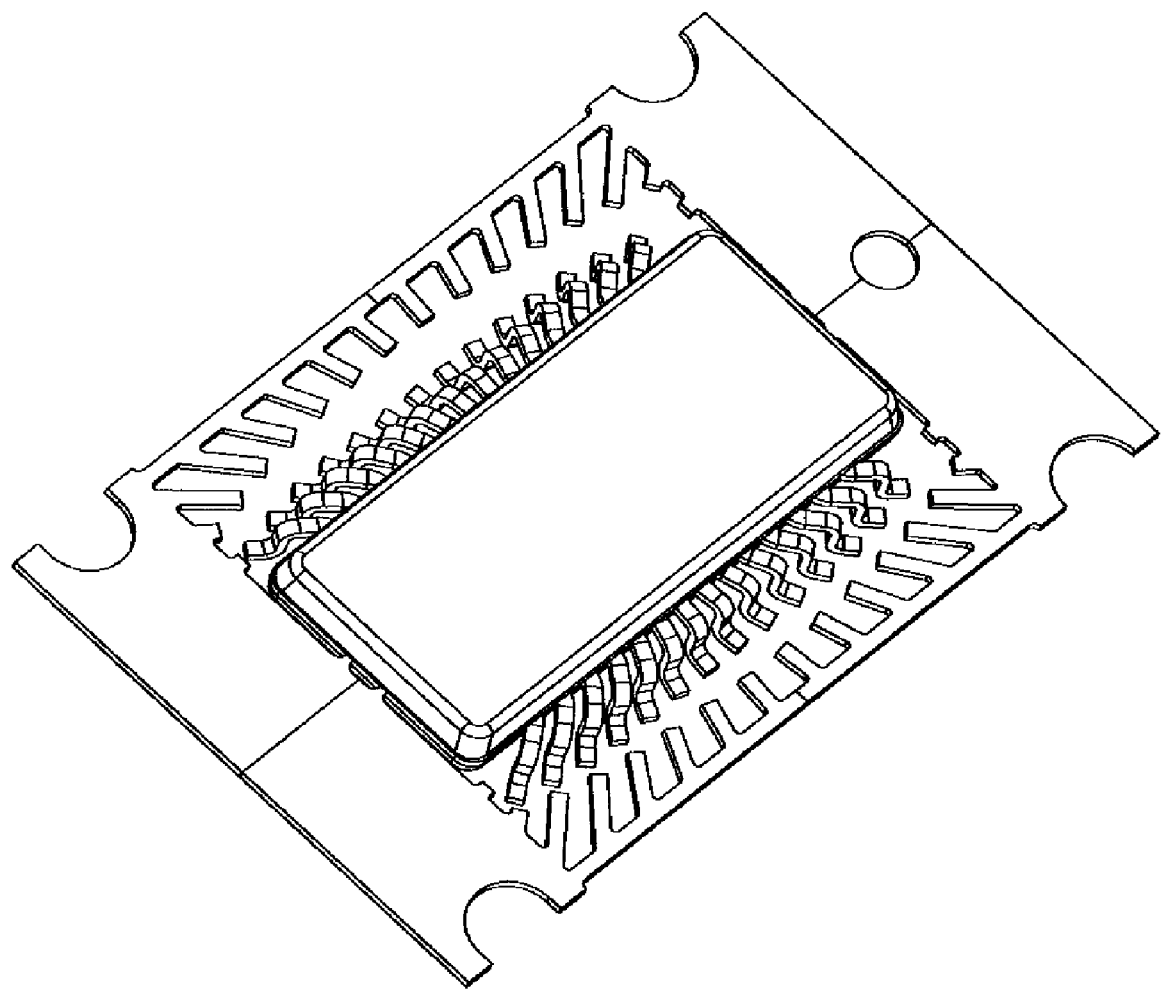

FIG. 90 shows the same thing, but after folding the legs, but it is still on the carrier strip.

FIG. 91 shows a top down view of the leadframe shown in FIG. 90, but without the package body.

FIG. 92 shows just the leadframe after all the trimming and folding operations, but again without the package body. This is just for visualization.

The invention claimed is:

1. An assembly, comprising:
a first device, having a substantially planar side surface and an array of attachment pads for constituting connecting elements formed on said planar side surface of said first device, said pads being arranged in a certain pattern and having certain center distances between them;
a second device, also having a substantially planar side surface and an array of attachment pads, similar to the attachment pads of said first device, said attachment pads being arranged in a similar matching pattern and having similar matching center distances between them, as the pattern and center distances of said first device; and
a number of attachment elements, joining and connecting each one of said attachments pad of said first device to its corresponding attachment pad of said second device;
wherein each one of said attachment pads of the first and second devices has an elongated shape and elongating in a direction that is substantially perpendicular to a respective individual ray, each such ray extending from a predetermined focal point related to said planar side surface of said respective device to substantially the center of each respective pad of said attachment pads; or in other word, said each one of said elongated shape attachment pads is arranged and oriented so as to have its short axis in a direction which extends radially from a predetermined focal point related to said planar side surface of said respective device to substantially the center of each respective pad of said attachment pads;
wherein said attachment elements, joining said respective attachment pads, are made of a solder material, and are referred to as solder elements, wherein said solder elements start in a shape of a solder paste, or solder balls or solder preforms, and wherein said solder elements are reflowed to create solder joints between each pair of corresponding attachment pads; and
wherein each one of said solder joints acquires, at the end of the reflow process, a cross-section that is substantially similar in shape and orientation to the shape and orientation of its respective attachment pad, at the base of said solder joint near its said respective attachment pad.

2. The assembly as claimed in claim 1, wherein said solder preforms start with an initial shape that looks substantially like a straight column with a substantially uniform cross-section.

3. The assembly as claimed in claim 1, wherein said solder preforms start with an initial shape that looks substantially like a cone.

4. The assembly as claimed in claim 1, wherein at least one separator is disposed between said first and said second devices, and adjacent to and external to said solder elements, and wherein said separator affects and controls the height of the solder joints during and at the conclusion of the process of joining the two devices together, and wherein said separator is removable after the conclusion of the joining process.

5. The assembly as claimed in claim 4, wherein each one of said solder joints has, during and at the conclusion of the process of joining the two devices together, substantially acquires a cross section, along its height, that is oriented substantially in the same direction as the orientation direction of its respective attachment pad, at least at the base of the solder joint, in the region of the solder joint that is substantially adjacent to its respective solder pad.

6. The assembly as claimed in claim 4, wherein each one of said solder joints acquires a cross-section, along a good portion of its height, that is substantially similar in orientation and to a certain scale, similar in shape, to the general orientation and shape of the respective solder pads, to which said solder joint is attached to.

7. The assembly as claimed in claim 4, wherein said solder joints will end up as tall slender columns, with a substantially uniform cross section.

8. The assembly as claimed in claim 4, wherein said separator, configured as stand-offs, has a fixed height, said height does not change during the entire process of joining/reflowing the two devices together, and wherein said fixed height of said separator is shorter than the height of any of the solder elements, and will control the separation distance between said two devices during the reflow process used to join the two devices, so as to ensure that, when said solder is reflowed during said joining operation, the resulting solder joints will not collapse and will not end up as "short stubby" joints, but that, at the conclusion of said joining operation, the solder joint will have a larger height than if said stand-offs would not have been present.

9. The assembly as claimed in claim 4, wherein said solder joints will end up having a generally hour-glass appearance.

10. The assembly as claimed in claim 1, wherein at least one separator is disposed between said first and said second devices, and adjacent to and external to said solder elements, and wherein said separator affects and controls the height of the solder joints during and at the conclusion of the process of joining the two devices together, and wherein said separator can stay in place permanently.

11. The assembly as claimed in claim 1, wherein at least one of said two devices comprises certain electrical/electronic circuits, which in turn comprise active and/or inactive devices.

* * * * *